(12) United States Patent
Nakasu et al.

(10) Patent No.: US 8,035,058 B2
(45) Date of Patent: Oct. 11, 2011

(54) APPARATUS FOR REPAIRING CIRCUIT PATTERN AND METHOD FOR MANUFACTURING DISPLAY APPARATUS USING THE SAME

(75) Inventors: Nobuaki Nakasu, Kawasaki (JP); Kaoru Yamada, Mobara (JP); Yuichiro Tanaka, Fujisawa (JP); Takeshi Arai, Yokohama (JP); Hideyuki Honoki, Yokohama (JP); Kazushi Yoshimura, Kamakura (JP); Tetsuya Kawamura, Mobara (JP); Masanori Okawa, Katsuura (JP)

(73) Assignee: Hitachi Displays, Ltd., Chiba-ken (JP)

( * ) Notice: Subject to any disclaimer, the term of this patent is extended or adjusted under 35 U.S.C. 154(b) by 1564 days.

(21) Appl. No.: 11/143,981

(22) Filed: Jun. 3, 2005

(65) Prior Publication Data
US 2006/0065645 A1 Mar. 30, 2006

(30) Foreign Application Priority Data

Sep. 27, 2004 (JP) ................................ 2004-278824
Mar. 2, 2005 (JP) ................................ 2005-057555

(51) Int. Cl.
*B23K 26/36* (2006.01)
(52) U.S. Cl. ................................. 219/121.68
(58) Field of Classification Search ............ 219/121.68, 219/121.69; 324/501, 519, 537, 96, 158 R, 324/158 P, 158 F, 73.1
See application file for complete search history.

(56) References Cited

U.S. PATENT DOCUMENTS

| | | | | |
|---|---|---|---|---|
| 4,708,466 A | * | 11/1987 | Isohata et al. ............ 355/53 |
| 5,017,755 A | * | 5/1991 | Yahagi et al. ............ 219/121.68 |
| 5,175,504 A | * | 12/1992 | Henley ............ 324/501 |
| 5,661,744 A | * | 8/1997 | Murakami et al. ............ 372/57 |
| 6,583,854 B1 | | 6/2003 | Hazama et al. |
| 6,888,096 B1 | | 5/2005 | Hamada |
| 2001/0005544 A1 | * | 6/2001 | Miyaji ............ 428/195 |
| 2004/0121246 A1 | * | 6/2004 | Brown ............ 430/5 |
| 2004/0239364 A1 | * | 12/2004 | Chung ............ 324/770 |
| 2006/0104413 A1 | * | 5/2006 | Ohmi et al. ............ 378/35 |

FOREIGN PATENT DOCUMENTS

JP 03-089511 4/1991
(Continued)

OTHER PUBLICATIONS

Office Action issued in Taiwanese Patent Application No. 09820596500 on Sep. 23, 2009.
Japanese Office Action dated Oct. 12, 2010, issued in corresponding Japanese Patent Application No. 2005-057555.

*Primary Examiner* — Henry Yuen
*Assistant Examiner* — Thien Tran
(74) *Attorney, Agent, or Firm* — Antonelli, Terry, Stout & Kraus, LLP.

(57) ABSTRACT

A region surrounded by two gate wiring and two drain wiring includes pixels and when there is a defect of short-circuit in adjacent pixel electrodes, the short-circuited portion is removed by irradiating a laser via a mask having a transmission pattern, which corresponds to a pattern of the gate wiring, drain wiring and pixel electrodes in the short-circuited portion. The above short-circuited portion is identified and removed in comparison to a normal pattern, by use of information from an inspection apparatus, and the pattern defect formed on the substrate is automatically repaired. By applying the above method to a manufacturing process of display apparatus, in particular, to a resist pattern forming process, a display apparatus having a highly qualified display property may be achieved.

11 Claims, 45 Drawing Sheets

FOREIGN PATENT DOCUMENTS

| | | |
|---|---|---|
| JP | 4-351951 | 12/1992 |
| JP | 05-027111 | 2/1993 |
| JP | 05-027111 * | 5/1993 |
| JP | 7-146486 | 6/1995 |
| JP | 08-066652 | 3/1996 |
| JP | 9-307217 | 11/1997 |
| JP | 09-307217 | 11/1997 |
| JP | 10-177844 | 6/1998 |
| JP | 10-324973 | 12/1998 |
| JP | 2000-305279 | 11/2000 |
| JP | 2001-023982 | 1/2001 |
| JP | 2001-133988 | 5/2001 |
| JP | 2001-315299 | 11/2001 |
| JP | 2002-071939 | 3/2002 |
| JP | 2003-042967 | 2/2003 |
| JP | 2003-282399 | 10/2003 |

* cited by examiner (A) PATTERN IMAGE (B) MASK IMAGE (C) COMPOSITE IMAGE (A) PATTERN IMAGE (B') MASK IMAGE (C) COMPOSITE IMAGE

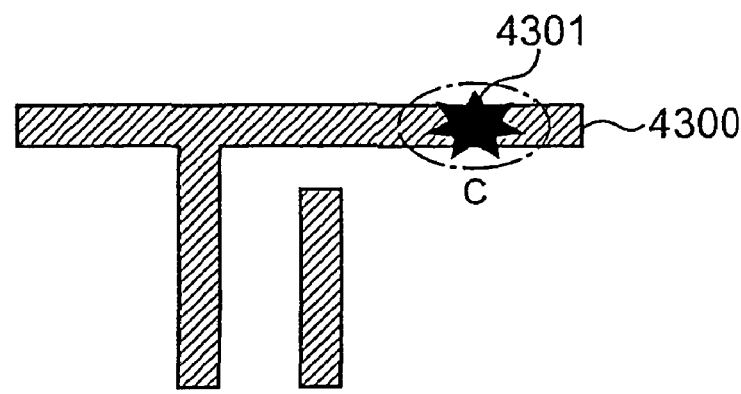
FIG. 43A
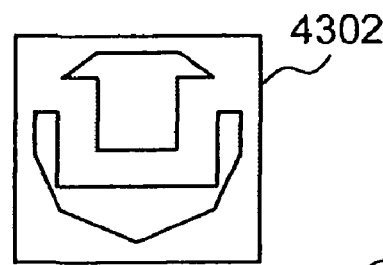
FIG. 43B
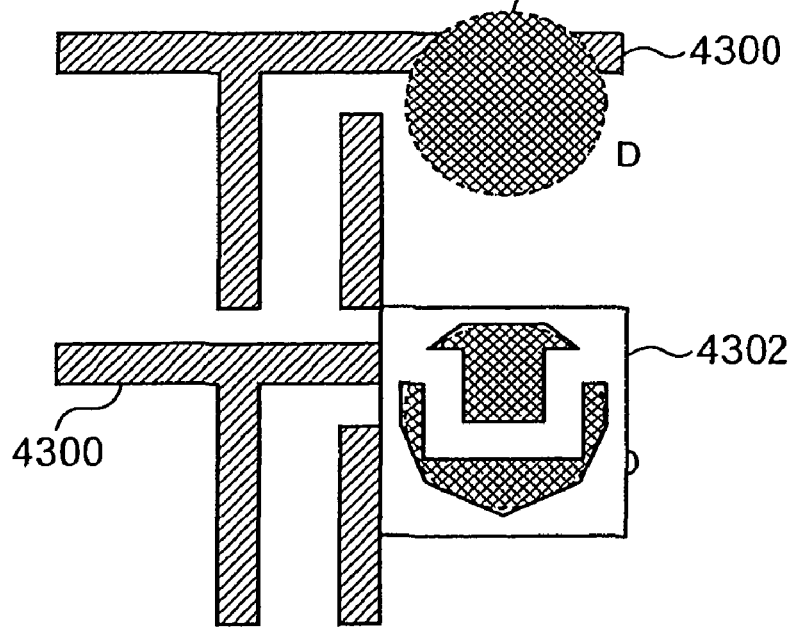
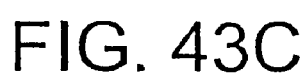
FIG. 43C
FIG. 43D
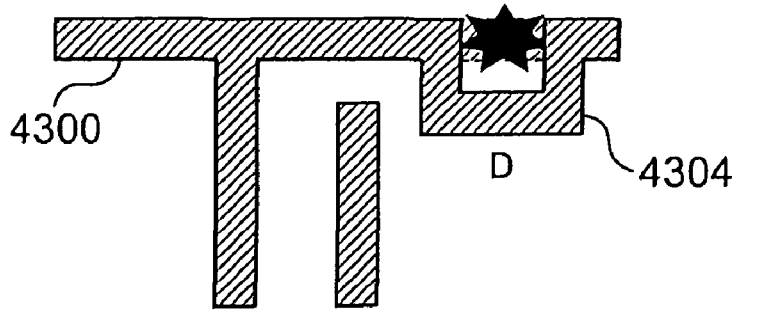
FIG. 43E FIG. 44
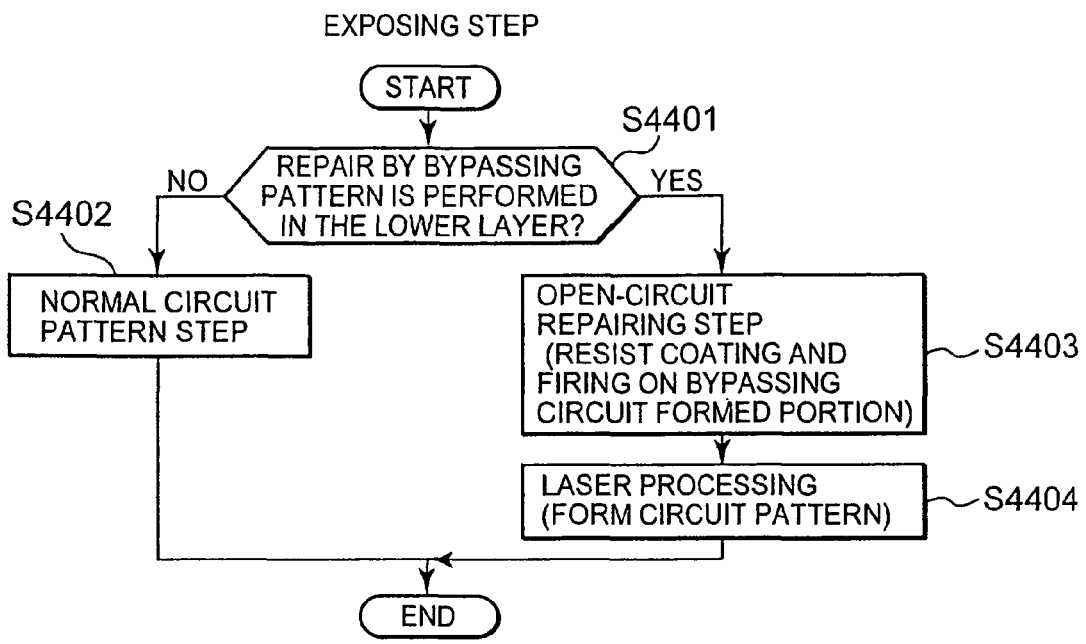
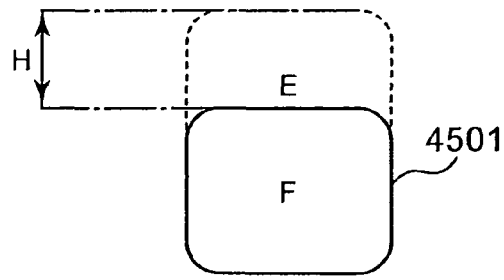
FIG. 45A
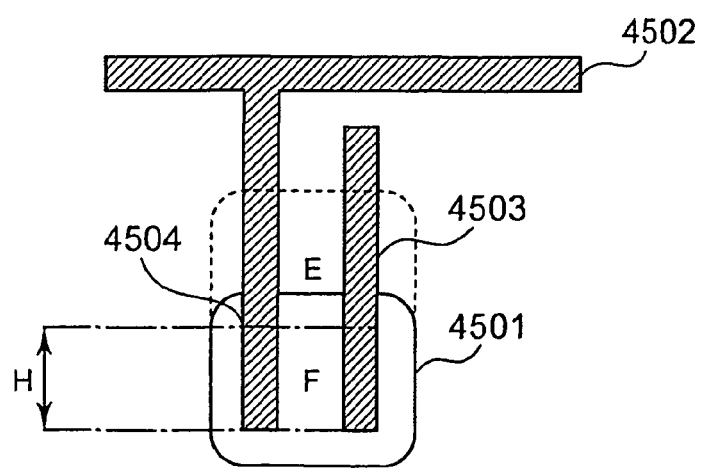
FIG. 45B FIG. 48
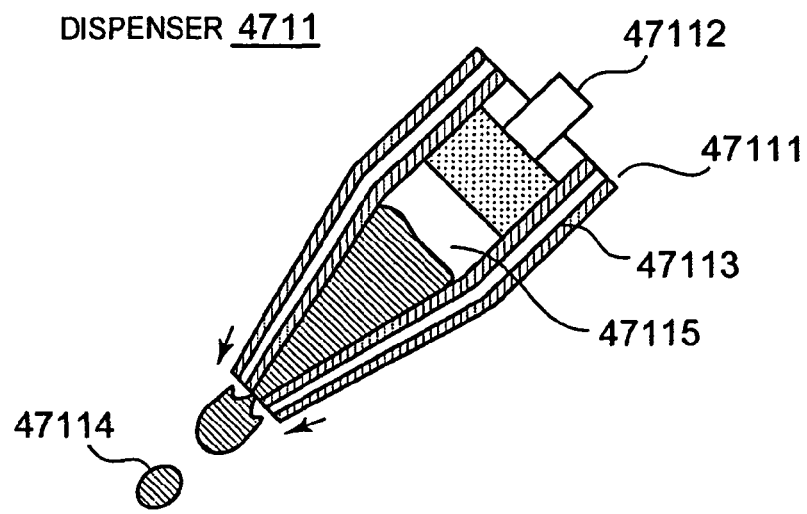
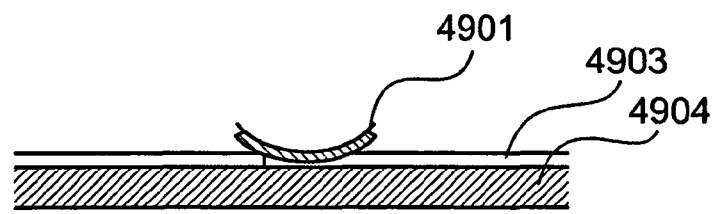
FIG. 49A
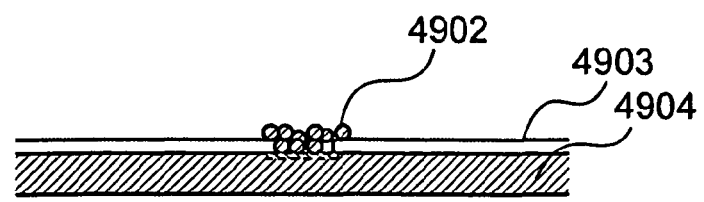
FIG. 49B

APPARATUS FOR REPAIRING CIRCUIT PATTERN AND METHOD FOR MANUFACTURING DISPLAY APPARATUS USING THE SAME

BACKGROUND OF THE INVENTION

The present invention relates to a technique for repairing with laser a convex portion of pattern shapes on a substrate on which a predetermined pattern is formed, and which repairs a defective portion by coating wiring material thereon. This technique is suitable for use in a method for manufacturing a display apparatus. In addition, the present invention relates to a method for manufacturing the display apparatus, and in particular, it relates to a technique which prevents a failure in the circuit pattern from occurring in the case where the circuit pattern has already been built on a TFT (thin-film transistor) substrate and the like.

A liquid crystal display has a structure in which liquid crystal is interposed between two glass substrates. On one of the glass substrates, also referred to as "color filter (CF) substrate", there is formed a color filter on which blue, green and red resin (color resin) are alternately coated. On the other glass substrate, also referred to as "active matrix substrate" or "thin film transistor (TFT) substrate", pixel circuit constructed of thin film transistor, wiring, a drive circuit, and the like are formed.

A pattern defect in the color filter and/or wiring may cause a display abnormality, resulting in that the liquid crystal display becomes a defective product. This display abnormality includes, for example in the case of the color filter substrate, a color defect (mixed color) caused by the color resin, being coated on the color filter, which runs over the adjacent pixel, or an uneven coating caused by non-uniformity in the resin film thickness. As for the active matrix substrate, the display abnormality may include short-circuit in wiring and a break in wiring.

The color filter and wiring of the liquid crystal display are formed by superimposing several layers of patterns on one another. Therefore, it is necessary to repair the pattern defect before an upper layer pattern is formed. As a method for detecting a pattern defect, it is possible to use a general pattern inspection apparatus utilizing image processing.

As a method for repairing such run-over of color resin on the color filter or short-circuit in wiring, Japanese Patent Laid-open Publication No. H09-307217 discloses a general method, where the short-circuited portion is irradiated with laser beam to remove this portion. If a pattern of the same shape is formed in repeated manner as in the case of liquid crystal display, the Japanese Patent Laid-open Publication No. H05-27111 discloses a repairing technique where the laser beam is irradiated via a mask having a standard pattern shape, and a part different from the standard pattern is removed and the repair is performed. As a method for coating wiring material onto the pattern defective part, there is a method as disclosed by Japanese Patent Laid-open Publication No. H08-66652 where coating is performed by use of a hollow pipette with a narrow tip diameter.

In addition, Japanese Patent Laid-open Publication No. H10-177844 discloses a technique to repair a short-circuit defect occurred in a circuit pattern in a semiconductor device, by opening the defect with laser processing. In addition, Japanese Patent Laid-open Publication No. H10-324973 discloses a technique to repair an open-circuit defect occurred in a circuit pattern in a semiconductor device, by changing a metallic material such as palladium (material of the circuit pattern) into liquid state or gaseous state, and by coating or spraying thus converted metallic material onto the open-circuit defective part.

SUMMARY OF THE INVENTION

When the pattern defect is repaired with laser irradiation, an operator in charge of the repairing works is supposed to point the laser irradiating region at the defect position, and then the laser irradiation is performed. Further in the case of laser irradiation via the mask having the standard pattern, the operator is required to set the laser irradiating region so as to be aligned with the actual pattern. In any of the above two cases, the operator is required to decide a position for laser irradiation. Therefore, not only a pattern shape after the repair may change depending on skills of the operator, but also it is necessary to locate the operator at every repairing machine, whereby increasing cost. In view of this problem, it is desired that such laser irradiating region can be automatically determined.

As a method for automatically determining the laser irradiating region, there is disclosed a method where the laser irradiating region and an image of the actual pattern are obtained, reference points previously taught are detected by image processing, and thereafter, pattern alignment is performed by superimposing one reference point on the other reference point. According to this method, it is possible to perform the automatic repair.

However, since the reference point has to be set at a location being distinctive in shape, the region available for setting the reference point is limited. Therefore, there may be a problem that the pattern alignment cannot be performed due to defective reference point or in a case where a reference point is missing since the reference point and the defective point are not simultaneously covered within the view point of observation optical system due to long distance therebetween.

In view of the above problems, an object of the present invention is to provide a mechanism which aligns with an actual pattern, a laser irradiating region obtained by laser beam irradiation via a mask, and which automatically repairs a pattern defect.

According to the techniques disclosed by Japanese Patent Laid-open Publications No. H10-177844 and H10-324973 described above, unevenness of the circuit pattern may be caused due to repairing the targeted circuit pattern built into the display apparatus. Therefore, it is difficult to obtain a circuit pattern with a desired quality and precision.

Conventionally, inspection of the circuit pattern is performed after the display apparatus is completed. Since the circuit pattern is built in the display apparatus by laminating multiple pattern layers, a circuit pattern defect can be repaired only when it is formed on the uppermost layer of the display apparatus.

The present invention has been made considering the above situation, and another object of the present invention is to prevent a failure occurrence in a circuit pattern formed on the panel substrate for the display apparatus, without deteriorating quality and precision of the circuit pattern.

In order to attain the above objects, the first aspect of the present invention is directed to a mechanism in which a mask with a standard pattern having a shape identical to a shape of the pattern to be repaired is used in such a manner as switched according to a target pattern, and a substrate stage placing a substrate thereon and a mask stage placing the mask thereon are synchronously moved, whereby the substrate stage and the mask stage are synchronously shifted to a defect position after the substrate is superimposed on the mask at a reference point, and the pattern on the substrate and the mask pattern are precisely superimposed on one another so as to be irradiated with a laser beam, even when the defect is large in scale.

In addition, the defect and the pattern are detected from an image in the vicinity of the defect received from the inspection apparatus, and the reference point and the laser irradiating region are predetermined based on a positional relationship between the defect and the pattern, thereby solving a problem that the reference point of the pattern on the substrate cannot be found, or a problem that alignment cannot be performed since the defect is too large, as well as reducing the time for searching for the reference point of the pattern on the substrate.

The second aspect of the present invention is directed to a method for manufacturing a display apparatus having multiple pattern layers each formed by etching a layer on the upper surface of which a resist pattern is formed, including in an operation of forming each of the pattern layers, an inspecting process which inspects the resist pattern prior to the etching, and a repair process which repairs the resist pattern according to an inspection result in the inspecting process.

Here, if the inspection result from the inspecting process indicates a short-circuit defect in the resist pattern, the repair process may include a step to open the short-circuit defective portion in the resist pattern by laser processing. On the other hand, if the inspection result from the inspecting process indicates an open-circuit defect in the resist pattern, the repair process may include a step to coat the resist material once again onto the open-circuit defective portion in the resist pattern, and a step to locally re-form a resist pattern, by applying laser machining to the portion targeted for recoating the resist material.

According to the present invention, a degree of precision in repairing defect can be enhanced, further enabling an automatic repair, thereby improving display quality and reducing cost. With the automation of repairing operation, the inspection/repair can be performed through a continuous conveyance, resulting in cost reduction because of decrease of processing time for the inspection/repairing operation and improvement in yields.

According to the present invention, since the repair is performed onto the resist pattern, it is possible to reduce an influence on the pattern layer due to the repair of the pattern defect. In addition, since the inspection and repair of the resist pattern are performed within an operation for forming each of the pattern layers of the display apparatus, a repair of pattern defect with respect to each pattern layer is possible. Therefore, without deteriorating the quality/precision of the circuit pattern, it is possible to prevent a defect occurrence in the circuit pattern which is built in the display apparatus.

BRIEF DESCRIPTION OF THE DRAWING

These and other features, objects and advantages of the present invention will become more apparent from the following description when taken in conjunction with the accompanying drawings wherein:

FIG. 43A, FIG. 43B, FIG. 43C, FIG. 43D, and FIG. 43E are illustrations to explain the particle mixing defect repairing operation.

FIG. 44 is a process diagram to explain the circuit pattern forming step (S3903) as shown in FIG.

FIG. 45A and FIG. 45B are illustrations to explain the case where exposure is performed by changing an exposure mask locally.

FIG. 48 is a schematic cross sectional view of a dispenser.

FIG. 49A and FIG. 49B are illustrations showing a modified examples of the resist material which is recoated.

DETAILED DESCRIPTION OF PREFERRED EMBODIMENTS

Hereinafter, preferred embodiments of the present invention will be explained in detail with reference to the accompanying drawings. In the explanation of the embodiments of the present invention, a repair of wiring in liquid crystal display is taken as an example. However, the present invention can be generally applied to a repair of pattern formed on a plane, and not limited to the liquid crystal display.

EXAMPLE 1

In general, the liquid crystal display (LCD) has a structure having two glass substrates interposing liquid crystal therebetween, and generates an electronic latent image by controlling molecular orientation of liquid crystal in individual pixels, through an electric field within a condenser formed by numerous image pixel electrodes and common electrodes, and liquid crystal, those electrodes being arranged in a form of matrix. In a transmissive LCD, an image is displayed by rendering the electronic latent image visible, with a control of light transmittance of a rear-mounted back light. The LCD forms on the active matrix substrate, a circuit to control applied voltage of the pixel electrodes, and a color filter, for example, tricolor filter, is formed on the color filter substrate, so as to display a color image.

Figure 1:
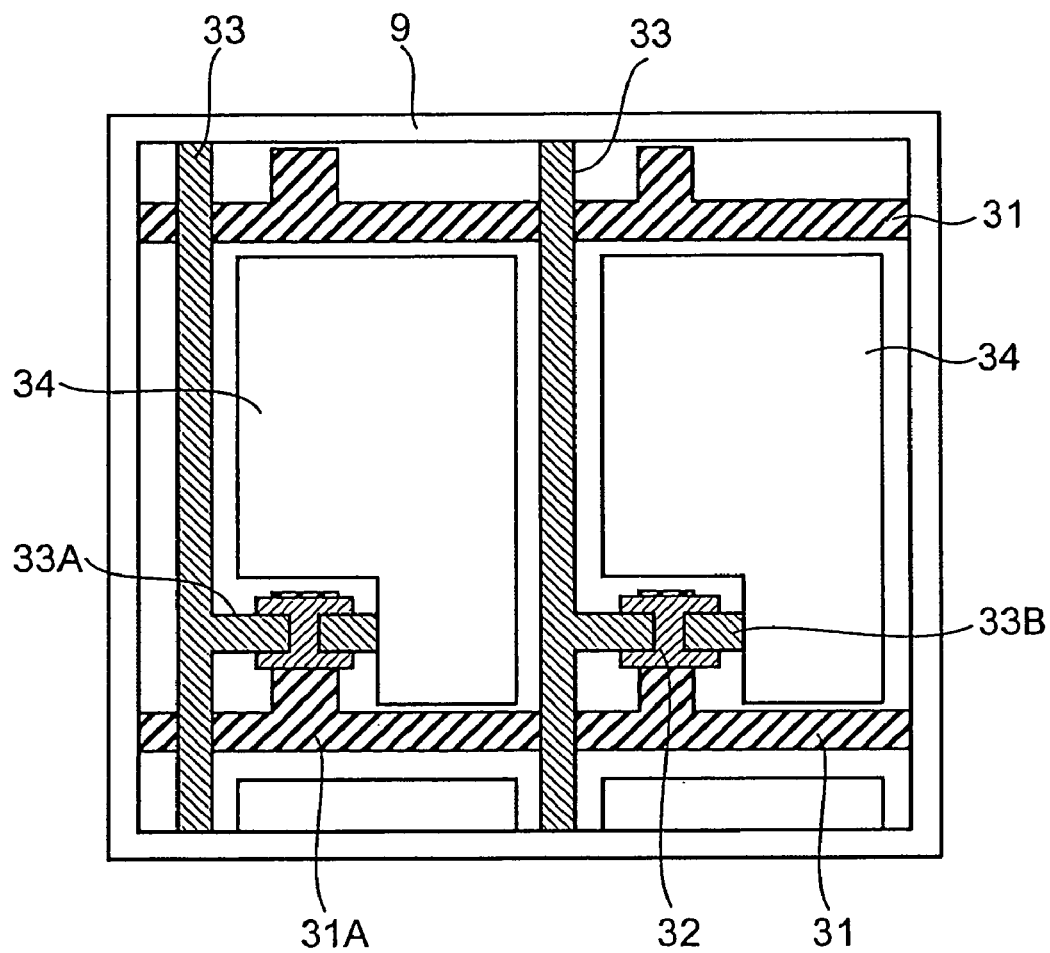
FIG. 1 is a schematic plan view to explain an example of pixels formed on an active matrix substrate of a liquid crystal display.

FIG. 1 is a schematic plan view to explain an example of pixels formed on an active matrix substrate of the liquid crystal display. FIG. 1 shows adjacent two pixels. Various wiring and electrodes formed on the active matrix substrate are configured in a thin film multilayer circuit including an insulating layer between the layers.

In FIG. 1, there are formed numerous gate wiring 31 parallel to one direction on the substrate 9 for which glass is suitable as a material. Gate electrode 31A of thin film transistor is formed on a part of the gate wiring 31, in such a manner as protruding inside the pixel. An island of semiconductor layer (here, a-Si layer) 32 being an active layer is provided by patterning on the gate electrode 31A.

A gate insulation layer, not illustrated, is formed in such a manner as covering the gate wiring 31, and multiple pieces of drain wiring 33 insulated by the gate insulation layer are formed in parallel with the other direction crossing the gate wiring 31. Then, one pixel is formed in a region surrounded by two pieces of gate wiring 31 and two pieces of drain wiring 33. A part of the drain wiring 33 exists on the semiconductor layer 32 in extended manner, and forms the drain electrode 33A of the thin film transistor. In addition, a source electrode 33B which faces to the drain electrode 33A in the vicinity thereof and constitutes a channel of the thin film transistor is formed on the same layer as that of the drain electrode 33A.

A passivation layer is formed as an upper layer of the gate wiring 31 and the drain wiring 33, and pixel electrodes 34 are formed thereon. The pixel electrode 34 is a transparent electrode for which ITO (Indium Tin Oxide) is suitable as a material, and established conductive connection with the source electrode 33B via a contact hole not illustrated. Here, the drain electrode 33A and the source electrode 33B switch positions with each other during operations, but it is specified as described above for ease of explanation.

The gate wiring 31 is a scanning wiring and the drain wiring 33 is a signal wiring. When a gate wiring 31 is selected by a scanning signal, the thin film transistor connected to thus selected gate wiring 31 is turned on, and a voltage according to display data, which is supplied to the drain wiring 33, is generated in the pixel electrode 34. Then, an electric field having a size in proportion as the voltage generated in the pixel electrode 34 is generated between the pixel electrode 34 and the common electrode, not illustrated. Molecular orientation of liquid crystal is controlled by this electric field, thereby controlling transmission quantity of illumination light from the back light, so as to form a visible pixel.

Such a thin film multilayer circuit as described above is formed by, in general, photolithography technique, in order of gate electrode 31, gate insulator, semiconductor layer, drain electrode, and pixel electrode. Since each layer has a part overlapping one another, it is necessary to repair a pattern abnormality such as short-circuit and wire break, prior to forming the next layer.

Wiring formation by the photolithography technique is performed by firstly forming the wiring material on the overall substrate uniformly, and then coating thereon a photo resist which is photopolymer. Next, light is irradiated via a mask on which a circuit pattern is formed and the photo resist is exposed to the light. In the case of positive type photo resist, the exposed part is removed when it is developed, and a photo resist pattern is formed. Furthermore, wiring is formed through etching process and resist separation process.

Short circuit, being one of pattern shape abnormality corresponds to a portion remaining without being etched, and it occurs due to a remaining resist or insufficient etching. In particular, as for particle attached at the time of resist coating, resists tend to be collected around the particle by surface tension. Therefore, huge resist remains may occur, causing wire short-circuit across several pixels.

Figure 2:
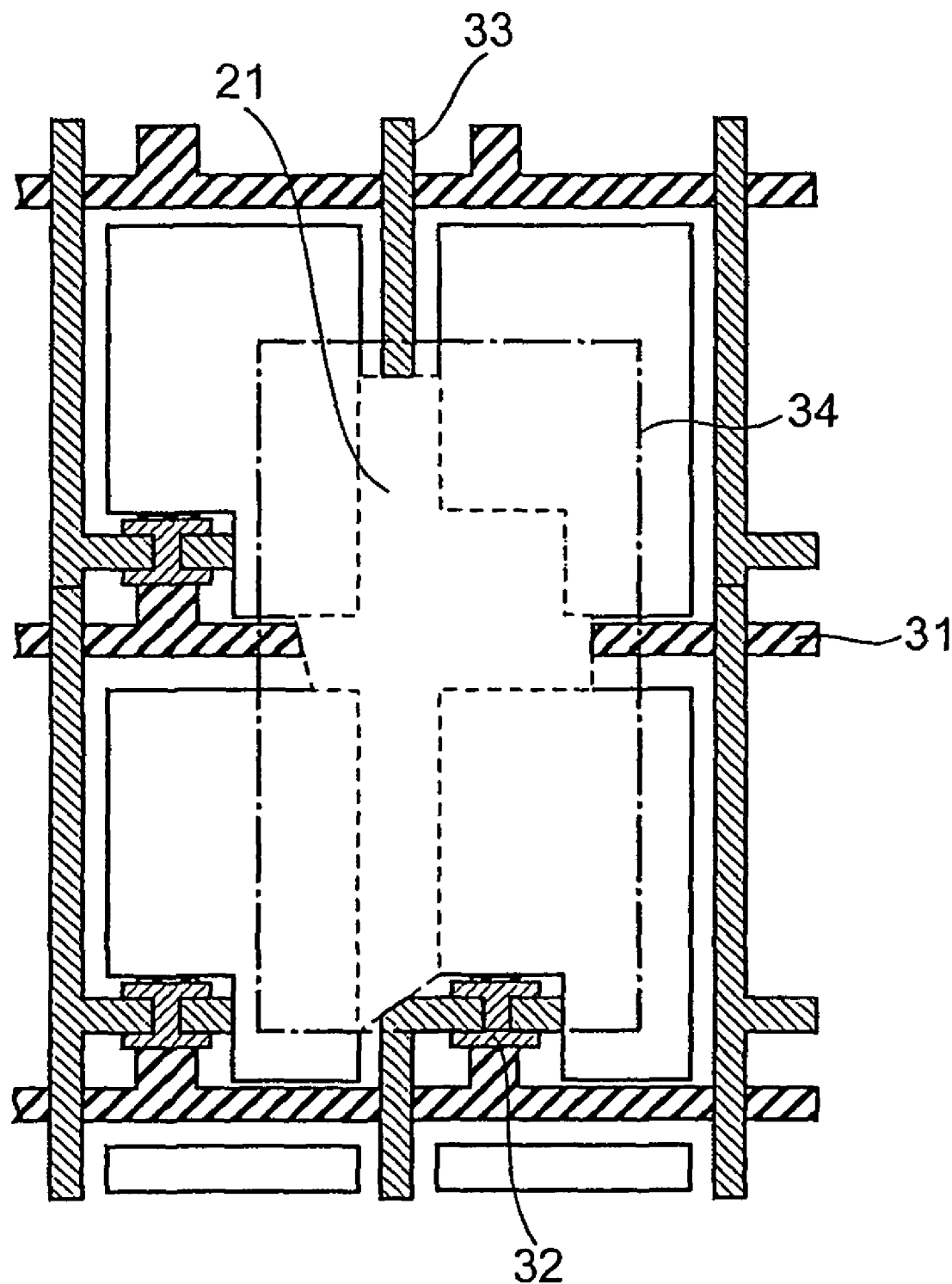
FIG. 2 is a schematic plan view showing an example in which a huge short-circuit exists across multiple pixel electrodes.

FIG. 2 is a schematic plan view showing an example in which a huge short circuit 21 exists across multiple pixel electrodes. In this example here, there is shown a status that the pixel electrode 34 is short-circuited across adjacent four pixels. A general laser beam machine is designed to be capable of applying laser having a rectangular shape and removing the short-circuited part through several laser applications. However, if the pattern of pixel electrode is completely collapsed as shown in FIG. 2, it is not possible to find out how the pattern has been originally placed. Therefore, it is hard to restore the original electrode pattern with high precision.

Figure 3:
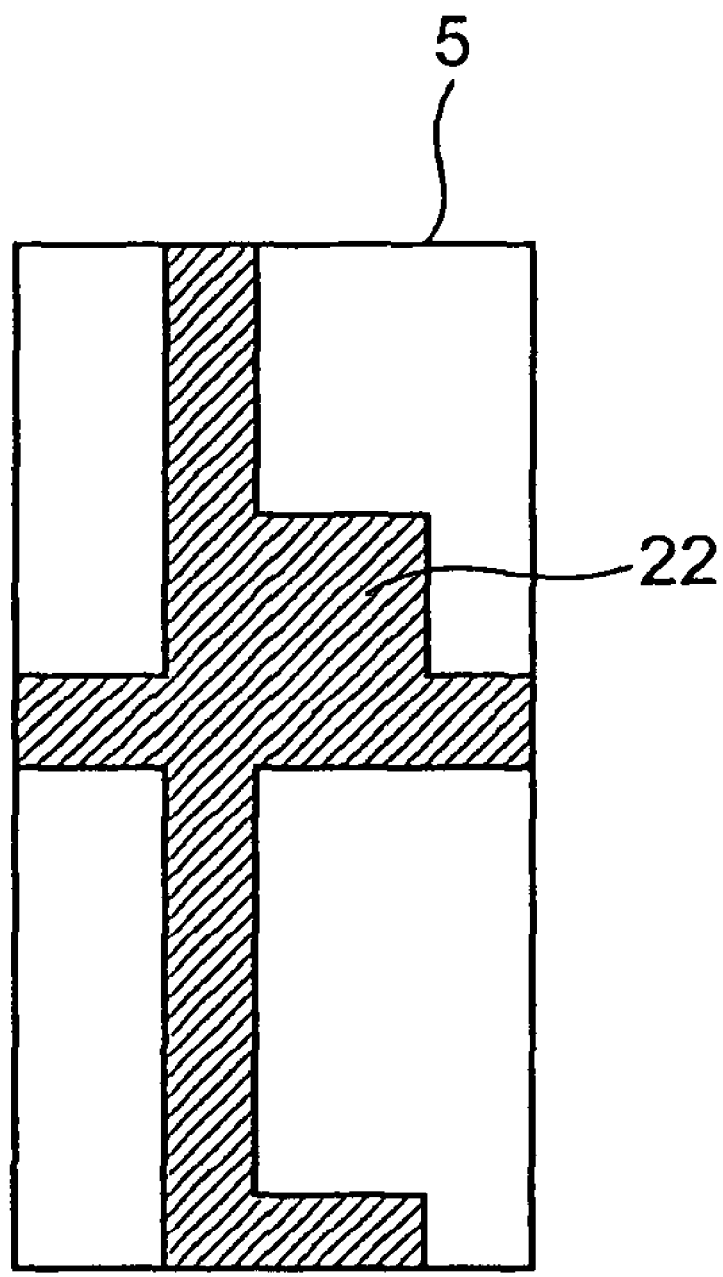
FIG. 3 is an illustration showing a mask which has a laser transparent pattern with a shape identical to the wiring pattern in a short-circuited part.

Given this situation, the laser beam is irradiated via the mask 5 having a laser transmission pattern 22 with a shape identical to the wiring pattern in the portion of short-circuit 21, as shown in FIG. 3, and the short-circuit 21 is removed and pixel electrode 34 is separated into each pixel, thereby enabling a highly precise pattern repair.

Since the circuit of the liquid crystal display is formed by laminating several pattern layers, if a part other than the pattern abnormal portion is irradiated with laser, the lower layers already formed may be affected. Explanation will be made taking as an example the pattern abnormality in the pixel electrode 34. Generally, ITO (Indium Tin Oxide) is used as a material for the pixel electrode 34, and aluminum is used for the gate wiring 31 and the drain wiring 33. ITO has a high absorption rate in a short wavelength, for example, 200 to 300 nm, and aluminum has a high reflection rate in this wavelength region.

Therefore, with irradiation of laser beam having the wavelength from 200 to 300 nm, only ITO can be removed. In the case of laser repair utilizing a mask having a predetermined wiring pattern, a part other than the pattern abnormal portion to be repaired is irradiated with laser beam. However, by use of a difference in laser beam absorbing property between materials, only the part to be repaired can be removed.

Figure 4:
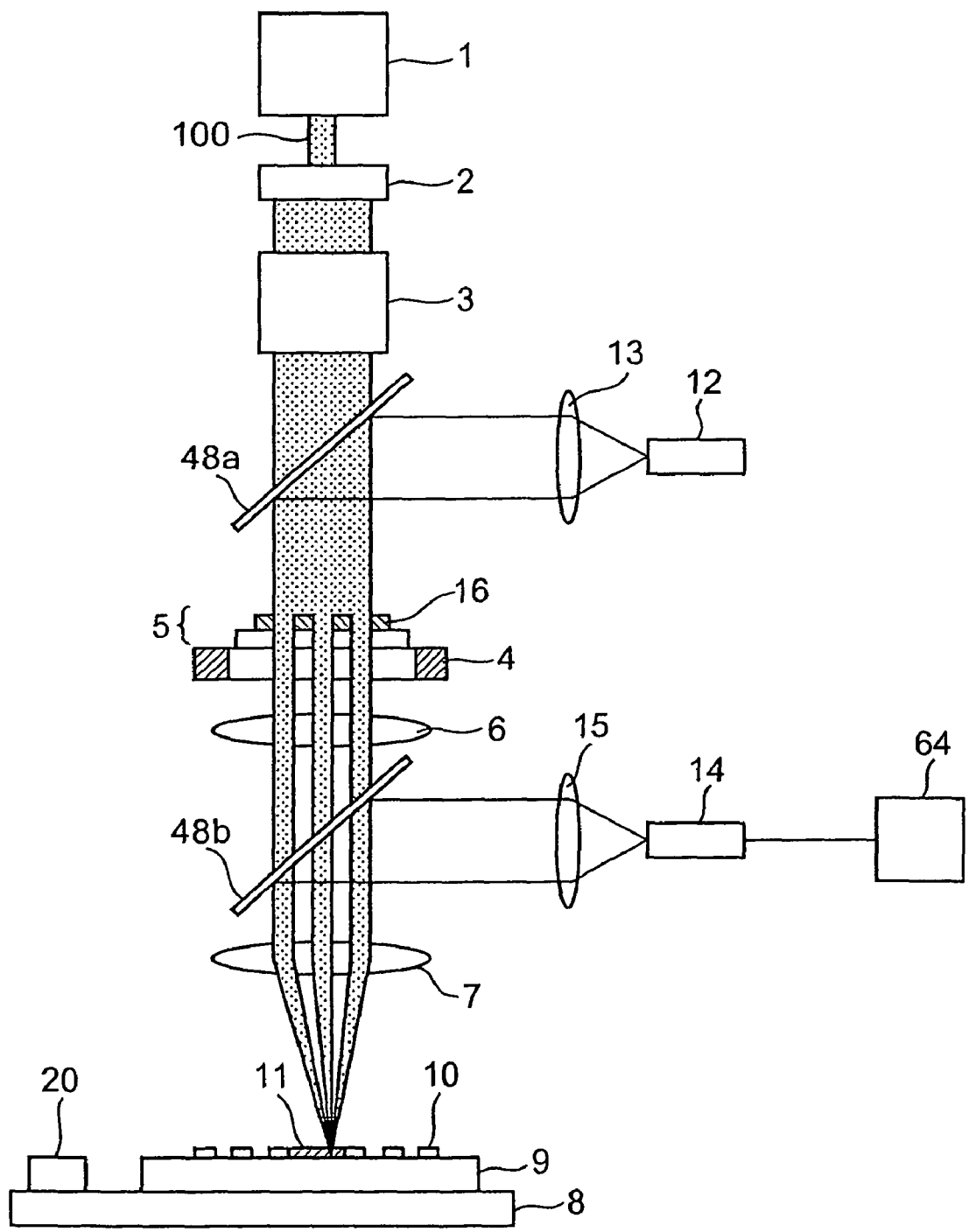
FIG. 4 is an illustration showing a configuration of a laser irradiation optical system according to the present invention.
Figure 5:
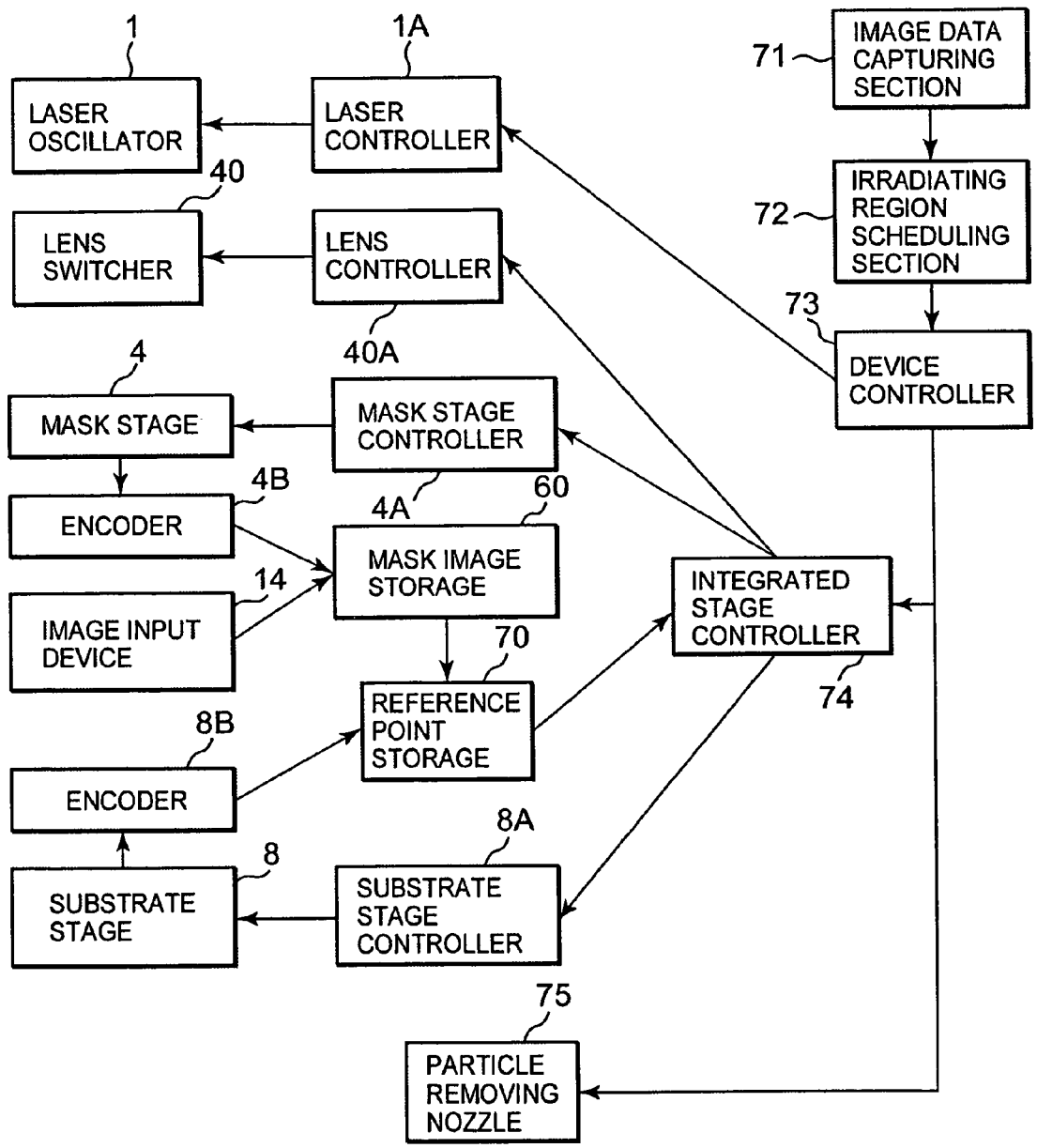
FIG. 5 is a diagram showing a system configuration of a repairing apparatus according to the present invention.

FIG. 4 is an illustration showing a configuration of a laser irradiation optical system according to the present invention. FIG. 5 is a diagram showing a system configuration of a repairing apparatus according to the present invention. Beam expander 2 expands the laser beam 100 irradiated from laser oscillator 1 to a predetermined beam diameter, and uses homogenizer 3 to secure uniformity of laser strength on the overall surface of the laser irradiating region. The laser beam thus reshaped is allowed to pass through the mask 5 installed on the mask stage 4, and further passing through imaging lens 6 and objective lens 7, and then, a portion to be repaired 11 of wiring pattern 10, an electrode, or the like on the glass substrate 9, is irradiated with the laser beam, the glass substrate being placed on the substrate stage 8.

The imaging lens 6 and the objective lens 7 are arranged in such a manner as projecting an image of the mask 5 onto the glass substrate 9, the mask image is projected on the glass substrate 9 in a size by a factor of focal distance ratio between the imaging lens 6 and the objective lens 7 (focal distance ratio M=focal distance of the objective lens 7/focal distance of the imaging lens 6). With this optical system configuration, a region obtained by reducing the transmission portion of the mask 5 can be irradiated with the laser beam.

There is formed on the mask 5 a mask pattern 16 obtained by multiplying by 1/M, the standard pattern of the wiring pattern 10 formed on the glass substrate 9. It is preferable that the mask pattern 16 is made of a material having a high reflection coefficient with respect to the laser light 100, for example, aluminum and the like.

The mask stage 4 and the substrate stage 8 are allowed to move in a plane perpendicular to the optical axis direction of the laser irradiation optical system, and they are be able to move synchronously with each other. The image of the mask 5 mounted on the mask stage 4 is reduced by a factor of 1/M on the glass substrate 9. Accordingly, when a moving amount of the mask stage 4 is assumed to be V, the projected mask image moves V/M.

Therefore, the mask stage 4 and the substrate stage 8 are moved in sync with each other in such a manner that a ratio between the moving amount of the mask stage 4 and the moving amount of the substrate stage 8 is equal to the ratio between the size of the mask pattern 16 and the size of the wiring pattern 10, thereby allowing the stages to move maintaining conformity between the wiring pattern 10 and the laser irradiation pattern.

As described above, the ratio between the size of the mask pattern 16 and that of the wiring pattern 10 is equal to the focal distance ratio between the imaging lens 6 and the objective lens 7. Since the imaging lens 6 is fixedly provided, in general, the ratio between the size of the mask pattern 16 and the size of the wiring pattern 10 is determined by the objective lens 7. Therefore, it is further possible to add a mechanism which is provided with a function to change the ratio between the moving amount of the mask stage 4 and the moving amount of the substrate stage 8 in conjunction with an interchange mechanism of the objective lens 7.

In order that the laser beam pattern irradiated via the mask 5 is in proper alignment with the wiring pattern 10 on the glass substrate 9, generally, reference points are set on the respective patterns and the alignment is performed so that the relative position between those reference points indicates a predetermined value. A general method such as pattern matching can be used to detect the reference points.

Pattern matching is a method which registers in advance an image of a characteristic portion of the pattern as a template, sets a reference point on the image, and detects a point corresponding to thus registered image from an image of actual pattern to find out the reference point. According to this pattern matching method, a reference point of the wiring pattern can be easily detected.

Next, with reference to FIG. 4, a method for detecting a reference point of the laser beam pattern irradiated via the mask 5 will be explained. At first, luminous light irradiated from the light source 12 is collected by the lens 13 and the mask 5 is irradiated with the light via half mirror 48a. Then, an image of the mask 5 (mask image, mask pattern) is provided on the glass substrate 9 by the imaging lens 6 and the objective lens 7.

When this mask pattern is stored, it is necessary to exclude a thing other than the mask image. Therefore, the projection is made on the pattern projection part 20 on the substrate stage 8. Alternatively, a plate-like jig having the same thickness as the glass substrate 9 may be installed on the substrate stage 8, and the mask image may be projected on this jig surface.

Since the imaging position is on the surface of the glass substrate 9, the height of the pattern projection part 20 is equal to the glass substrate surface, and there is provided a mechanism which allows a change of distance between the objective lens 7 and the substrate stage 8, so that the height of the pattern projection part 20 can correspond to the change in thickness of the glass substrate 9. When the substrate stage 8 is positioned to be available for loading/unloading the glass substrate 9, the pattern projection part 20 is installed at a position so that it is included in the field of view. With this configuration, every time the glass substrate to be repaired is loaded on the substrate stage 8, the position of the laser irradiating region can be checked, and erroneous repair can be prevented.

It is further possible to employ a laser beam for processing as a light to illuminate the mask 5. Generally, the imaging lens 6 and the objective lens 7, which are used for laser irradiation, are subjected to color correction corresponding to the irradiated laser wavelength. Therefore, if a light having a different wavelength is used as illuminating light, the position of the mask image is displaced due to the difference in refraction factor. If a laser beam for processing is employed, it is advantageous because such displacement will not occur. It is easily achieved by reducing the laser output or employing the mask image projection part made of a material which is not processed by the laser.

When a pattern image projected on the pattern projection part 20 is taken by CCD camera 14, which is an image input device, via the half mirror 48b, this image-taking is performed while the mask stage 4 is subjected to step feed, so that the entire mask image can be taken. At this timing, the images thus taken are stored in the mask image storage 60 in association with the moving amount of the mask stage 4.

System configuration of the repairing apparatus as shown in FIG. 5 is provided with, laser oscillator 1, laser controller 1A, lens switcher 40, lens controller 40A, mask stage 4, mask stage controller 4A, encoder 4B of the mask stage, image input device 14, substrate stage 8, substrate stage controller 8A, encoder 8B of the substrate stage, mask image storage 60, reference point storage 70, and integrated stage controller 74.

The system configuration of the repairing apparatus is further provided with image data capturing section 71, irradiating region scheduling section 72, device controller 73, and particle removing nozzle 75, and each of the constituent elements are connected with one another based on control/controlled relationships as shown with arrows in FIG. 5. A reference point of the laser beam pattern is set at a position being close to the reference point having been set to the wiring pattern of the mask image that is stored in the mask image storage 60.

Alternatively, it is further possible to employ a method which provides a mechanism to switch the orientation of half mirror 48b, turning it by 90 degrees and change the lens 15 with another lens having the same focal distance as that of the objective lens 7, thereby taking the mask image by directly providing an image on the CCD camera 14.

Figure 6:
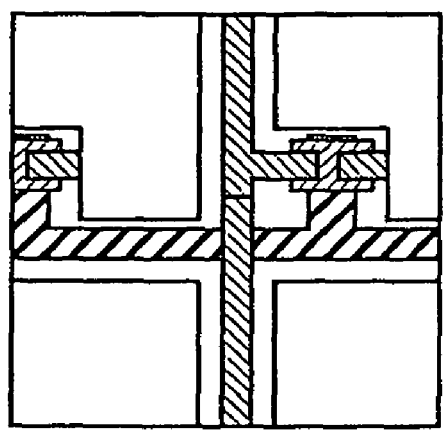
FIG. 6 is an illustration showing the first example of a method to obtain reference points for the mask pattern and the actual pattern.
Figure 6:
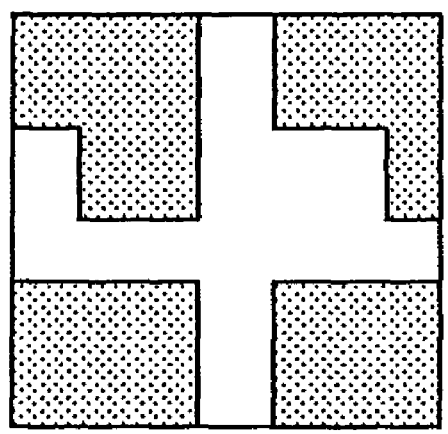
Figure 6:
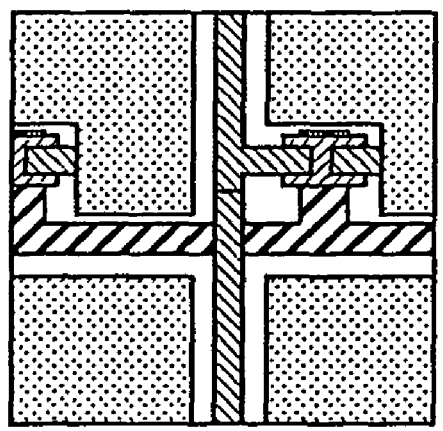

Next, with reference to FIG. 4 and FIG. 6, there will be explained a method to obtain a relative positional relationship between the reference point of laser beam pattern and the reference point of wiring pattern in the case where the laser beam pattern is superimposed on the wiring pattern. FIG. 6 is an illustration showing the first example of the method to obtain reference points respectively for the mask pattern and the actual pattern. The glass substrate 9 is put on the substrate stage 8 as shown in FIG. 4, and a normal wiring pattern (A) is captured by the CCD camera 14 and this image is displayed on the monitor 64. At this stage, as shown in FIG. 6, a composite image (C) is displayed, which is obtained by superimposing on one another, the semi-transparent wiring pattern image (A) thus captured and the semi-transparent mask image (B) stored in the mask image storage 60.

The composite image (C) obtained by superimposing the semi-transparent images on one another can be easily displayed by calculating an average between a luminance value of the wiring pattern image (A) and a luminance value of the mask image (B). The mask image on the screen is displayed in sync with the mask stage 4, and when the mask stage 4 moves, the mask image on the screen of the monitor 64 also moves. According to a manipulation by an operator, the substrate stage 8 or the mask stage 4 is moved so that those two images conform to each other. When they conform to each other, the relative position of the reference point of the wiring pattern image (A) and the reference point of the mask image (B) are stored.

Figure 7:
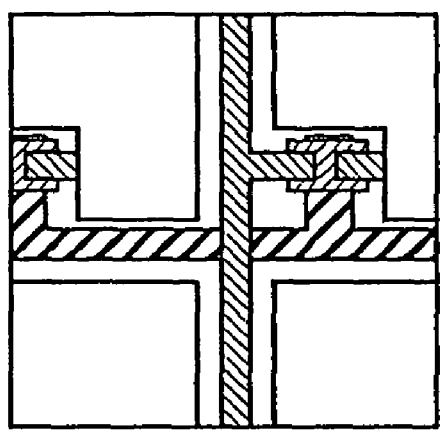
FIG. 7 is an illustration showing the second example of the method to obtain reference points for the mask pattern and the actual pattern.
Figure 7:
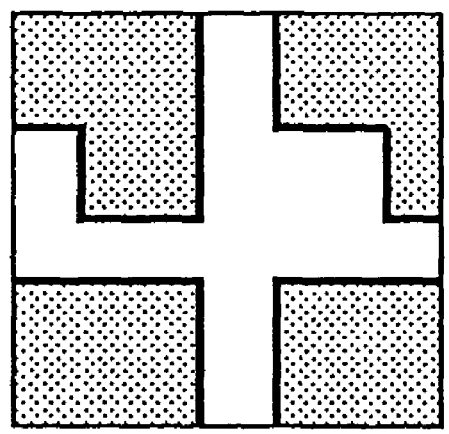
Figure 7:
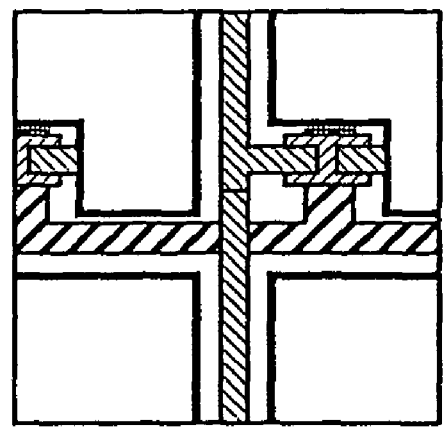

FIG. 7 is an illustration showing the second example of the method to obtain reference points for the mask pattern and the actual pattern. As another method for displaying the wiring pattern image (A) and the mask image (B) simultaneously on the monitor 64, as shown in FIG. 7, it is possible to use a method to display mask edge image (B'), which is an outline extracted from the mask image (B), in such a manner as superimposing on the wiring pattern image (A). The mask edge image (B') includes both a part through which illuminating light has passed and a part shielding the light, causing a high contrast on the image.

Therefore, in order to extract the outline, a commonly used edge detecting means is applicable. In a method to display the wiring pattern image (A) and the mask edge image (B') in such a manner as superimposing on one another, the pixel corresponding to the outline is displayed in color of black (luminance value is close to zero) in the case where the wiring pattern image (A) is bright (luminance value is high), whereas the pixel corresponding to the outline is displayed in color of white (luminance value is close to the maximum value) in the case where the wiring pattern image (A) is dark (luminance value is low).

Figure 8:
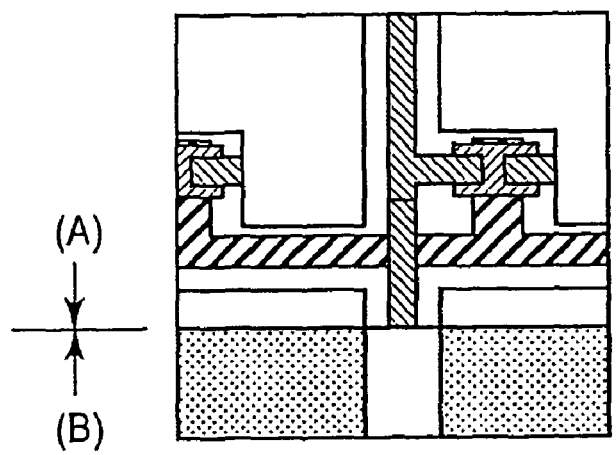
FIG. 8 is an illustration showing the third example of the method to obtain reference points for the mask pattern and the actual pattern.
Figure 9:
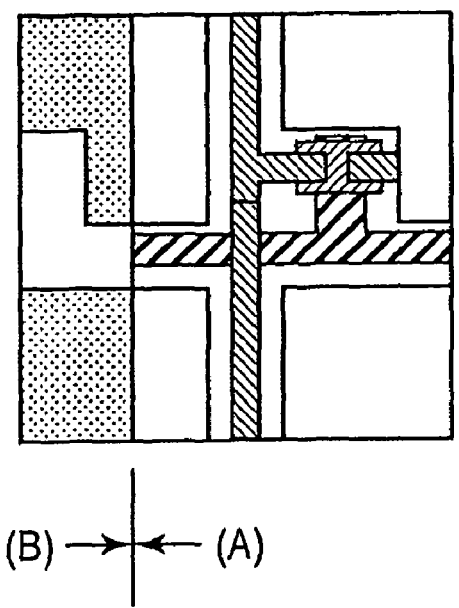
FIG. 9 is an illustration showing the fourth example of the method to obtain reference points for the mask pattern and the actual pattern.

FIG. 8 is an illustration showing the third example of the method to obtain reference points for the mask pattern and the actual pattern and FIG. 9 is an illustration showing the fourth example of the method to obtain reference points for the mask pattern and the actual pattern, those methods being alternative examples to obtain the reference points utilizing the wiring pattern (A) and the mask image (B) as explained in FIG. 6. FIG. 8 shows a method where the wiring pattern image (A) is overlapped by a part of the mask image (B) vertically, and comparisons are made as to how the both patterns are superimposed at the boundary between the two images.

FIG. 9 shows a method where the wiring pattern image (A) is overlapped by a part of the mask image (B) horizontally, and comparisons are made as to how the both patterns are superimposed at the boundary between the two images.

Figure 10:
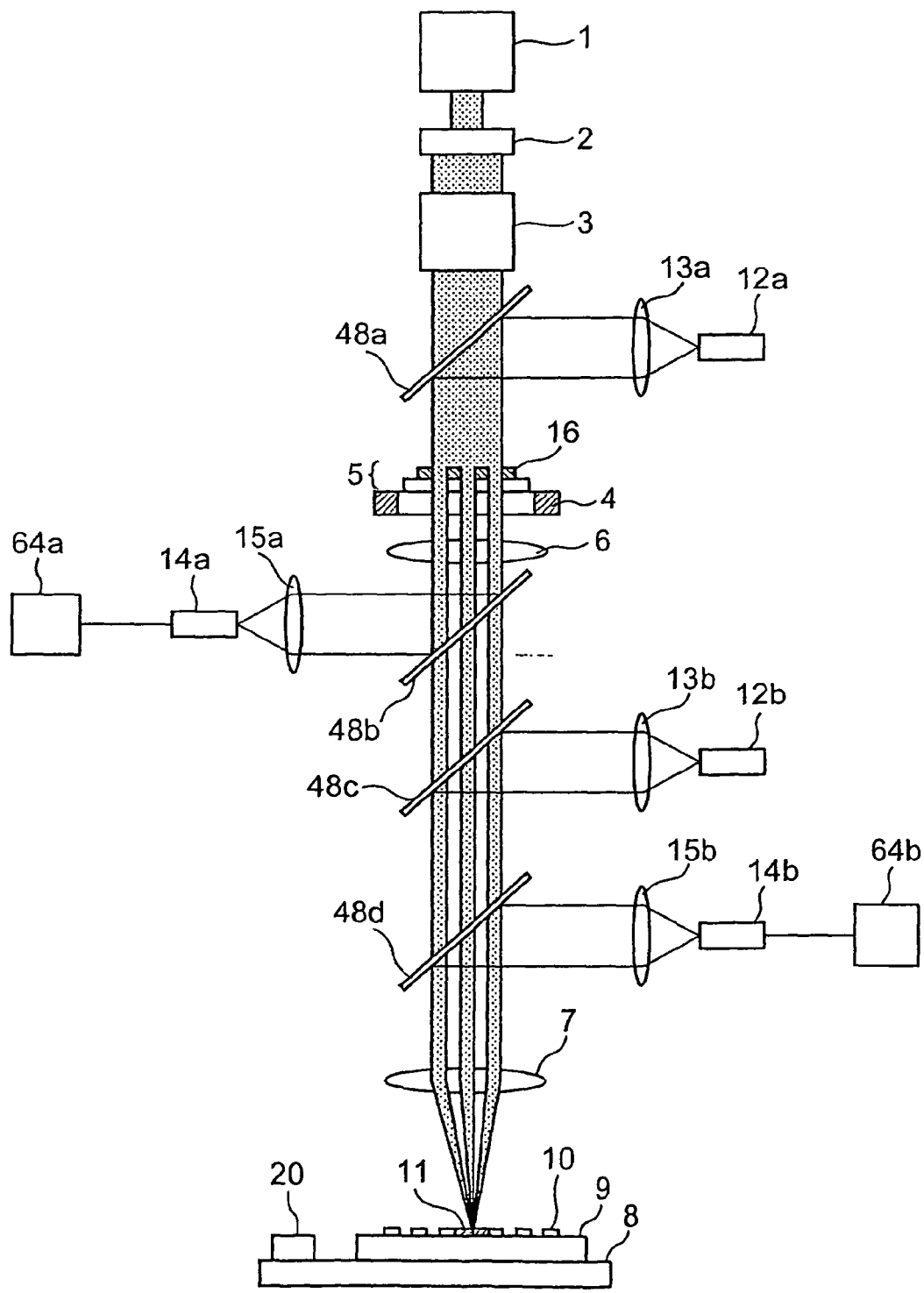
FIG. 10 is an illustration showing a configuration of the laser irradiation optical system configuration which implements another method to register a relative positional relationship between the reference point of the wiring pattern and the reference point of the mask image.

FIG. 10 is an illustration showing a configuration of the laser irradiation optical system configuration which implements another method to register a relative positional relationship between the reference point of the wiring pattern and the reference point of the mask image. The same reference numeral as shown in FIG. 4 represent the same functional parts and the operations thereof shall not be tediously explained. In FIG. 10, light source 12b, CCD camera 14b, lenses 13b and 15b are added to the configuration as shown in FIG. 4. In FIG. 10, firstly, the mask image illuminated by the light source 12a provides an image on an image sensor of the CCD camera 14b which takes the image, and at the same time, the CCD camera 14a takes the mask image provided on the pattern projection part 20. The images taken by the CCD cameras 14a and 14b are displayed on the same screen by the method as shown in FIG. 6 to FIG. 9, and the positions of the CCD cameras 14a and 14b are adjusted so that the images conform to each other.

Next, the glass substrate 9 is put on the substrate stage 8, and the light source 12b is turned on, allowing an image-taking of the wiring pattern on the glass substrate 9. The images taken by the CCD cameras 14a and 14b are displayed on the same screen with the method as shown in FIG. 6 to FIG. 9, and a position of the mask stage 4 or the substrate stage 8 is adjusted so that the two images conform to each other. When the two images conform to each other, a relative position between the reference point of the wiring pattern image and the reference point of the mask image is stored.

If the portion to be repaired is larger than the laser irradiating region, the laser light is applied through several times of irradiation so as to remove the portion to be repaired. This repair is done through step movement assuming the reference point of the pattern as a starting point. If the pattern reference point is included in the portion to be repaired, this reference point cannot be found by the pattern matching. Therefore, the reference point of the adjacent wiring pattern image is used. In general, if the reference point cannot be found at the initial position, there is employed a means to shift the viewing field spirally and searching is continued until the reference point is found.

However, if the searching is continued until an effective reference point is found, it takes a long time and the repair may not be completed within a predetermined period of time. Furthermore, a defective portion may be erroneously determined as a reference point. Considering the problems above, by use of an image in the vicinity of the defective portion, being obtained from the inspection apparatus, a pattern reference point to be used and/or a step region are prepared through previous scheduling.

Figure 11A:
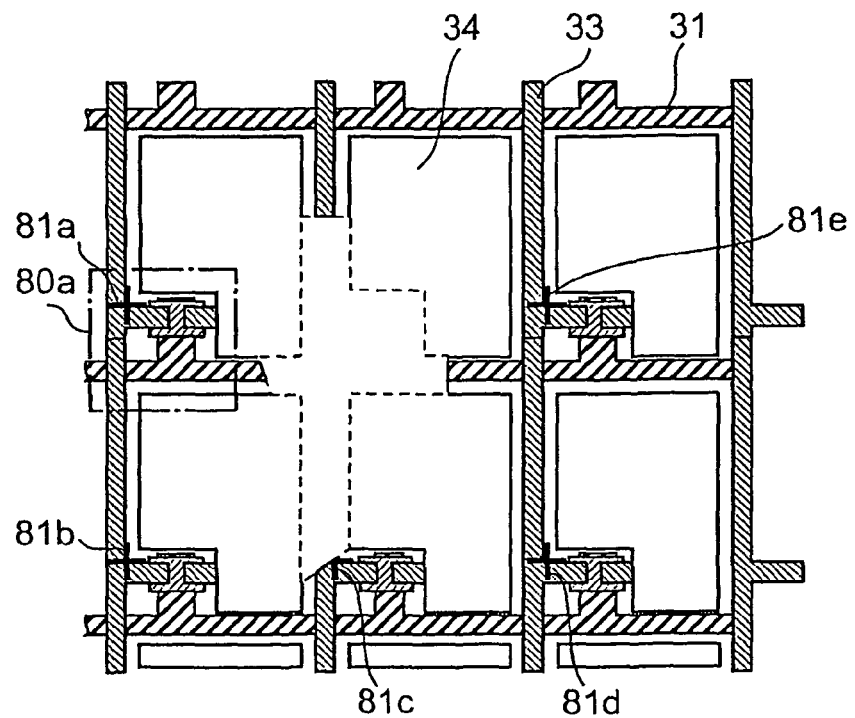
FIG. 11A and FIG. 11B are illustrations showing a scheduling method for the laser irradiating region.
Figure 11B:
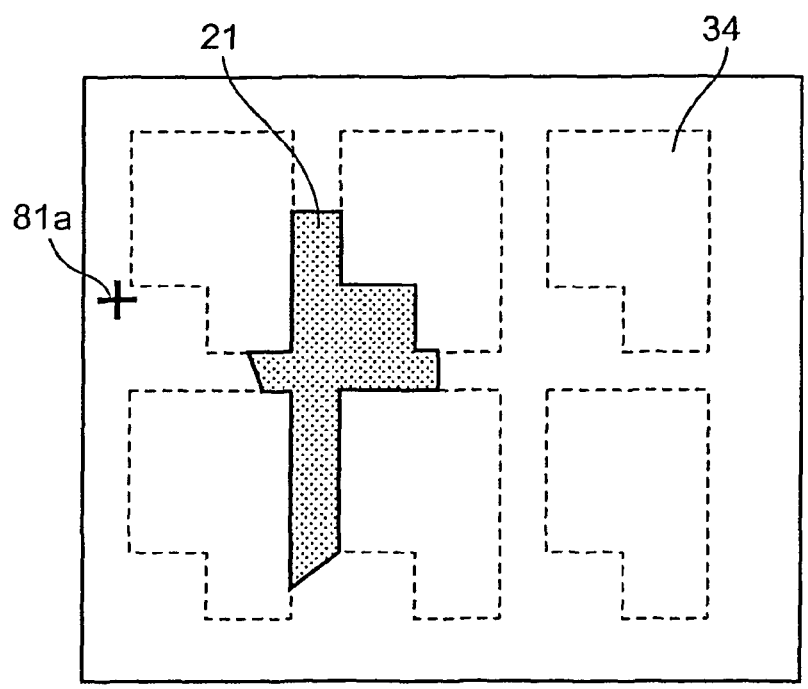
Figure 12:
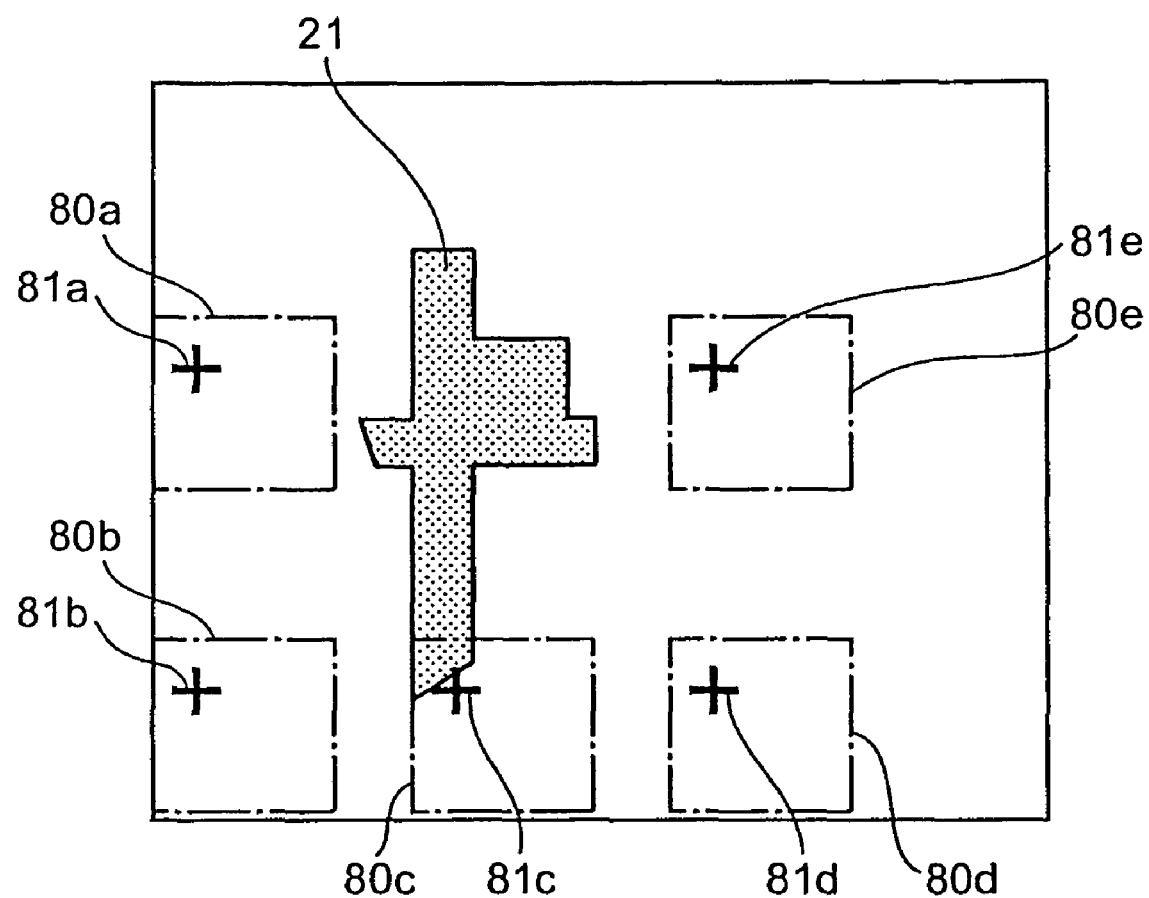
FIG. 12 is an illustration showing a pattern reference point being extracted.

Hereinafter, a scheduling method for the laser irradiating region will be explained. Firstly, a method for detecting the pattern reference point will be explained. FIG. 11A and FIG. 11B are illustrations showing a scheduling method for the laser irradiating region. FIG. 11A is an illustration showing a plan view of wiring pattern of pixels having the defective portion. FIG. 11B is an illustration showing the defective portion that has been extracted. FIG. 12 is an illustration showing the pattern reference points having been extracted. The wiring pattern as shown in FIG. 11A is subjected to image processing, and the defective image as shown in FIG. 11B is extracted. Then, according to the pattern matching as shown in FIG. 12, pattern reference point candidates 81a to 81e are detected.

In this pattern matching, an error in detection may become large if a defect exists within a range of template as a target of matching. Therefore, a matching region not including the defect 21 is selected based on the positional relationship between the defect 21 and the matching regions 80a, 80b, 80c, 80d, and 80e which have been detected. According to this rule, in the example shown in FIG. 12, since the matching region 80c includes the defect 21, it is excluded. A pattern reference point to be used is selected from the remaining matching regions 80a, 80b, 80d and 80e. For example, in order to reduce the traveling time from the reference point, the pattern reference point 81a is selected, which is the closest to the defect. If two or more reference points are used, precision in alignment will be more enhanced. Therefore, both the pattern reference points 81a and 81d may be selected.

Figure 13:
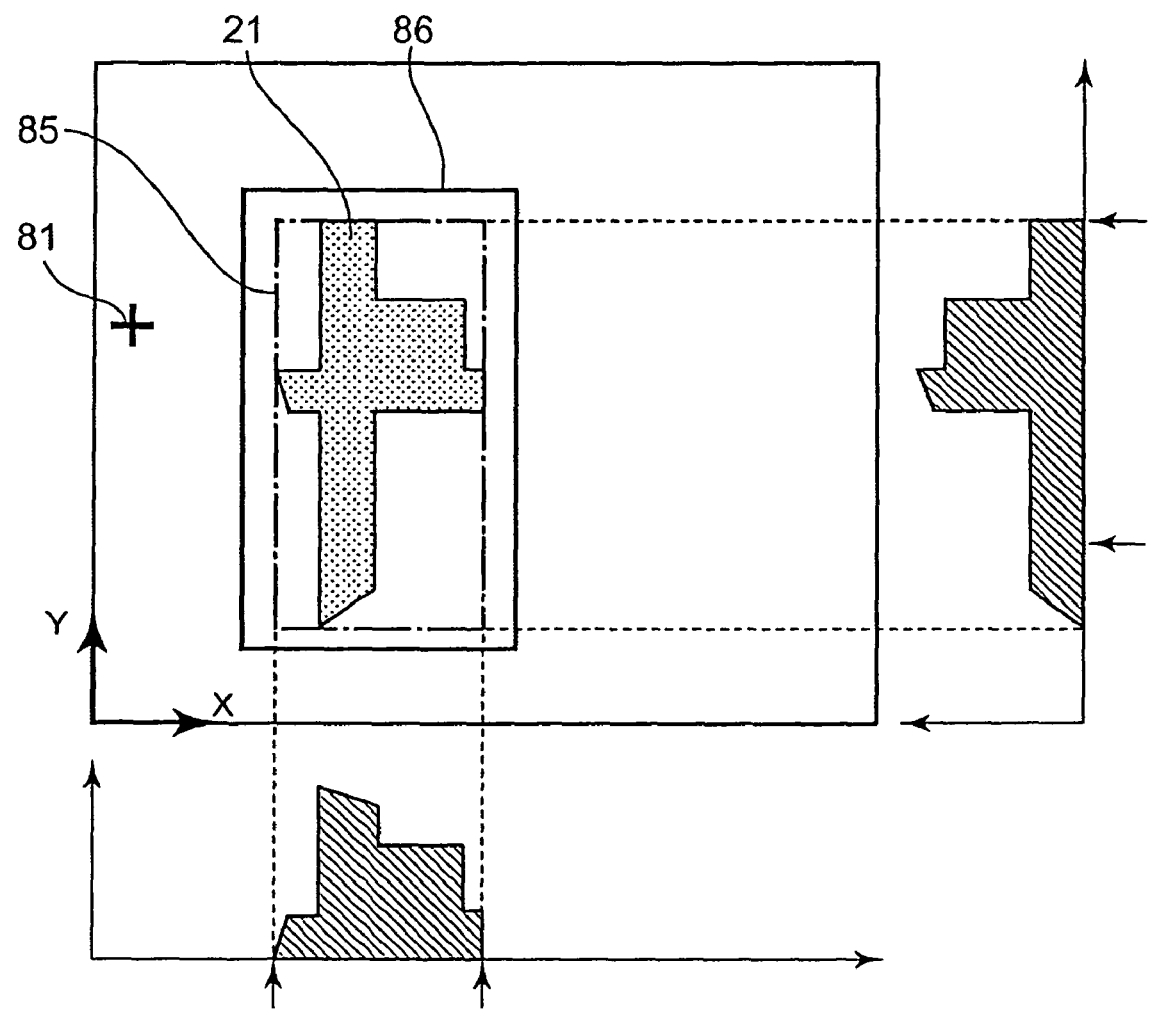
FIG. 13 is an illustration to explain a method for detecting the laser irradiating region.

Next, an example of the method for setting the laser irradiating region will be explained. FIG. 13 is an illustration to explain a method for detecting the laser irradiating region. Here, it is assumed that the defect 21 as shown in FIG. 11B is given as a binarized image. As shown in FIG. 13, the pixels included in the defect 21 are counted for every X coordinate value, whereby the projected value to the X-axis is calculated. As for the Y-axis, the projected value is calculated in a similar manner. The defective region 85 can be detected based on the starting points and ending points obtained from the projected values on X-axis and Y-axis, respectively. Generally, in order to prevent an occurrence of unprocessed part, the laser irradiating region 86 is set to larger by a predetermined value than the defective region 85. At this stage, a relative positional relationship between the pattern reference point 81 and the laser irradiating region 86 is stored.

Figure 14A:
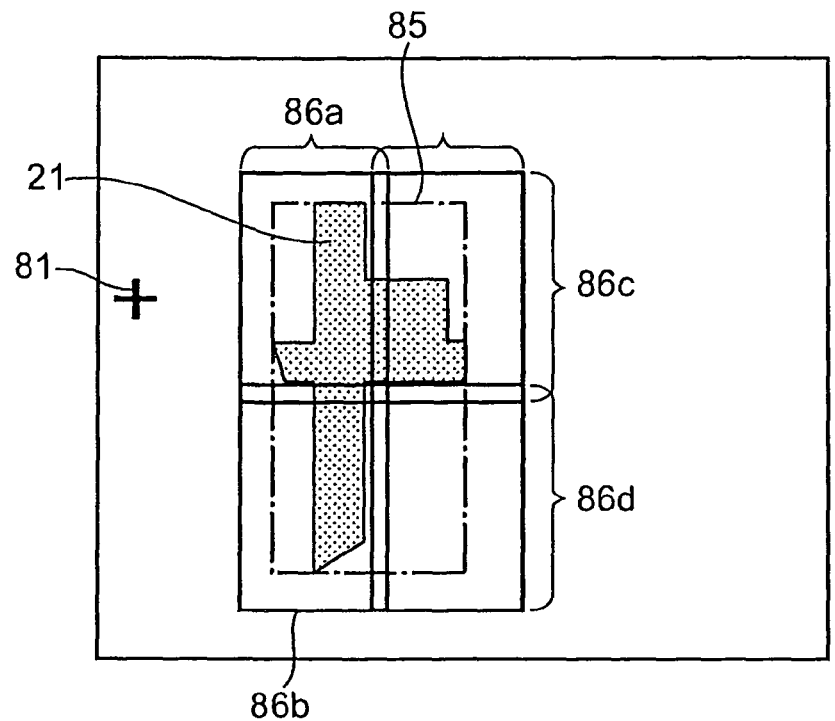
FIG. 14A and FIG. 14B are illustrations of methods for setting the laser irradiating region.
Figure 14B:
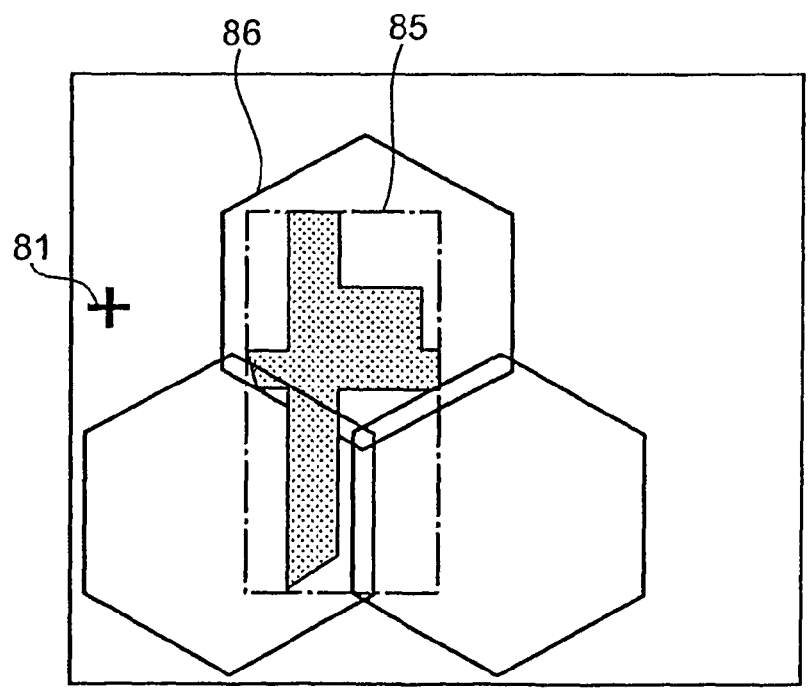

FIG. 14A and FIG. 14B are illustrations of methods for setting the laser irradiating region. FIG. 15A, FIG. 15B, FIG. 15C and FIG. 15D are illustrations showing shapes of the laser irradiating region. If the defect 21 is large in size, only one-time laser irradiation may not be enough to irradiate the entire defective portion. In such an occasion like this, the laser irradiation is performed through several times as shown in FIG. 14A. Since the size of the laser irradiating region 86 is already known, the laser irradiating regions 86a, 86b, 86c, and 86d are provided so that those regions completely cover the defective region 85, assuming a point being offset by a predetermined amount from the upper left point of the defective region 85 as a starting point. In order to prevent an occurrence of unprocessed part, each of the laser irradiating regions are set in somewhat overlapping manner. Similar to the case of one-time laser irradiation, the relative positional relationship between the pattern reference point 81 and each of the laser irradiating regions is stored.

Figure 15A:
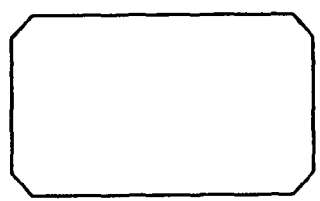
FIG. 15A, FIG. 15B, FIG. 15C and FIG. 15D are illustrations showing shapes of the laser irradiating region.
Figure 15B:
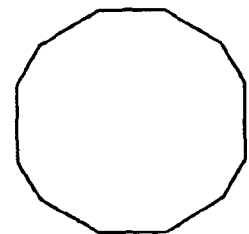
Figure 15C:
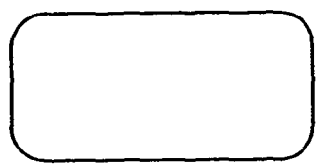
Figure 15D:
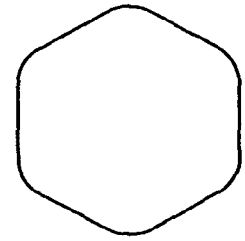

The laser irradiating region 86 may be hexagonal as shown in FIG. 14B. Since the field of view of an optical system is circular, in general, the hexagonal shape may provide a larger area for one-time irradiation rather than a quadrangle shape. Therefore, it is advantageous since the number of shooting can be reduced. Since the laser irradiating regions 6 are set in overlapping manner for the purpose of preventing the occurrence of unprocessed part, there exists a region which is irradiated with the laser more than once. In order to avoid this situation, it is preferable to make the shape as shown in FIG. 15 A and FIG. 15B, from which the corners are cut off, or circular shapes as shown in FIG. 15C and FIG. 15D.

If the laser irradiation is performed through several times, it is necessary that step movement in the laser irradiating region is highly precise. In manufacturing a liquid crystal display, the substrate therein is growing in size, and a substrate of over 1 meter to 2 meters is utilized. Accordingly, the size of the substrate stage also grows, and thus in order to secure a high precision in submicron in the step movement, moving speed may be decreased and cost may be increased. Therefore, in the repairing apparatus, in general, alignment is conducted once again at the repairing position. However, as described above, since there is a restriction in the position of the reference point used for the alignment, the reference point does not necessarily exist at the repair position. Considering the above problem, the alignment is performed by use of the wiring pattern or already-processed wiring pattern.

Figure 16:
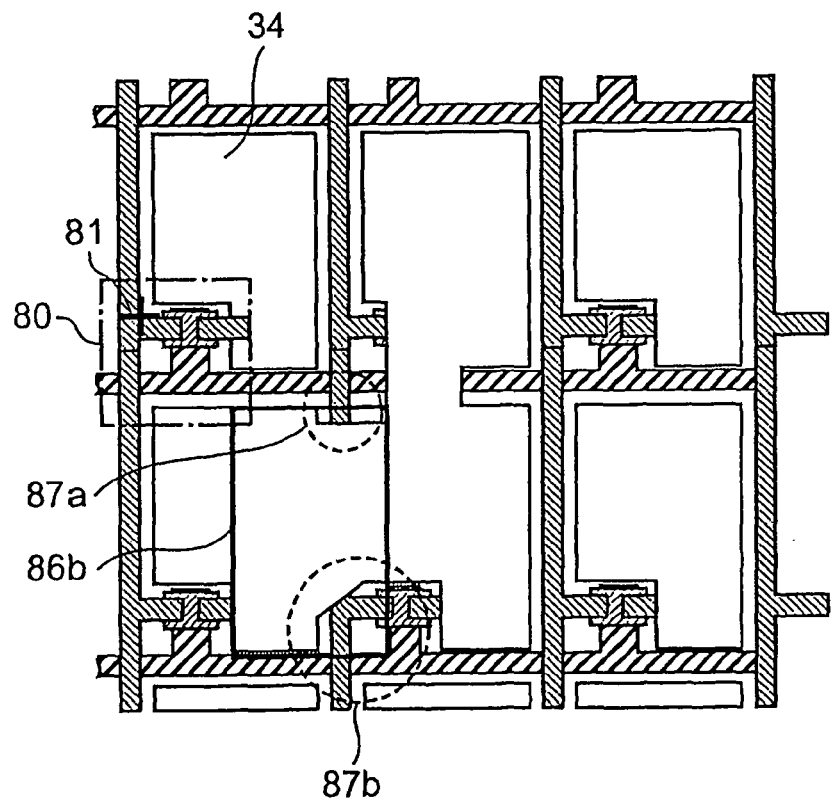
FIG. 16 is an illustration showing a mask alignment in the course of repairing the wiring which includes the defect as shown in FIG. 11A and FIG. 11B.

FIG. 16 is an illustration showing a mask alignment in the course of repairing the wiring which includes the defect as shown in FIG. 11A and FIG. 11B. As shown in FIG. 14A, this defect 21 is removed through 4 times laser irradiations. FIG. 16 is an illustration showing that the laser irradiating region 86a of FIG. 14A has already been irradiated with a laser beam. Next, according to the step movement, the laser irradiating region 86b is irradiated. If the precision in this motion is not sufficient, the laser irradiating region 86b is subjected to a precise alignment, by use of the patterns of the wiring portion 87a formed by repairing and the normal portion 87b.

According to the method as described above, the alignment will not be displaced even after several times of step movement. Even when the defect is larger than the laser irradiating region, a precise alignment is possible by accumulating the repaired patterns.

Figure 17A:
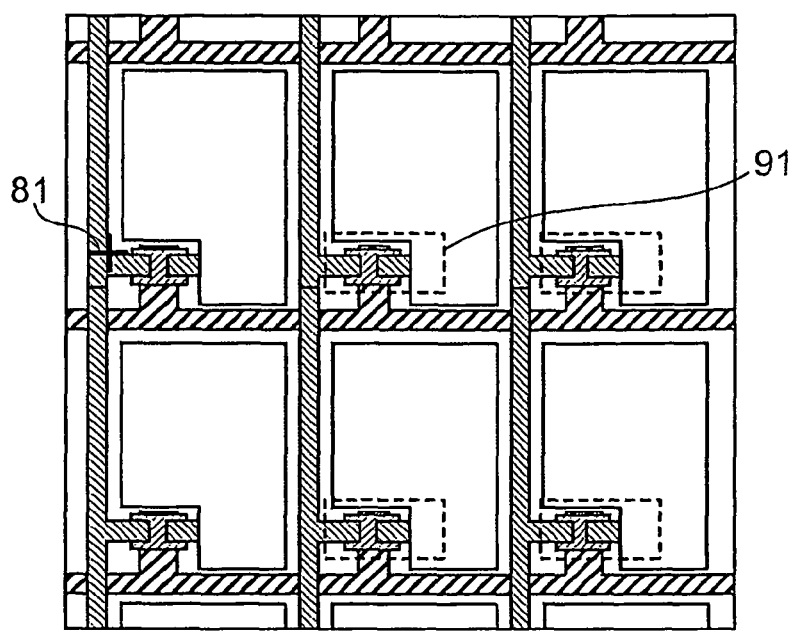
FIG. 17A and FIG. 17B are illustrations to explain another method for setting the laser irradiating region.
Figure 17B:
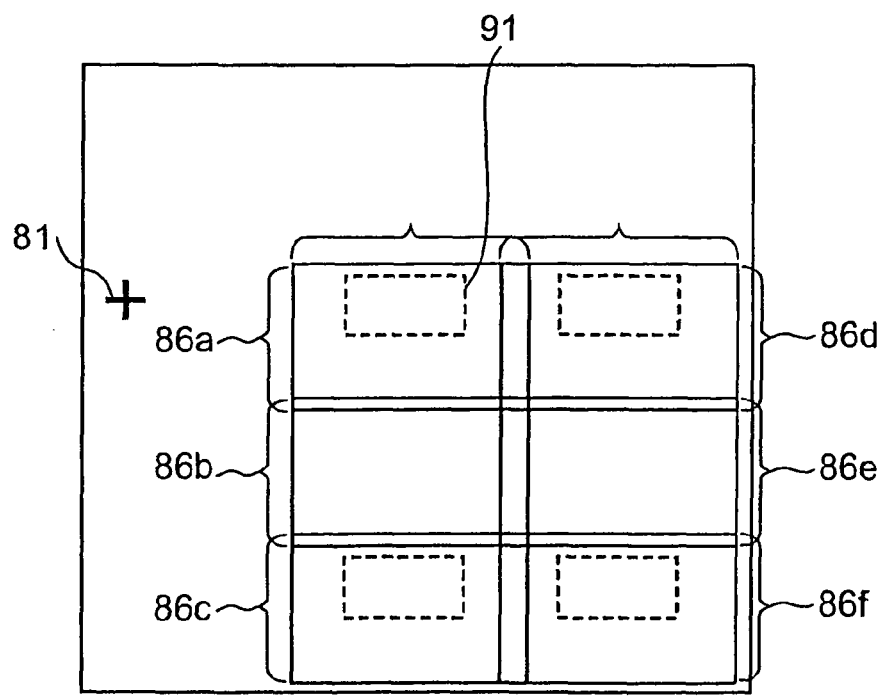

FIG. 17A and FIG. 17B are illustrations to explain another method for setting the laser irradiating region. In this setting method, the laser irradiating region 86 for the pattern reference point 81 is preset, and a region for laser irradiation is selected in comparison to the image of defect as shown in FIG. 11B. According to this method, it is possible to set the laser irradiating region in advance. Therefore, for example, as shown in FIG. 17B, the TFT portion 91 is set so that is holds the central place in the laser irradiating region 86a, whereby the TFT portion 91 having a complicated pattern shape as shown in FIG. 17A can be processed with a high precision, and further, the overlapping part of the laser irradiating regions can be placed at a location where an impact by the laser irradiation is small.

Figure 18:
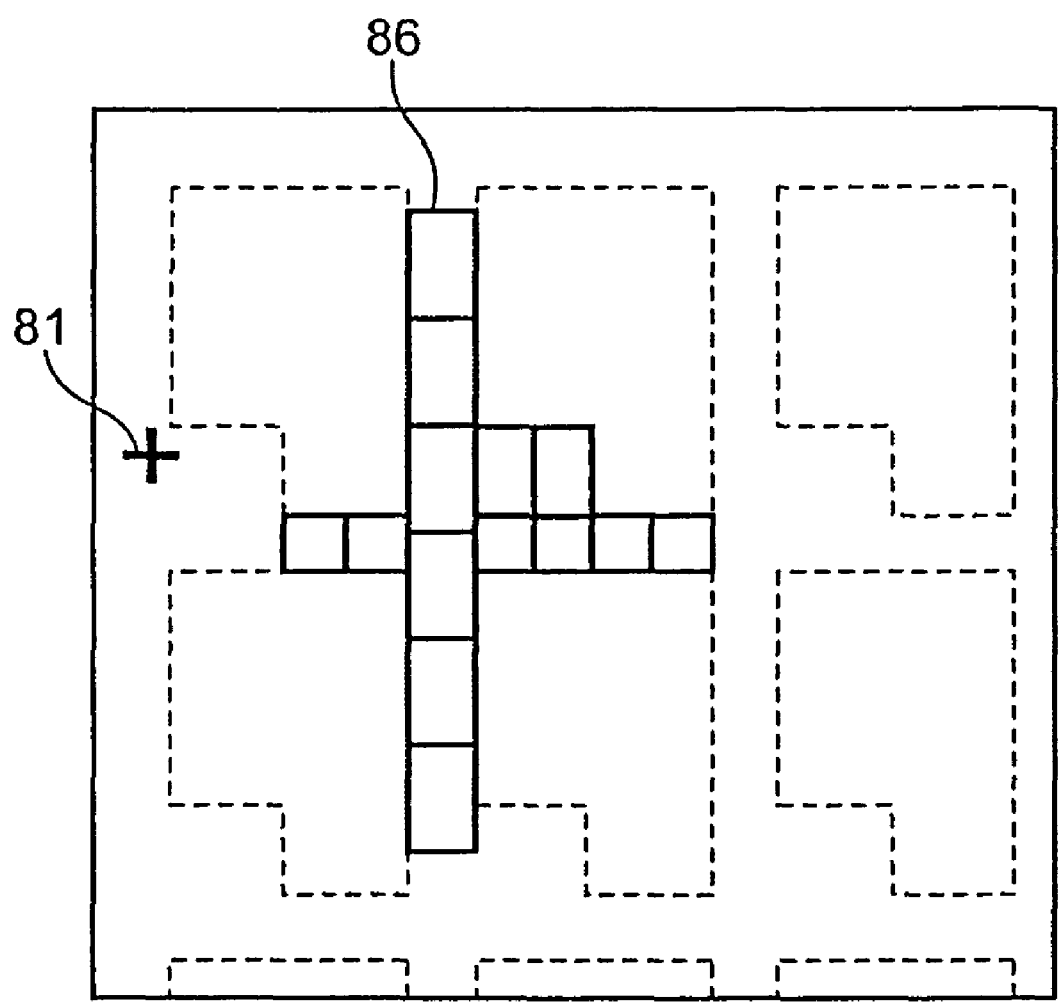
FIG. 18 is an illustration to explain further alternative method for setting the laser irradiating region.

FIG. 18 is an illustration to explain further alternative method for setting the laser irradiating region. The laser irradiating region 86 previously provided may have a shape as shown in FIG. 18. FIG. 18 shows an example where the laser irradiating region is set only on a place with a possibility of defect occurrence. This method for designating a region is advantageous when there is a part to which laser irradiation is not permitted. Also in this example, a region for laser irradiation is selected in comparison to the image of defect as shown in FIG. 11B.

Figure 19A:
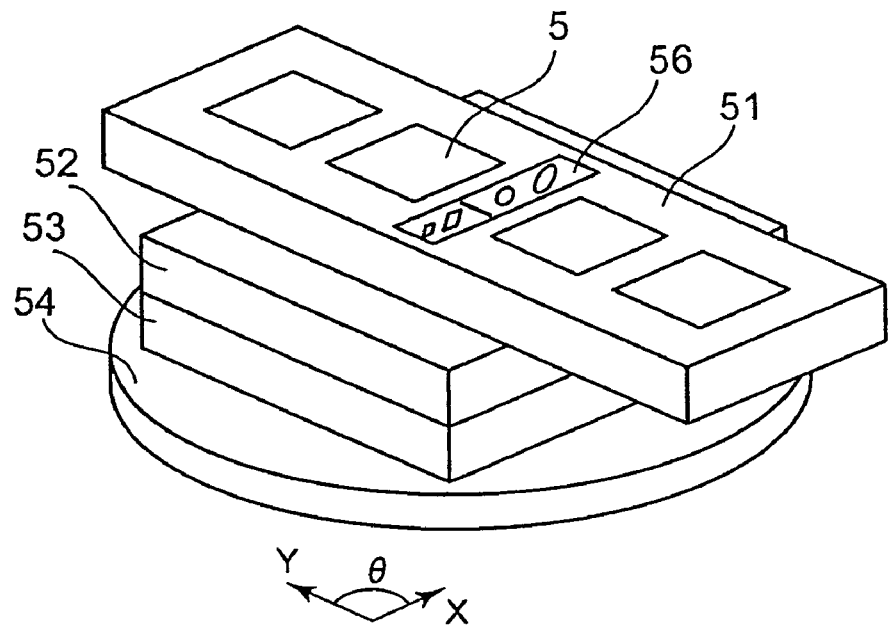
FIG. 19A and FIG. 19B are illustrations showing configuration examples of the mask holder.
Figure 19B:
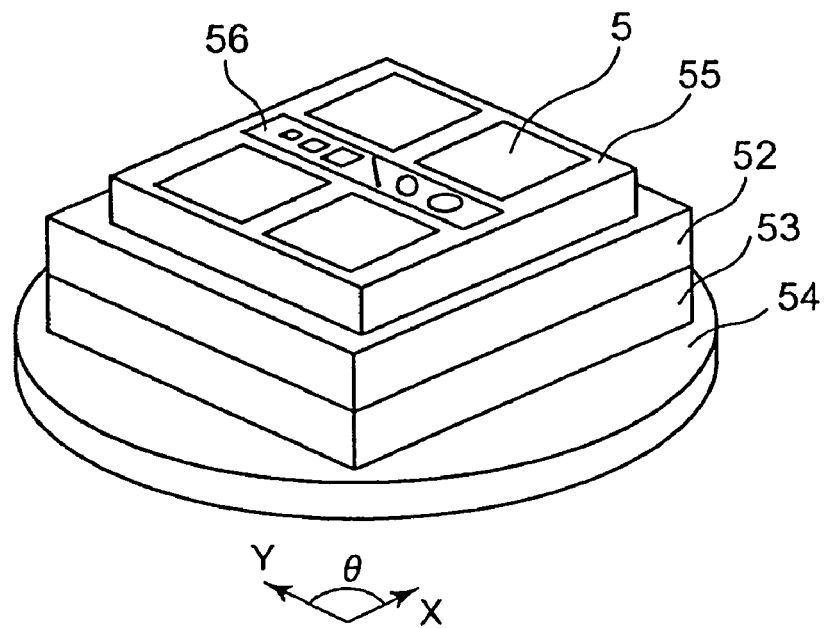

FIG. 19A and FIG. 19B are illustrations showing configuration examples of the mask holder. As described above, TFT substrate of liquid crystal display is formed by superimposing several layers of thin films on one another. Therefore, there are several kinds of repair patterns. If it is configured such that one apparatus is capable of repairing only one pattern, an extra work is required to change a mask for every occasion, such as a change of layer to be repaired and a change of product category, resulting in deterioration of efficiency.

Considering the situation above, it is preferable to use the mask stage having a structure as shown in FIG. 19A. Several kinds of masks 5 are mounted on the mask holder 51 that is installed on the X-stage 52. The mask holder 51 has a structure which is capable of moving relatively with respect to the X-stage 52, and the mask to be used can be switched depending on the repair target.

The X-stage 52 and the Y-stage 53 are utilized for the alignment with the wiring pattern. θ-stage 54 is used to correctly tilt the mask 5 and the wiring pattern. For this correction, adjustment values obtained when the mask 5 was set are stored and when the mask is changed, correction is made by rotation with thus stored values. Slit plate 56 is provided with holes each having a simple shape such as rectangular, circular, and slash, and those holes can be used in applications such as fine adjustment of the pattern shape repaired with the mask and removal of particle by irradiating laser in concentrated manner.

FIG. 19B shows another example of the mask stage. The mask holder 51 is fixed on the X-stage 52, and the mask is switched by moving the X-stage 52 and the Y-stage 53.

In the meantime, in FIG. 4, it is possible to employ a liquid crystal display instead of the mask 5, and form a pattern required on the liquid crystal display. Since an arbitrary pattern can be formed by use of the liquid crystal display, the mask switching as described above is not necessary. Under this circumstance, in order to reduce damage by the laser against the liquid crystal display, reduction ratio of the pattern may be increased. For instance, when the pattern reduction ratio is set to 1/100, energy density on the liquid crystal display located at the mask position becomes 1/10,000, thereby reducing the damage.

Figure 20:
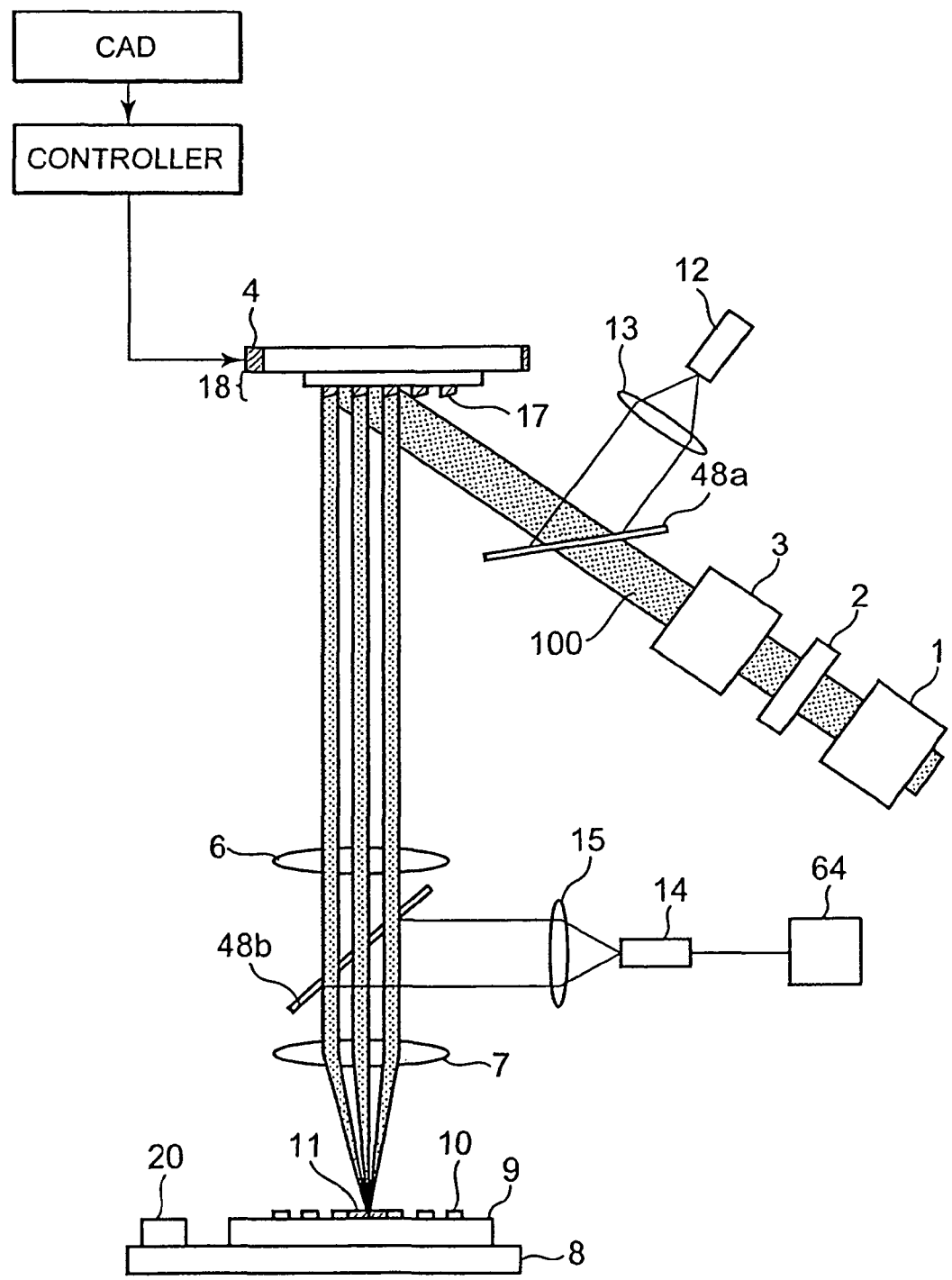
FIG. 20 is an illustration showing a configuration of the laser irradiation optical system which implements further alternative method to register a relative positional relationship between a reference point of the wiring pattern and a reference point of the mask image.

FIG. 20 is an illustration showing another laser irradiation optical system configuration to set a laser irradiating region having the same shape as the wiring pattern. The same reference numeral as shown in FIG. 4 and FIG. 10 represent the same functional parts and the operations thereof shall not be tediously explained. In FIG. 20, mirror 18 is made by depositing a material such as aluminum having a high reflection coefficient against a laser beam, on a transparent substrate made of quartz glass and the like. A pattern is formed on the reflection part made of aluminum and the like, so as to become a laser irradiating region as shown in FIG. 3, when irradiated with the laser irradiation, similar to the case where the mask 5 is used.

Reflection planes 17 of the mirror are formed at angles with the mirror 18, so that the substrate is irradiated perpendicularly with the laser beam that is incoming at a slant. It is to be noted that instead of the mirror 18, DMD (Digital Micro mirror Device) may be used, and the DMD is controlled so as to obtain a pattern shape generated by CAD data, thereby irradiating a laser having an arbitrary shape of irradiating region.

Figure 21:
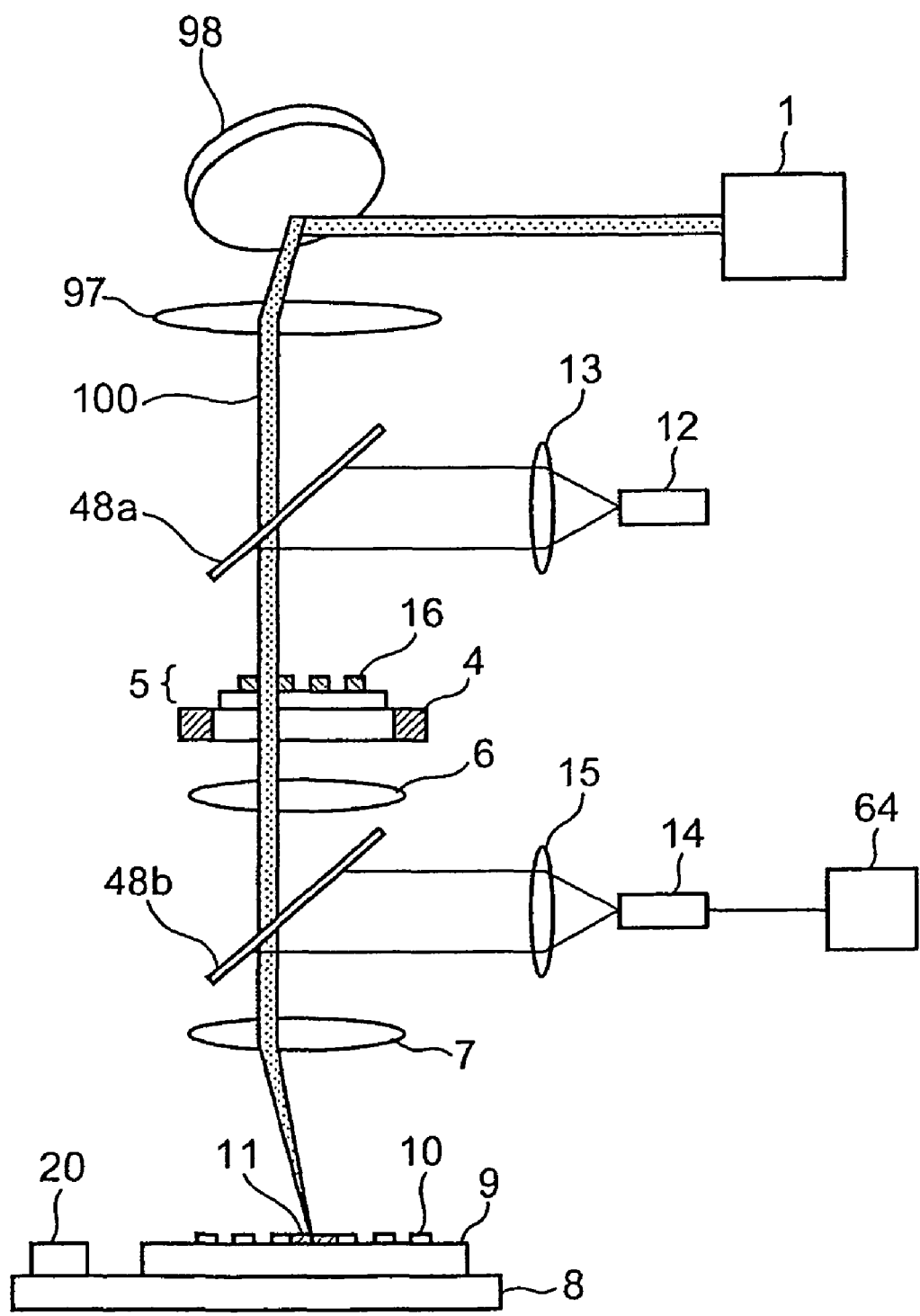
FIG. 21 is an illustration showing another configuration example of the pattern repairing apparatus according to the present invention.

FIG. 21 is an illustration showing another configuration example of the pattern repairing apparatus according to the present invention. The same reference numeral as shown in FIG. 4, FIG. 10 and FIG. 20 represent the same functional parts and the operations thereof shall not be tediously explained. In FIG. 21, a galvanometer mirror 98 reflects a spot-like laser beam outputted from the laser oscillator 1, and the laser beam is allowed to income perpendicularly to the mask plane via Fθ lens 97. By changing the angle of the galvanometer mirror 98, the entire plane of the mask 5 is irradiated with the laser beam. Since the spot-like beam is scanned in this method, the laser can be irradiated with uniform intensity in the entire plane of the mask 5.

Figure 22A:
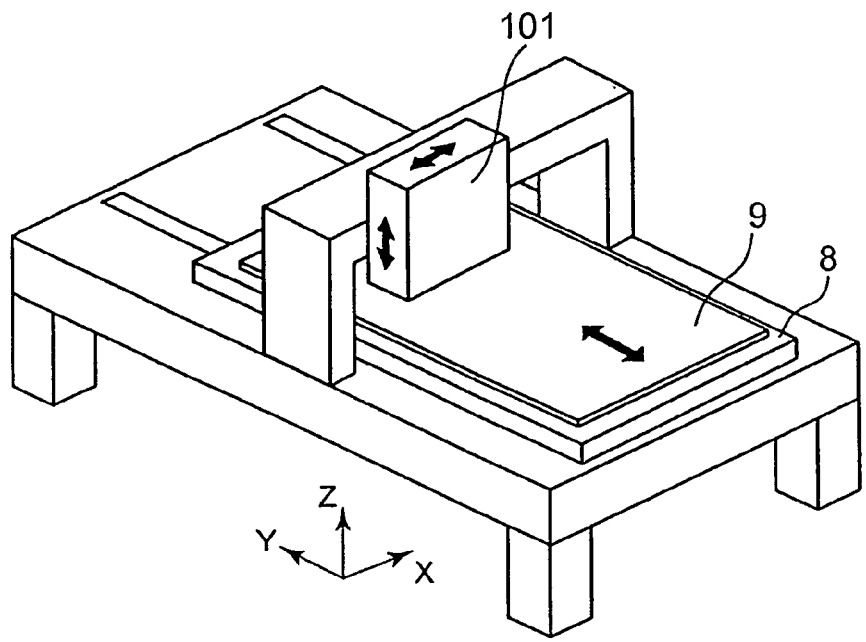
FIG. 22A and FIG. 22B are illustrations showing one example of overall structure of the pattern repairing apparatus according to the present invention.
Figure 22B:
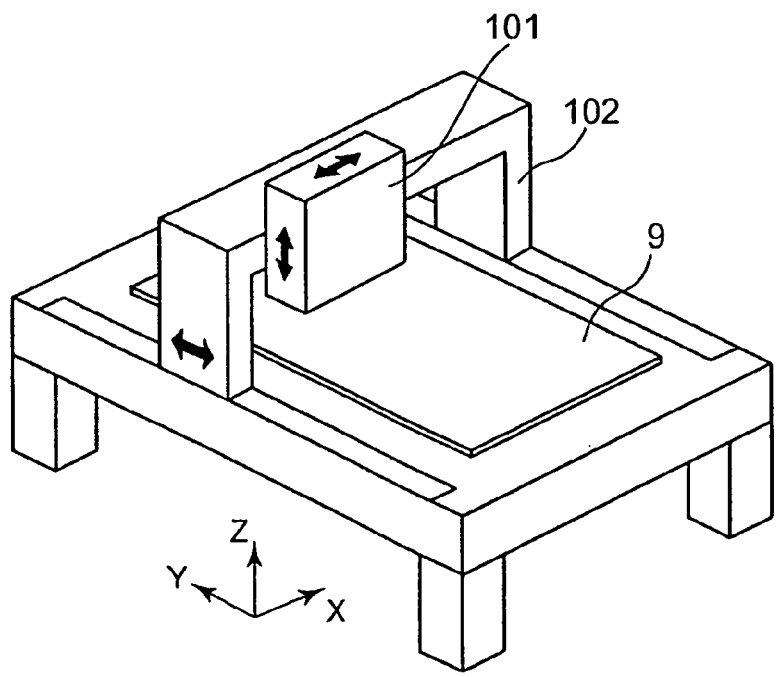

FIG. 22A and FIG. 22B are illustrations showing examples of overall structure of the pattern repairing apparatus according to the present invention. In FIG. 22A, a substrate 9 is installed on the substrate stage 8, and the substrate stage 8 is provided with a drive shaft which moves in Y-direction. The optical unit 101 is a unit on which the optical system as shown in FIG. 4, FIG. 10, FIG. 20, and FIG. 21 is installed, and is provided with a drive shaft which moves in X-direction and Z-direction. Positioning of the laser irradiating point is performed by Y-axis movement of the substrate stage 8 and X-axis movement of the optical unit 101, and focusing is performed on Z-axis of the optical unit 101. Though the configuration above has a disadvantage such as enlarging the footprint, a highly precise positioning is possible since two axes can be independently controlled.

FIG. 22B shows another configuration example of the apparatus, and in here, the optical unit 101 is installed on optical unit stage 102. The optical unit stage 102 has a drive shaft which moves in Y-direction, and the optical unit 101 has a drive shaft which moves in X-direction and Z-direction. This configuration brings an advantage that the footprint of the apparatus can be made smaller.

Figure 23A:
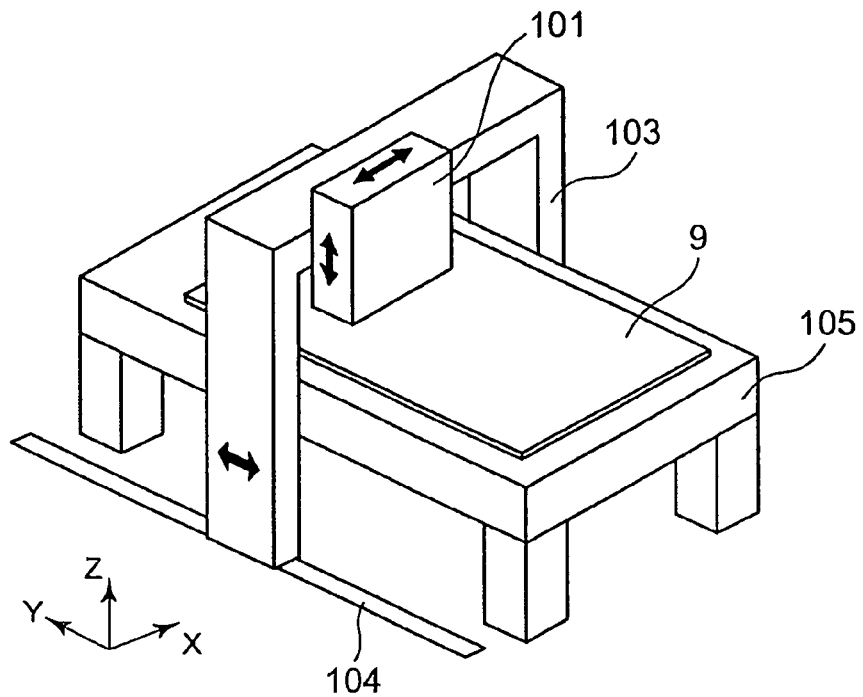
FIG. 23A and FIG. 23B are illustrations showing another example of overall structure of the pattern repairing apparatus according to the present invention.
Figure 23B:
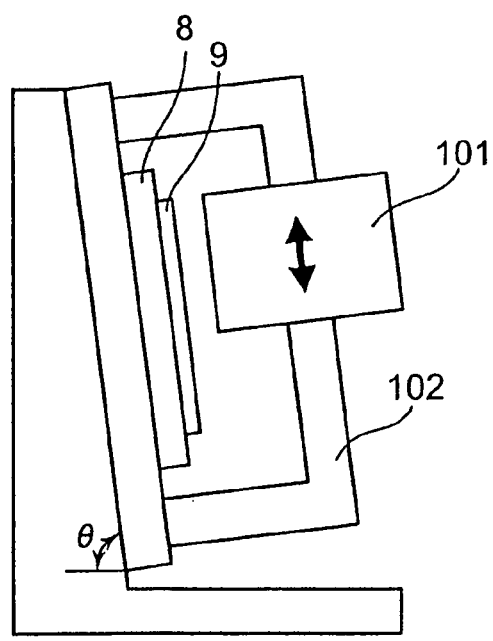

FIG. 23A and FIG. 23B are illustrations showing another examples of overall structure of the pattern repairing apparatus according to the present invention. In FIG. 23A, the optical unit stage 103 is installed on a rail 104 installed on the floor. Generally, since the substrate 9 is installed on a shock-absorbing desk 105, it is configured such that a vibration occurring when the optical unit 101 moves is not transmitted to the glass substrate, and further the shock absorbing desk 105 can be made in smaller size. In this configuration, similar to the case of FIG. 22A, the substrate stage 8 may be moved and the optical unit stage 102 is fixed.

FIG. 23B shows a structure in which the substrate stage 8 is tilted and the glass substrate 9 is moved, while being attached to the substrate stage 8. As for loading and unloading of the glass substrate, there is a method to place the substrate 9 horizontally, or a method to use a conveyor which is capable of holding the glass substrate 9 upright. In order to reduce the floor area for installing the apparatus, that is, a footprint, the range of the angle θ between the substrate stage 8 and the horizontal plane is not restricted. However, if this angle is arranged from 80° to 95°, it is possible to prevent re-adhesion of chips generated in laser processing or lens contamination.

Figure 24A:
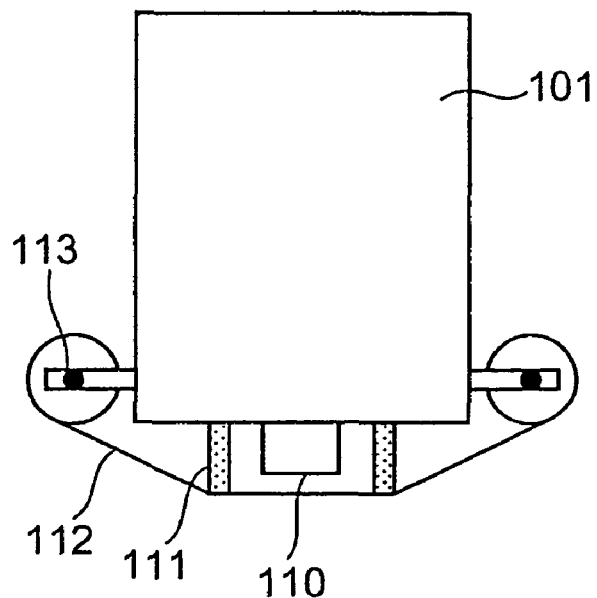
FIG. 24A and FIG. 24B are illustrations showing attached equipment to the optical unit.
Figure 24B:
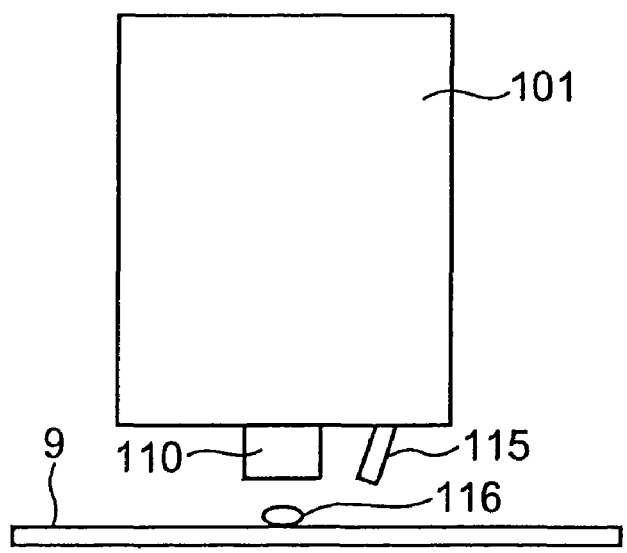

FIG. 24A and FIG. 24B are illustrations showing attached equipment to the optical unit 101. FIG. 24A shows an example of lens protective cover. In order to prevent chips or fume generated in laser processing from adhering onto the surface of the lens 110, the lens protective cover as shown is mounted on the front of the lens. If the lens protective cover is used in fixed manner, the cover itself is contaminated. Therefore, a film-like lens protective cover 112 is mounted on the roll 113, being wound thereon, and it is wound up at the end of the laser irradiation, and a newly appearing part of film can be used at the next time of laser irradiation.

For facilitating the change of the lens 110, a lens cover guide 111 is installed, so that a space is provided between the lens protective cover 112 and the lens 110. If a processing target is a product causing a little shattering and the like, it is sufficient to change the cover periodically. Therefore, a cap-like cover may be installed which is attachable to the lens front surface. In addition, there are also a method to install a duct to absorb the fume in the vicinity of the lens, and a method to prevent adhesion of contamination by spraying nitrogen or air onto the lens front surface.

FIG. 24B shows an example of particle removing nozzle. Particle is a kind of defect which is detected in the pattern inspection, but there is particle 116 which is only adhered to the surface of the glass substrate 9. Such particle can be easily removed by spraying nitrogen or air from the particle removing nozzle 115.

Figure 25:
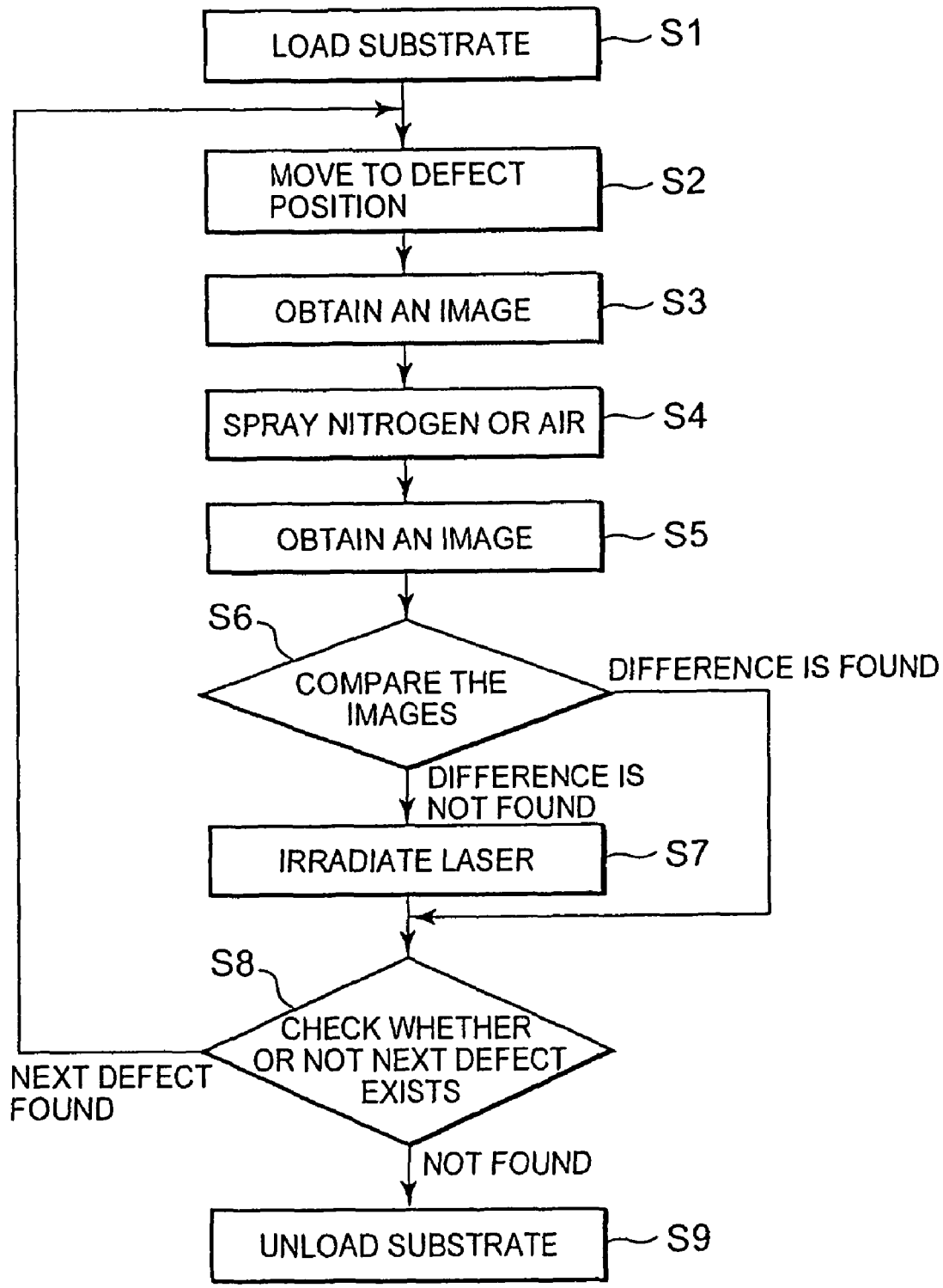
FIG. 25 is a diagram showing repairing flow when particle removal is carried out.

FIG. 25 is a diagram showing repairing flow when particle removal is carried out. Firstly, the glass substrate is loaded onto the repairing apparatus (step 1, hereinafter denoted as "S1"), then it is moved to the defect position (S2), and then obtains an image (S3). After the particle is removed by spraying nitrogen or air (S4), an image is obtained again (S5). Comparing the images before and after spraying nitrogen or air (S6), if there is a difference between the images it is determined that the particle has been removed and the laser is not irradiated. On the other hand, if there is no difference therebetween, it is determined that the particle is firmly fixed on the substrate, and a laser is irradiated (S7). Subsequently, it is checked whether or not the next defect exists (S8), and if there is a defect, the above steps are repeated. On the other hand, when there remains no defect, the glass substrate is unloaded (S9).

It is possible to determine whether the defect is to be repaired or not, by use of the image in proximity to the defect as shown in FIG. 11. As shown in FIG. 12, since it is possible to detect the pattern reference points 81a to 81e, it is easily discriminate between a defect requiring the repair and a defect not requiring the repair, based on the relative positional relationship with the reference point. As for the portion not requiring the repair, the laser irradiation is not necessary. According to the present embodiment, even when a short-circuit defect exists across several pixels, a batch repair is possible, thereby achieving cost reduction and enhancement in repair precision.

EXAMPLE 2

Figure 26:
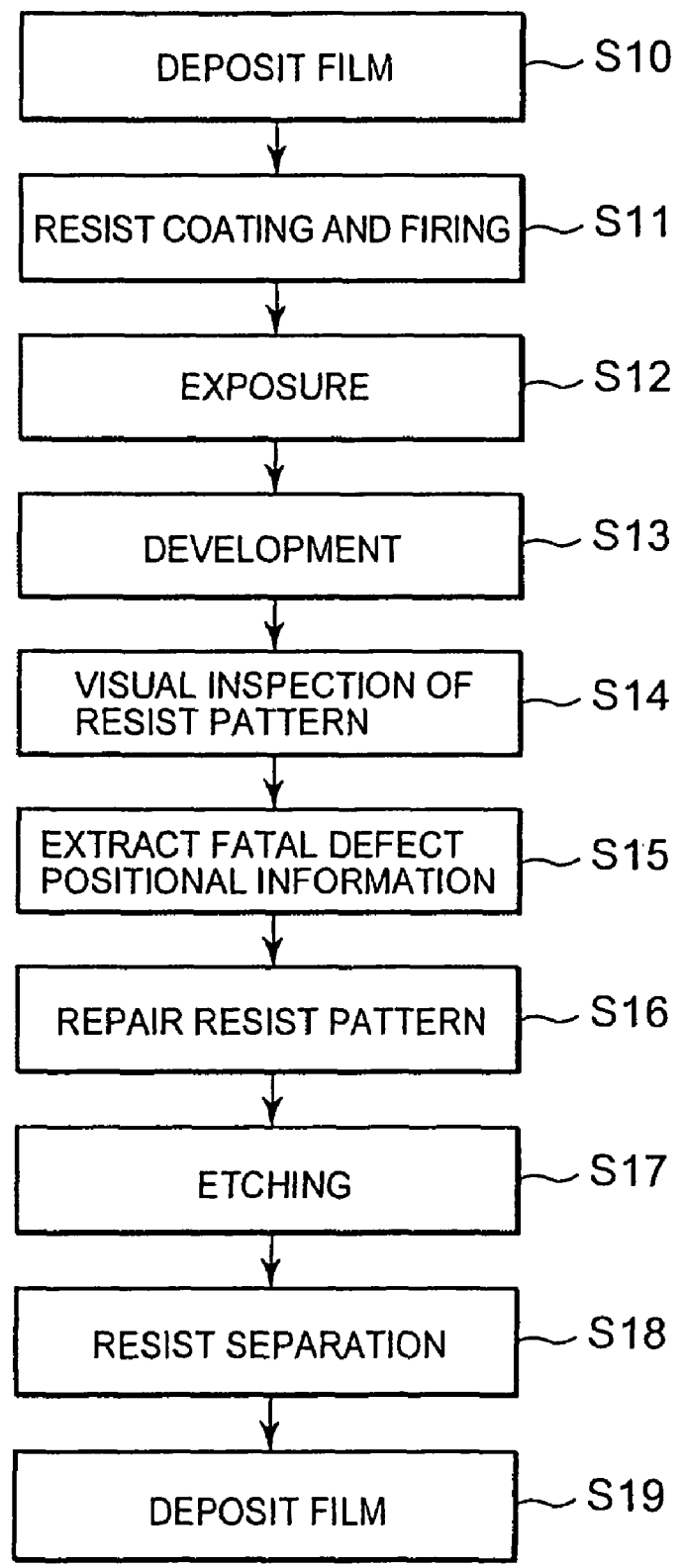
FIG. 26 is a process diagram to explain Example 2 of the present invention.

FIG. 26 is a process diagram to explain Example 2 of the present invention. FIG. 26 shows a process for manufacturing a glass substrate on which a thin film transistor is formed, being a switching element to be used in liquid crystal panel in Example 2. The glass substrate on which the switching element is formed is commonly called as "TFT substrate" or "array substrate", and hereinafter it is referred to as "TFT substrate". In Example 2, firstly, an inorganic or organic film is deposited on the glass substrate which is used for manufacturing the TFT substrate (S10).

As the inorganic substance, a metallic material constituting wiring of the TFT substrate is typical. The glass substrate, on which the film deposition has been completed, is subjected to resist coating and firing (S11).

Here, the "resist" indicates a photosensitive material, and it is used to process the film-deposited material into a predetermined shape. Next, the resist is subjected to exposure (S12), thereby allowing the resist to be exposed with a wiring pattern constituting the TFT substrate. Next, by developing the resist (S13), a resist pattern which is identical to the wiring pattern constituting the TFT substrate remains on the film-deposited glass substrate.

Subsequently, a visual inspection of the resist pattern formed on the glass substrate is carried out (S14). In the visual inspection, there appears a clear contrast between the deposited material formed on the glass substrate and the resist pattern. Therefore, it is possible to determine an abnormal part in the resist pattern, due to particle and the like as a core. Next, based on the visual inspection of the resist pattern, extraction of fatal defect positional information is carried out (S15).

In the visual inspection, a pattern defect is extracted as a fatal defect candidate, which has an abnormal shape and/or dimension beyond general management criteria. Abnormality in the resist shape is roughly categorized into a short-circuit defect which generates a continuous region from multiple parts which are supposed to be independent from one another under normal conditions, and an open-circuit defect which causes a loss in a region which is supposed to be continuous under normal conditions. In Example 2, the short-circuit defect will be particularly targeted for explanation.

According to design information of the wiring pattern constituting the liquid crystal panel, positional information of the fatal defective region is obtained, and positional information regarding a true fatal defect is extracted from the resist pattern shape, dimension and positional information obtained from the visual inspection of the resist pattern. Here, the data regarding the fatal defective resist pattern shape, dimension, and positional information is to be obtained based on the shape of the wiring pattern and electrical property, and thus it is different depending on design specifications of the TFT substrate.

Subsequently, the resist pattern repair is carried out (S16). In the resist pattern repair, by use of the fatal defective shape and dimension obtained together with the extraction of the fatal defect positional information, all the data to be processed is determined. As already explained in the other embodiment, the resist pattern repair in this case is to remove a short-circuited resist by the laser and the like. Since there is no defect on the glass substrate after the completion of the resist pattern repair, a part of the deposited material, not covered with the resist is processed by etching in the next step (S17).

Then, with a completion of resist separation (S18), the deposited material remains on the glass substrate in a proper pattern shape (Sl9). By repeating a series of those processes from the film deposition (S10) to the resist separation (S18) for a predetermined number of times, the TFT substrate is completed.

EXAMPLE 3

Figure 27:
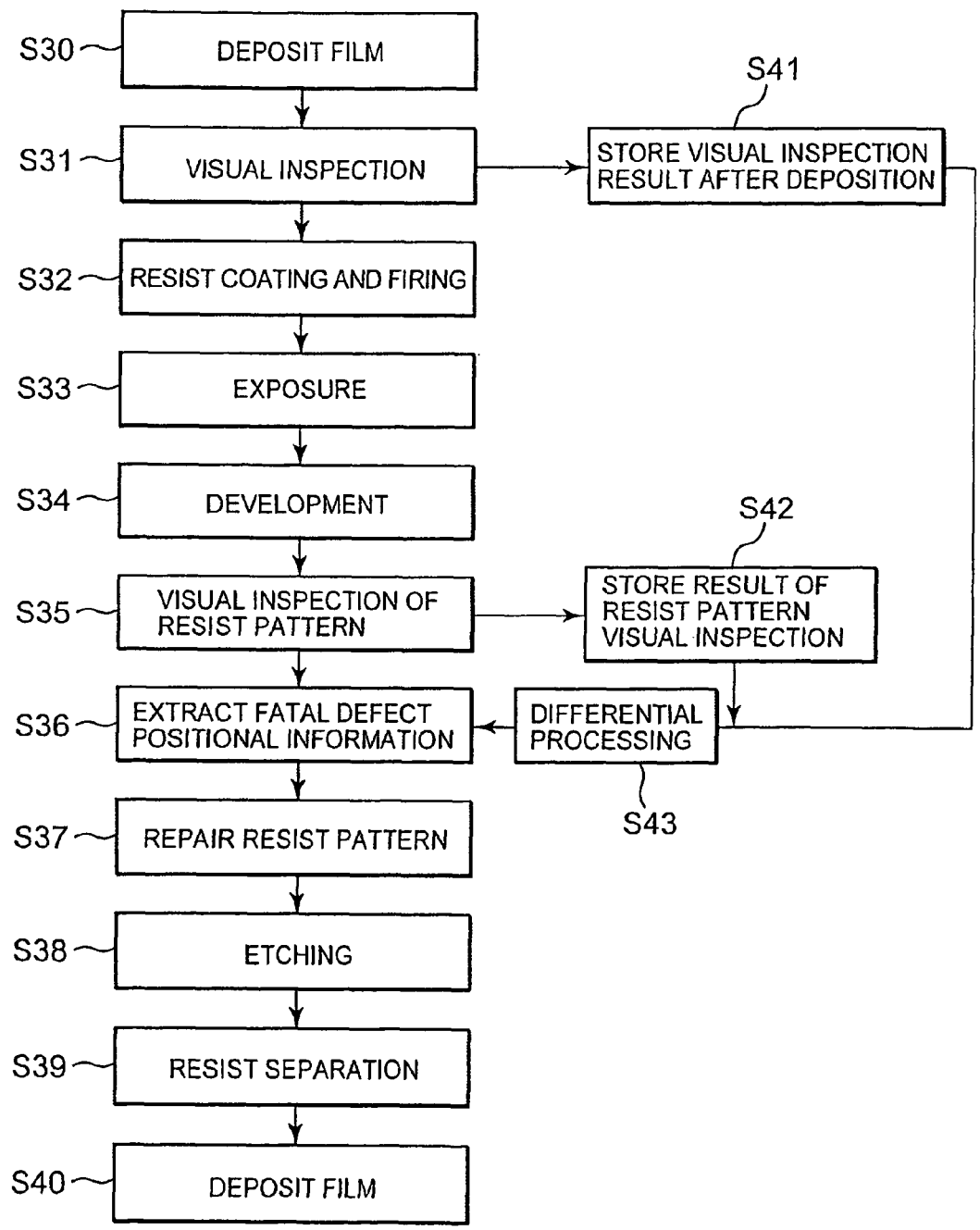
FIG. 27 is a process diagram to explain Example 3 of the present invention.

FIG. 27 is a process diagram to explain Example 3 of the present invention. FIG. 27 shows a process for manufacturing a TFT substrate to be used for a liquid crystal panel. In Example 3, firstly, the glass substrate provided for manufacturing the TFT substrate is subjected to inorganic or organic film deposition (S30). As the inorganic substance, ITO (Indium Tin Oxide) being a transparent metal provided on the TFT substrate is typical. Therefore, hereinafter, the following explanation will be made taking ITO film as a representative example.

At a stage where the film depositing is completed, a visual inspection is carried out (S31). Since the ITO is a transparent film, both particle existing on the ITO and other particle existing in the layer lower than the ITO are recognizable. Data regarding the results of the visual inspection at this film depositing completion stage is accumulated through a process of storing results of visual inspection after deposition (S41).

Next, the TFT substrate is subjected to the resist coating and firing (S32), exposing (S33), and developing (S34), and then the visual inspection of the resist pattern is carried out (S35). Data regarding the results of the resist pattern visual inspection is accumulated through a process of storing results of the resist pattern visual inspection (S42).

Here, in the results of the resist pattern visual inspection, there are observed both positional information of the resist abnormal shape on the deposited film and particle existing under the transparent film, even if it does not exist in the resist. Then, by a differential processing (S43), only the abnormal portion of the resist pattern shape, which has occurred after the resist coating and firing, is separated and extracted. Fatal defect positional information is extracted from the abnormal portion in the resist pattern shape thus extracted and the design specification of the TFT substrate (S36).

Subsequently, by carrying out the resist pattern repair (S37), etching (S37), and resist separation (S39), a deposited material remains on the glass substrate in a formal pattern. By repeating a series of those processes from the film depositing (S30) to the resist separation (S39) for a predetermined number of times, the TFT substrate is completed.

EXAMPLE 4

Figure 28:
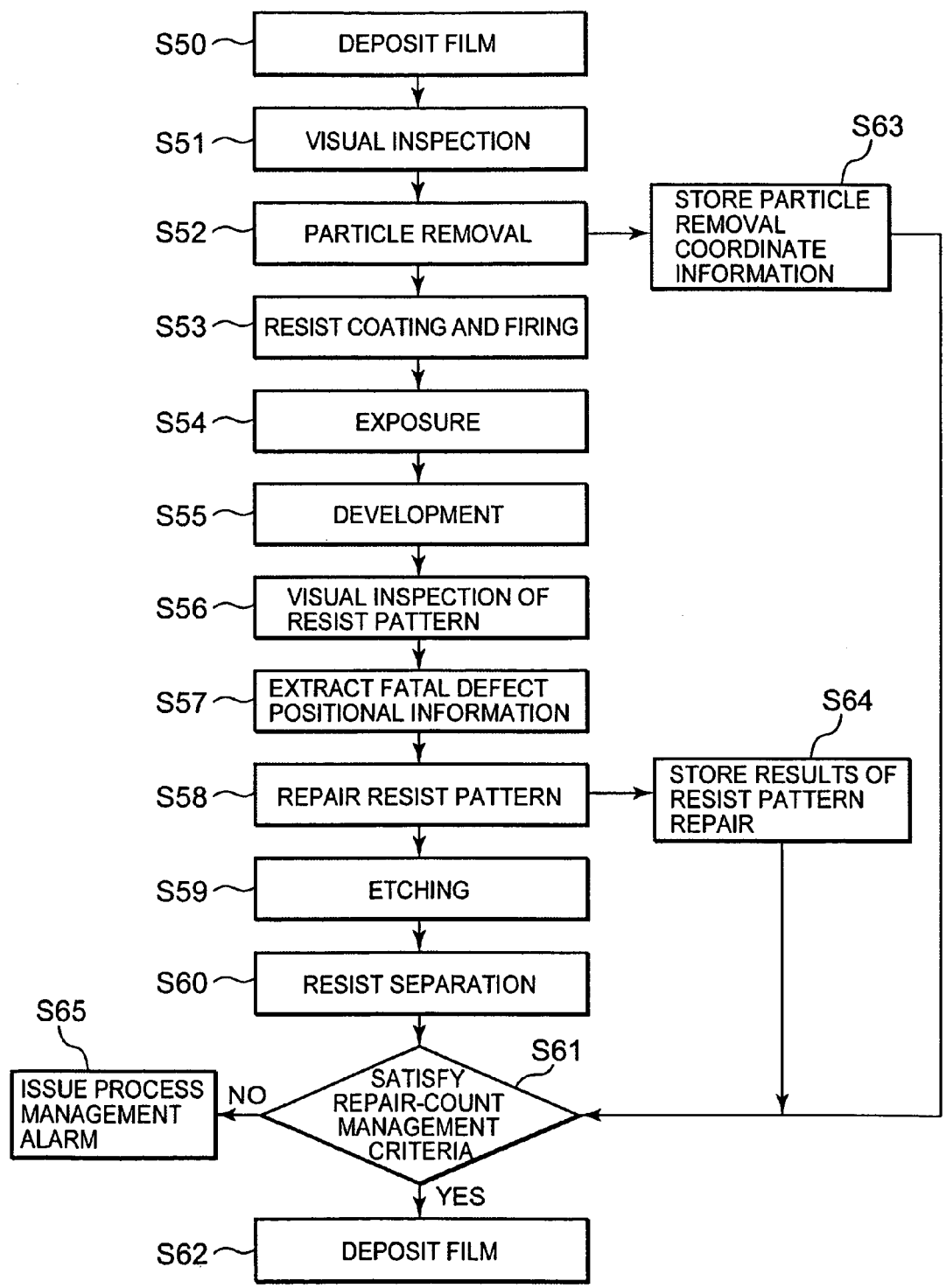
FIG. 28 is a process diagram to explain Example 4 of the present invention.

FIG. 28 is a process diagram to explain Example 4 of the present invention. In FIG. 28, firstly, inorganic or organic film deposition (S50) is carried out on the substrate that is provided for manufacturing the TFT substrate. Next, a visual inspection is carried out (S51). Here, particle existing on the deposited film and having a dimension equal to or larger than a predetermined controlled size. Subsequently, removal of the particle is carried out (S52).

For this particle removal, two kinds of removing means are applicable, that is, contact type removing means and non-contact type removing means. As one of the contact type removing means, there is a means which uses a brush being applied to the particle on the deposited film, typically, utilizing brush rotational movement or vibration from brush reciprocating motion.

It is also possible to apply another removing means which uses an instrument, typically, tweezers, and also another removing means which uses a needle-like structure or a knife-like structure. Then, at this stage, a process for storing the particle removal coordinate information is carried out (S63). On the other hand, as the non-contact type particle removing means, a laser beam and high-pressure fluid are taken as examples.

Next, after the TFT substrate is subjected to resist coating and firing (S53), exposure (S54), and development (S55), the visual inspection of the resist pattern is carried out (S56). Subsequently, after extraction of the fatal defect positional information is carried out, the resist pattern is repaired (S58), and a result of the resist pattern repair is stored (S64). Thereafter, etching (S59) and resist separation (S60) are carried out.

The next step is a judgment according to repair-count management criteria (S61). This step uses the particle removal coordinate information and the resist pattern repair result having already been accumulated after the inspection is executed. According to the particle removal coordinate information, if the particle count having been repaired does not satisfy the management criteria, it is indicated that there are large amount of particle on the deposited film. Therefore, a process management alarm is issued (S65) and checking the deposition system and developing countermeasures are promoted.

If a result of storing the resist pattern repair results (S64) does not satisfy the repair-count management criteria, it is indicated that there occurs any failure between the resist coating and firing (S53) to the development (S55). Also in this case, the process management alarm is issued similar to the above case (S65), and checking in the deposition system and developing countermeasures are promoted.

As a matter of course, if the repair count satisfies the management criteria, the TFT substrate is subjected to the next film deposition (S62), and formation of the TFT substrate is developed. Accordingly, it is possible to monitor the operations constantly, thereby not only performing a repair but also conducting equipment maintenance at a proper timing.

EXAMPLE 5

Hereinafter, Example 5 regarding wiring repair in a liquid crystal display will be explained. In Example 5, the wiring repair in the liquid crystal display will be taken as an example for explanation, similar to Example 1. However, the present example is applicable to a repair of a general pattern formed on a plane, and it is not limited to the liquid crystal display.

Figure 29:
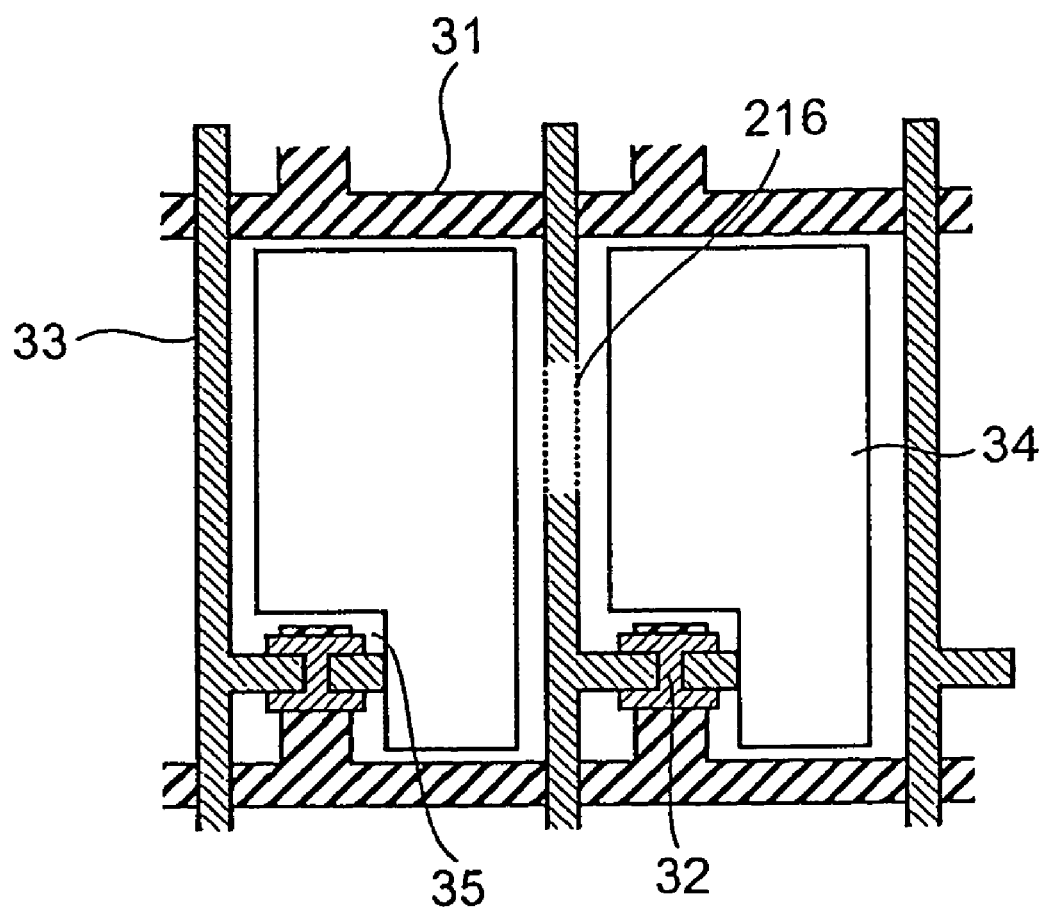
FIG. 29 is an illustration to explain how the repair is performed when there is a wire break in the wiring pattern of liquid crystal display.

FIG. 29 is an illustration to explain how to conduct a repair when there is a wire break in the wiring pattern of the liquid crystal display. In the formation process of TFT array on a TFT substrate, in particular, in forming electrode/wiring, as shown in FIG. 29, a break 216 may occur in the wiring (here, drain wiring 33), due to particle attachment and the like. Therefore, for example, after the drain wiring 33 is formed, it is checked whether or not there is a wire break on the drain wiring 33 by a visual inspection and the like. When the break is found, repair is conducted as appropriate.

Similarly, a wire break may occur also on the gate wiring 31. It is possible to conduct the repair similar to the wiring repair for the drain wiring as described below. Alternatively, since this process is an initial stage for manufacturing the TFT substrate, reproduction of the TFT substrate may be possible by separating and removing entire wiring and electrode patterns.

Figure 30:
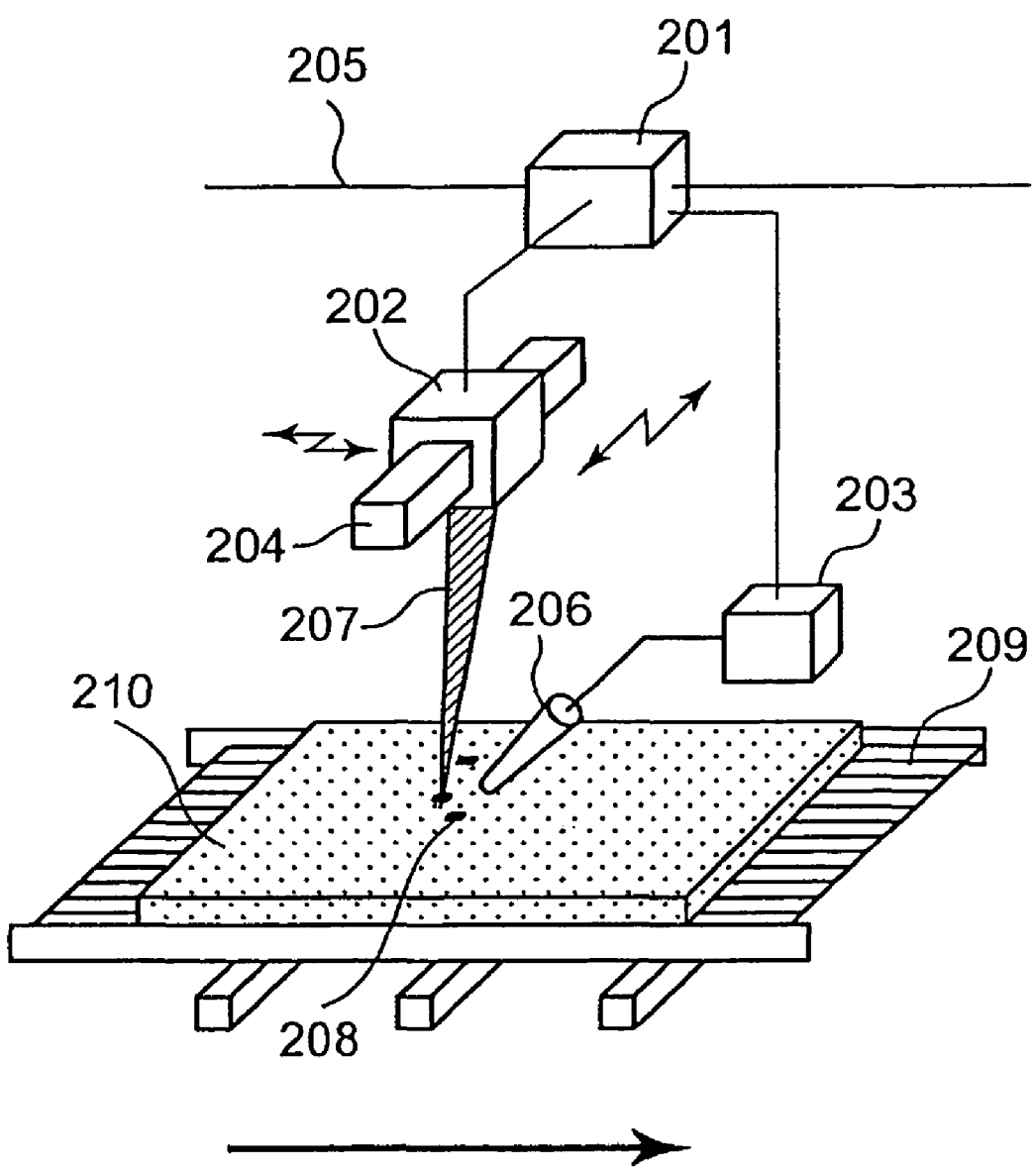
FIG. 30 is an illustration showing a configuration of a repairing apparatus which is suitable for carrying out the method for repairing a wire break defect as described in Example 5.

FIG. 30 is an illustration showing a configuration of a repairing apparatus which is suitable for carrying out the method for repairing a wire break defect as described in Example 5. The apparatus in the present example has a structure having a material coating mechanism 206 for repairing a wire break, in addition to the automatic repairing apparatus which is capable of repairing short-circuit by a laser as shown in Example 1. Here, the reference numeral 201 indicates a repair integration controller, numeral 204 indicates a laser head drive shaft, numeral 207 indicates a laser, and numeral 208 indicates a defective portion.

Figure 31:
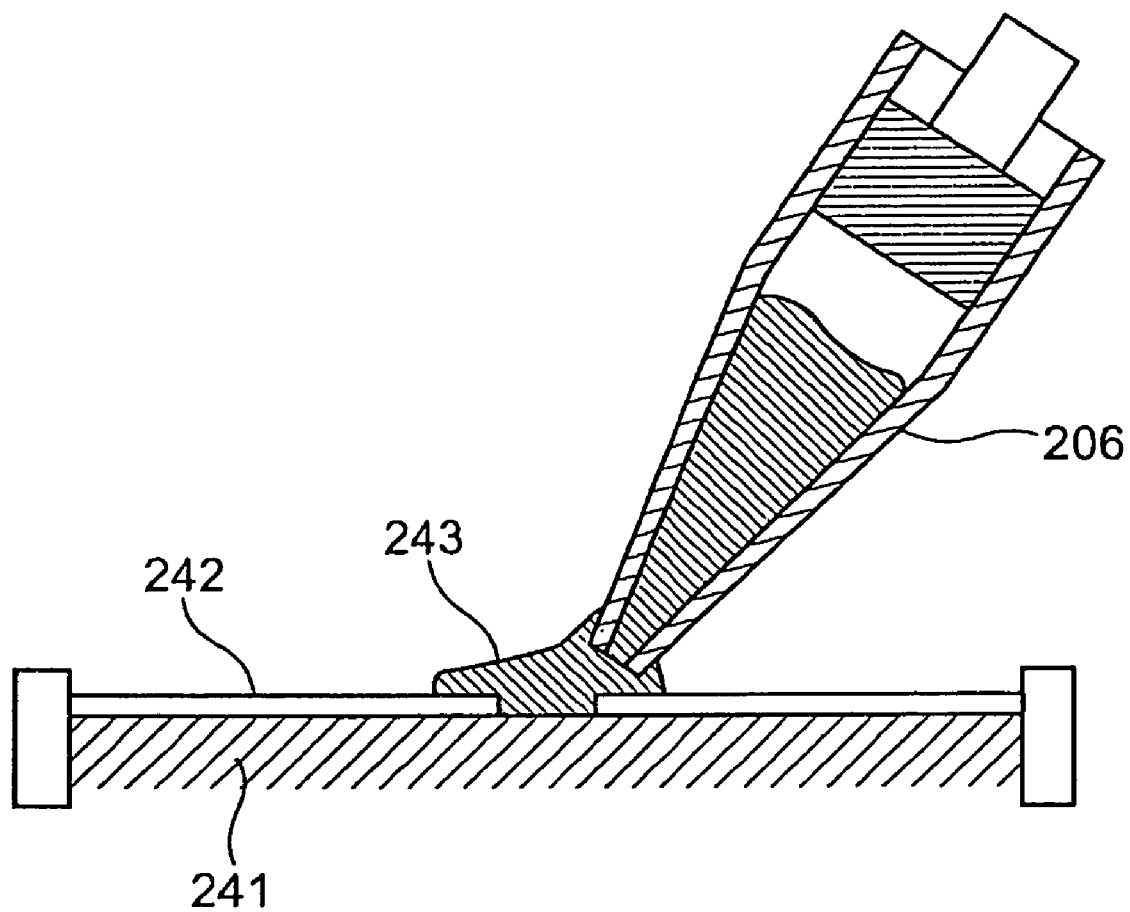
FIG. 31 is an enlarged view of a material coating mechanism to explain a coated status of a material for repairing the wire break.

FIG. 30 shows a configuration that the material coating mechanism 206 is positioned obliquely with respect to the optical axis of the optical system of pattern repairing apparatus 202, and a material for repairing the wire break is coated from this oblique direction. FIG. 31 is an enlarged view of the material coating mechanism to explain how the material for repairing the wire break is coated. According to Example 5, it is possible to check a coating position and/or a state of material coating in real time with an image observed by the optical system of pattern repairing apparatus 202, allowing the coating mechanism controller 203 to take control.

For instance, as shown in FIG. 31, when coating is performed by allowing the material coating mechanism 206 to come into contact with the electronic circuit substrate 210 (for example TFT substrate), it is necessary to detect a status where the coating mechanism 206 comes into contact with the substrate 210, so that the substrate 210 may not be damaged or the coating mechanism 206 may not be damaged, by an excessive contact with the substrate 210. By monitoring with the optical system of pattern repairing apparatus 202, the coating material can be supplied with a suitable contact status.

Hereinafter, a situation is taken as an example where a part of wiring of the TFT substrate is missing, that is, in a state of wire break, and a procedure to repair the wire break defect will be explained in detail. Here, an explanation will be made taking the case where the wire break defect 216 as shown in FIG. 29 is repaired. TFT substrate 210 from which the wire break 216 has been detected by an inspection apparatus (not illustrated) is transferred to the repairing apparatus by a carrier robot and the like (not illustrated), and is installed on the stage 209.

On the other hand, defect positional information detected by the inspection apparatus is received via the network 205 of production line, and based on this information, the stage 209 is driven to reproduce the wire break defect position 216 within a view field of the optical system of the repairing apparatus.

Thereafter, automatic focusing mechanism (not illustrated) allows the entire optical system to move into Z-direction perpendicular to the plane of the stage 209 on which the TFT substrate is installed, and focusing is obtained on the surface of the TFT substrate 210. It is also possible to allow the substrate 210 to move into Z-direction by the substrate stage 209. If the optical system 202 is moved, both the laser oscillator and the irradiation optical system are integrally shifted, thereby keeping the optical axis of the laser optical system being stabilized.

Here, according to the image taken by a CCD (charge-coupled device) camera mounted on the laser optical system, it is determined whether or not the wire break defect 216 is repairable. If it is determined that the wire break defect 216 is repairable, coating material (liquid type) 243 is coated on the source electrode 33.

If the wire break defect 216 occurs due to particle, and the particle still remains, the particle is removed by a pulse laser of the pattern repairing apparatus, and then the wire break defect 216 is repaired. In addition, as the need arises, an oxide film on the wiring which is connected via the material coating 243 is removed by laser irradiation and the like, thereby reducing resistance in connection.

The tip of the material coating mechanism 206 is placed within a storage container so that the tip may not become solidified by the coating material 243. This is to keep the tip of the material coating mechanism 243 in a stabilized status. The position of the wire break defect 216 is moved to approximately the center of the visual field of the optical system of pattern repairing apparatus 202, and the tip of the material coating mechanism 206 is also moved so that it comes to the center of the visual field. The material coating mechanism 206 is a component only which is provided with a function of moving minutely, and is capable of automatically moving to the position of the wire break defect 216 according to the image recognition.

The material coating mechanism 206 is gradually let down from this status, the tip thereof comes into contact with the surface of the drain wire 211. With further descent of the material coating mechanism 206, the tip thereof is bent by elasticity and shifted towards a distal end direction within the visual field. When this shifting is observed, it is possible to confirm that the tip of the material coating mechanism 206 has come into contact with the drain wire 211. By monitoring a constantly uniform volume of shifting, the descent amount of the material coating mechanism 206 can be stabilized.

If the shifting volume is made too large, a force is applied to the source electrode 33, and the source electrode 33 may be damaged. Therefore, this shifting volume is set to around a few micrometers, for instance. After the contact has been confirmed, the material coating mechanism 206 starts supplying the material.

Figure 32A:
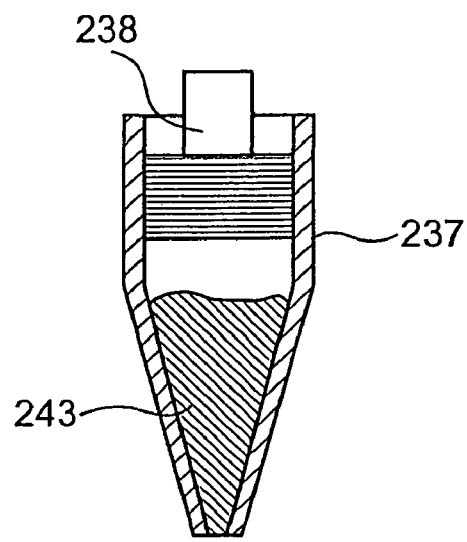
FIGS. 32A and 32B are illustrations showing the material coating mechanism.
Figure 32B:
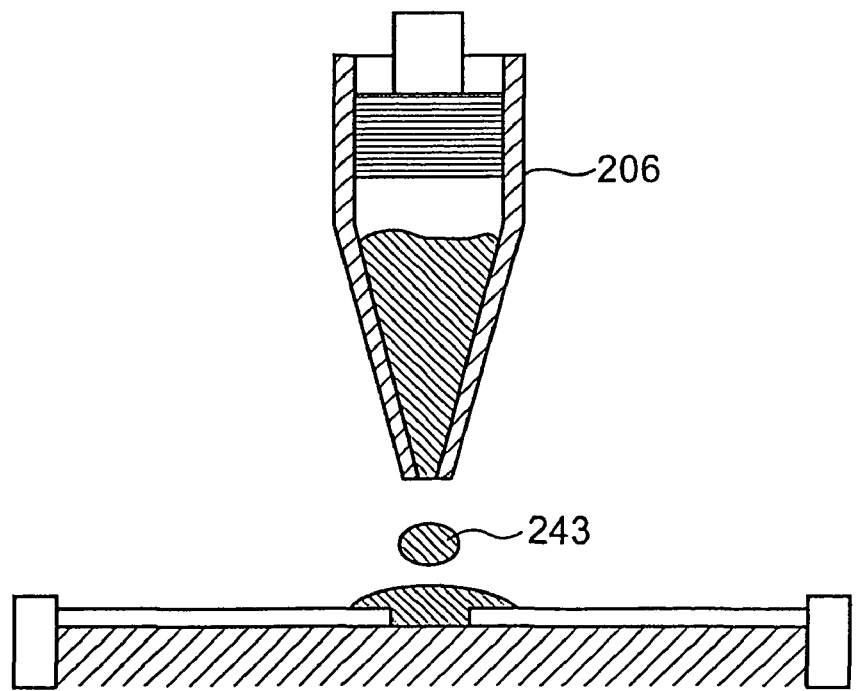
Figure 33:
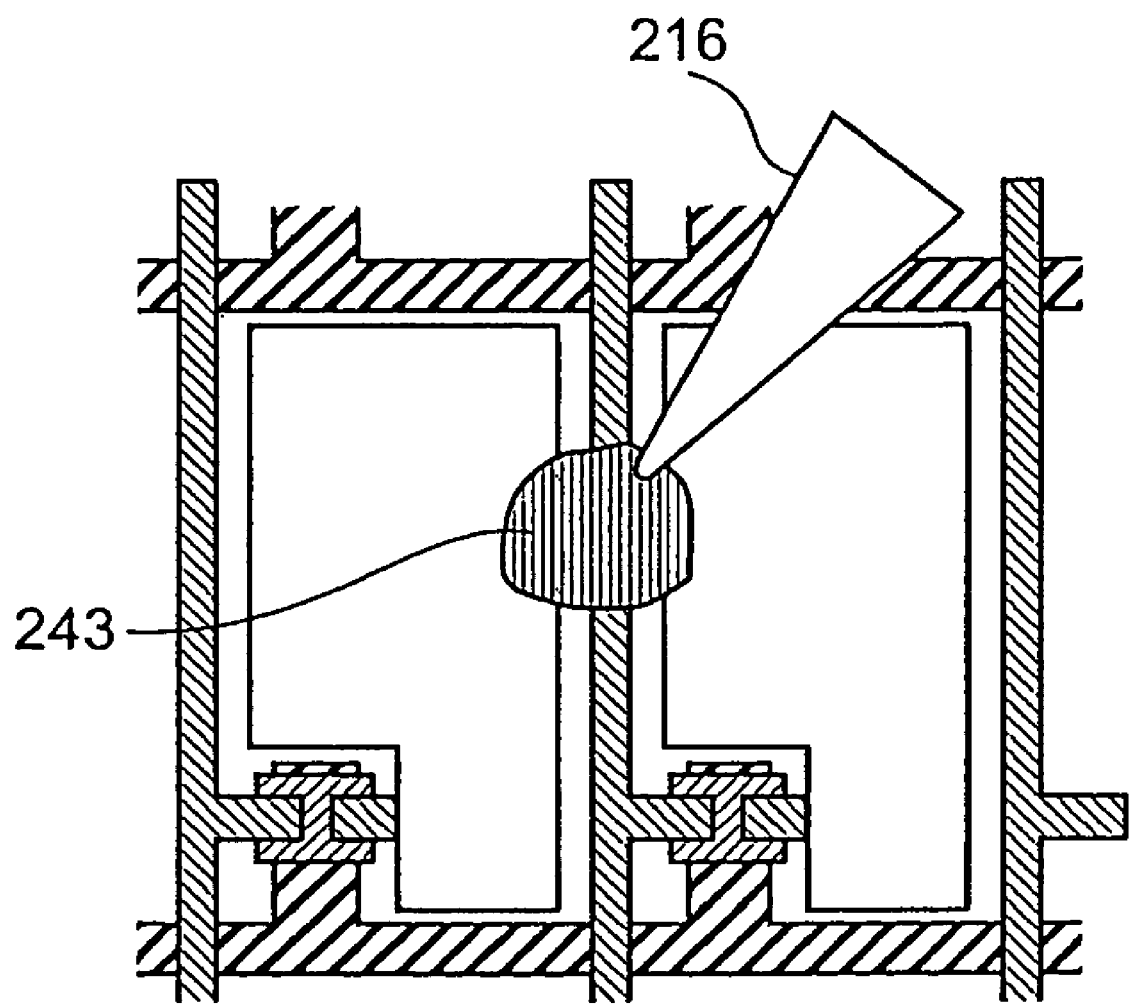
FIG. 33 is an illustration showing a status where the material coating mechanism applies the material for repairing onto the part of wire break defect as shown in FIG. 29.

FIG. 32A and FIG. 32B are illustrations showing the material coating mechanism. FIG. 33 is an illustration showing a state where the material coating mechanism applies the material for repairing onto a part of wire break defect 216 as shown in FIG. 29. The material coating mechanism 206 may be a pipette filled with metal complex as a material of metal film, for example, a glass pipette made of glass material.

As shown in FIG. 32A, the material coating mechanism 206 has a structure such that the pipette is filled with liquid coating material 243. As shown in FIG. 32B, the portion of the wire break 216 is supplied minutely with the coating material 243, by a mechanical means 238 that pushes out the material 243 within the pipette, or by a pressure of gas (inactive gas is preferable for suppressing the reaction with the material) (FIG. 33, FIG. 31). When the coating material 243 is applied, as shown in FIG. 31, the coating material 243 is supplied also on a normal part, so that the junction is fully assured, and wiring connections are fully established by reducing wiring contact resistance.

Figure 34A:
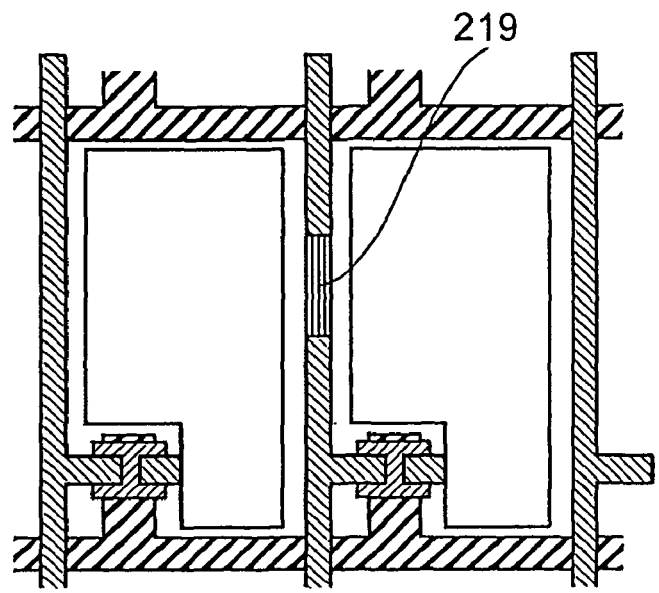
FIG. 34A and FIG. 34B are illustrations showing a method for repairing the wire break defect.
Figure 34B:
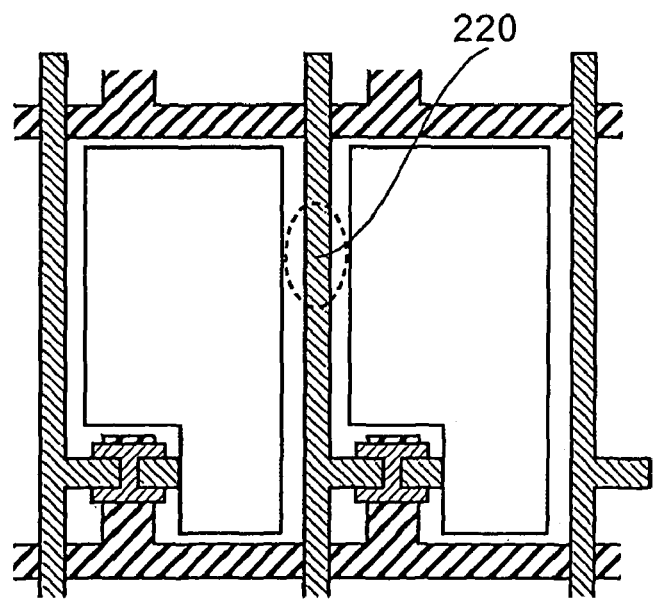

FIG. 34A and FIG. 34B are illustrations of a method for repairing the wire break defect. After the coating material 243 is supplied, as shown in FIG. 34A, the form of coating is reshaped. For this reshaping, a form reshaping process by a mask is carried out as described in Example 1. Generally, since a metal film is processed by heat processing, an intensive processing energy is required. Therefore, a foundation layer may be damaged depending on the processing conditions or a state of lamination of the TFT substrate 210. Therefore, it is desirable to conduct a pattern formation by a process according to molecular dissociation caused by optical chemical reaction while the coating material 243 is in a state of metal complex.

When volume change is large in forming the metal film by annealing (heat treatment), it is preferable to perform reshaping after a primary treatment by temporary annealing, because it makes the volume change after annealing smaller. This annealing treatment is performed by an infrared lamp, substrate heater, or laser irradiation.

It is suitable for the laser irradiation, to select a laser beam which is absorbable by the coating material 243. It is also preferable to use a laser having continuous oscillation and perform a continuous heat treatment, so that the coating material 243 is not subjected to removing process by the laser irradiation.

Furthermore, in the annealing step by the laser irradiation and the like as described above, inactive gas is supplied to the wire break repaired potion, and it is possible to achieve a highly reliable wiring connection by suppressing oxidization in annealing and change in quality of the coating material 243 prior to forming the metal film.

According to mask processing, the form is reshaped in conformity with the electronic circuit pattern (FIG. 34A). In the mask processing, as described in the embodiment of the present invention, processing with little heat affect is available, by use of a pulse laser with a pulse width of a few nanometers. Thereafter, a metal film is precipitated by annealing, the repair of the wire break is completed and repaired wiring 219 is obtained (FIG. 34B). If necessary, it is also possible to add an operation of wiring reshaping after the metal film is formed.

Repairing the wire break defect 216 in the step of the source electrode 33 of TFT substrate 210 has been described so far. According to a similar processing, it is also possible to repair a pattern loss in another TFT layer. It is also applicable to a pattern on an intermediate layer which does not remain in the TFT substrate but is necessary in the production process. For all the cases as described above, if the quality of the coating material 243 is changed by an optical chemical reaction, the coating material 243 and the material coating mechanism 206 may have a light shielding structure so as to supply a stabilized material.

Figure 35:
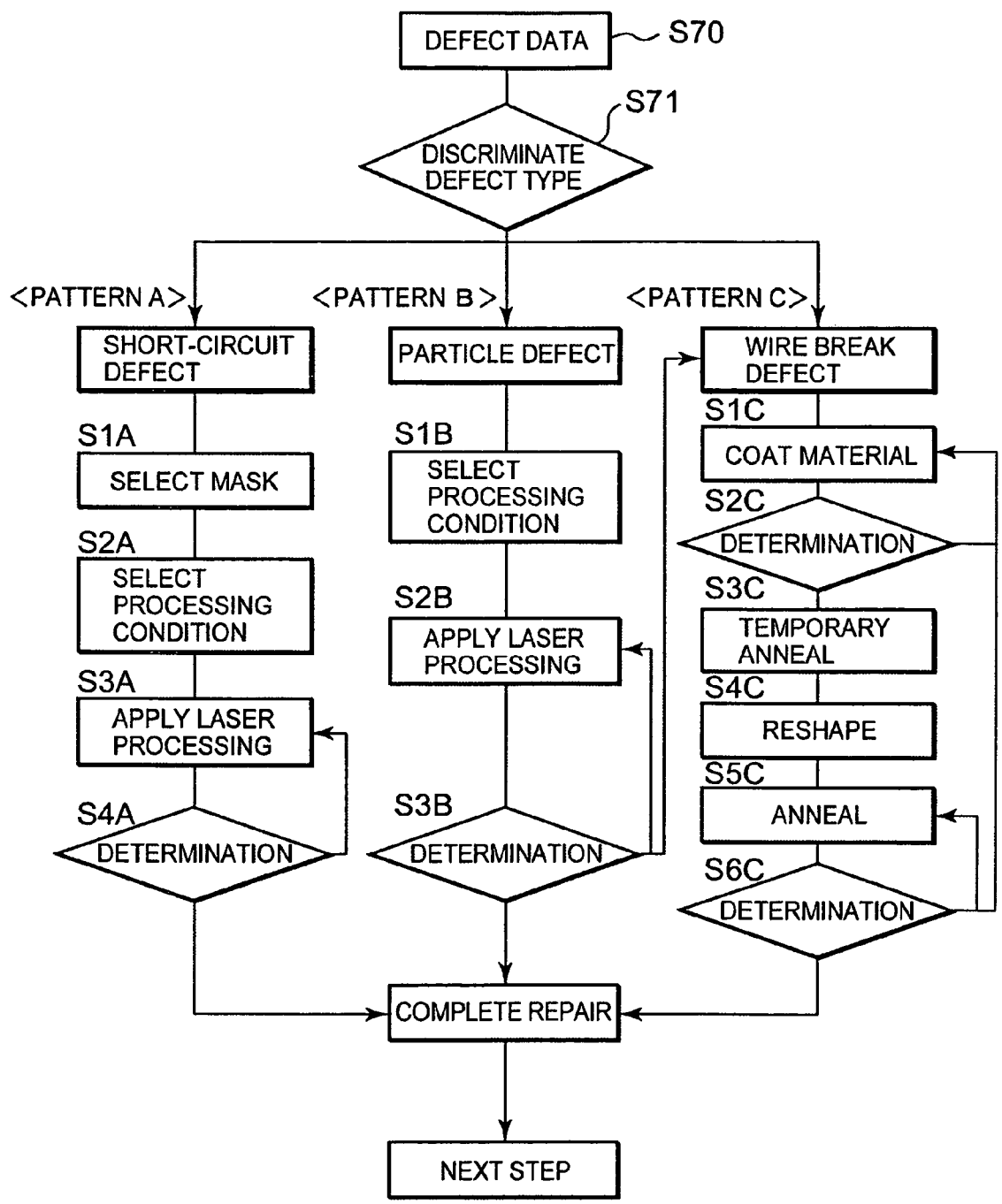
FIG. 35 is a flow diagram to explain repairing operations as described in Example 5.

FIG. 35 is a flow diagram to explain repairing operations as described in Example 5 of the present invention. With the wire break defect repairing mechanism 206 as described above, the repair system as shown in FIG. 35 has been established. Various pattern defects in an electronic circuit substrate, which are detected and categorized by a defect detecting apparatus through visual inspection and the like, are repaired according to the following procedures.

[Pattern A] Short-circuit Defect

In FIG. 35, a procedure for repairing the short-circuit defect will be explained. Firstly, a mask suitable to the pattern of the electronic circuit substrate 210 is selected (S1A). Depending on the material of the repair target layer and patterns (lamination layer structure), processing conditions such as laser energy, wavelength, and shot count are decided (S2A). If necessary, multiple conditions are applied step by step. Fitting the pattern onto the electronic circuit substrate, mask processing by a laser is performed (S3A). If one laser irradiating region is not sufficient for the area to be repaired, the repair target area is divided into multiple parts, and the repairing is performed sequentially. The status in the course of processing is monitored in real time by an image taken by the optical system of the pattern repairing apparatus 202, and it is determined whether or not the repair has been completed or re-processing is necessary (S4A).

[Pattern B] Particle Defect

If particle exists, even though the particle does not affect the repair target layer because of its existing location and size, it may affect a pattern on the lamination layer positioned next. Therefore, in the production process of the substrate 210, it is desirable to remove the particle beforehand. Similar to the case of short-circuit defect repair, the processing conditions are decided depending on the type of the particle (determined by color or shape), a location where the particle occurs, and the lamination layer structure (S1B).

Also in this case, repair with mask may be performed similar to the case of the short-circuited repair, but in order to effectively utilize the laser energy, it is advantageous to process the particle by narrowing the laser beam into a rectangular or a circular shape (S2B). The processing is monitored by an observation optical system, and it is determined whether or not the repair is completed (S3B). If there exists particle in the circuit pattern and the removing process is carried out, it may affect the pattern thereon. In such an occasion, the wire break repair is performed as explained in the following.

[Pattern C] Wire Break Defect

A procedure for repairing the wire break defect will be explained. Firstly, material coating is carried out (S1C). State of coating is monitored by the observation optical system and it is determined whether or not the portion of the wire break is filled with the coating material (S2C). A primary treatment is performed by temporary annealing, when the volume change in material is large and/or when it is necessary to more stabilize the material for enhancing the connection reliability (S2C).

Repair with mask is performed according to the procedure as described in the aforementioned [PATTERN A], and reshaping is conducted to obtain a form conforming to the electronic circuit pattern (S4C). After the reshaping, a metal film is precipitated by annealing (S5C). The optical system of repairing apparatus 202 monitors the state of repairing in real time, and determines whether or not the repair is completed (S6C). The substrate 210 thus repaired by the above repairing procedure is transferred to the next step.

EXAMPLE 6

In the non-contact type material coating mechanism 206 as shown in FIG. 32, pattern reshaping after the material coating is possible by the repairing method with mask. Therefore, it is not necessary to perform material coating in conformity to the width of the source electrode 33 precisely as is conventionally done. The non-contact type material coating mechanism 206 applies the material on a large area including the defective portion, and performs pattern formation by the mask processing. In other words, unnecessary part is subjected to removal processing by laser processing, and the coating material 243 remains on the wiring having the wire break defect 216. By annealing thus remaining coating material, metal wiring can be formed.

With this method, it is possible to apply the material without a contact between the material coating mechanism 206 and the substrate 210. Therefore, it is possible to reduce the control variables of the material coating mechanism 206, that is, control time, thereby shortening the repair processing time. In this case, as for the location accuracy of the material coating mechanism 206, positional correction between the optical system of the laser repairing apparatus 202 and the material coating mechanism 206 is conducted in advance, and the location accuracy is obtained to a degree that the coating material 243 can be coated in such a manner as overlapping the normal part around the wire break defective portion 216.

Since there is a reshaping step by the mask processing, the area for coating the material is not necessarily within the wiring width of the source electrode 33. It is sufficient if the entire wire break portion 216 is being covered. In FIG. 32B, the material coating mechanism 206 is arranged perpendicularly to the substrate, and the material 243 is applied by injection coating. However, as explained with FIG. 31, injection may be performed from an oblique direction. The status of coating is monitored with an image observed by the optical system of pattern repairing apparatus 202, and injection amount/position is controlled. With this method, it is possible to enhance the processing speed of repairing the wire break defect, compared to the case where a contact type material coating mechanism 206 is used.

EXAMPLE 7

Figure 36:
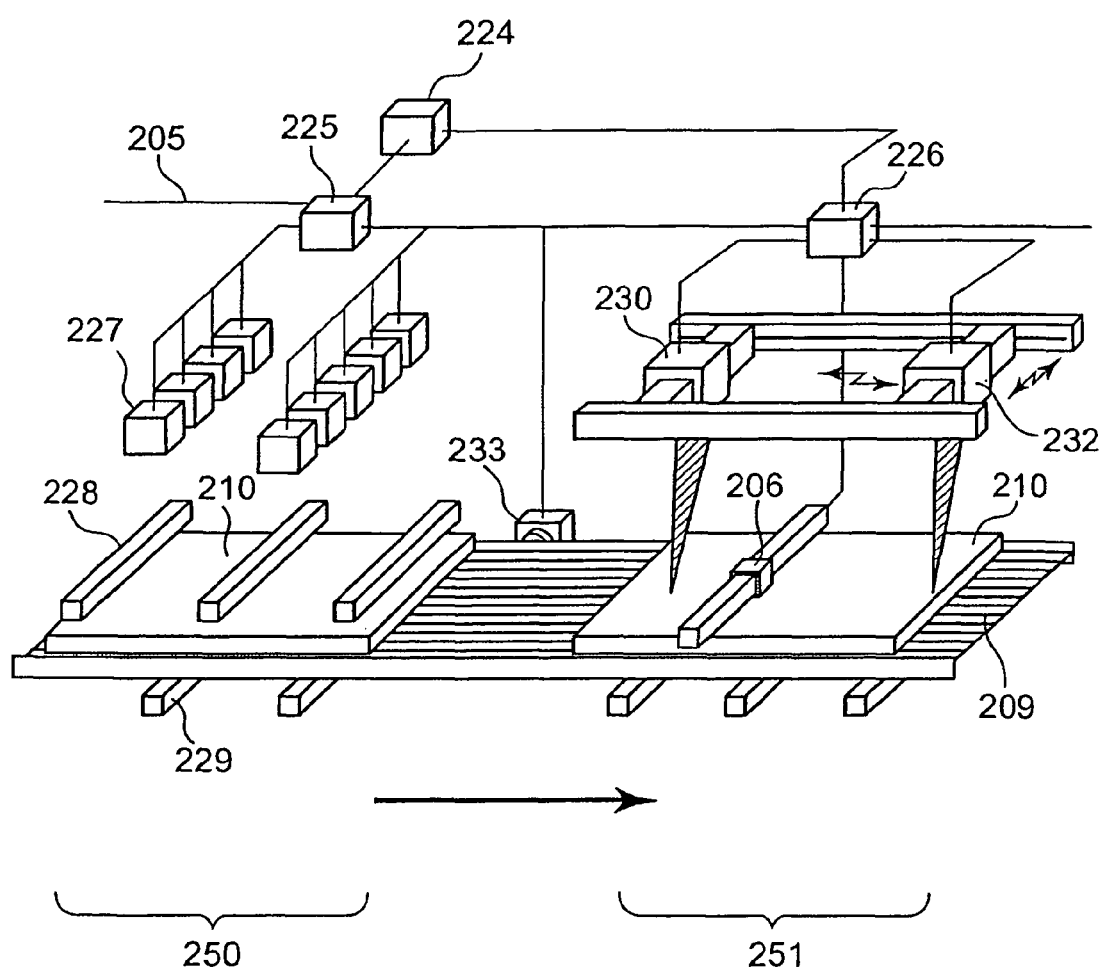
FIG. 36 is an illustration to explain an inspection/repair system employing an electronic circuit pattern repairing apparatus utilizing laser, provided with a mask change function.

FIG. 36 is an illustration to explain an inspection/repair system employing an electronic circuit pattern repairing apparatus using a laser, provided with a mask change function. Here, a system will be explained, which performs processing of inspecting/repairing operation by continuously conveying the substrate 210 without stopping. In the inspecting step 250, an image of the substrate 210 is taken by a line sensor 227 and the like provided with image sensors such as CCD devices, for example, and the image processing unit 225 performs an image processing for defect detection and exposes a defect.

As for the line sensor, multiple sensors may be arranged in one-axial direction or in staggered manner in multiple lines, so that it is capable of inspecting a large-sized substrate. As for a lighting, incident-light (on the same axis with the image-taking device), oblique light 228, and transparent lighting 229 are independently utilized or used integrated manner, or those being switched, whereby not only exposing the defect can be simplified, but also enabling categorization of a defect type. If necessary, polarized lighting/polarized detecting is performed, and thus a thin film or particle may be easily exposed if it is composed of an organic substance or the like which may be changed by a polarized property. The detected image is transmitted to the image processing unit 225, the image is subjected to a necessary image processing, and then, a defect is detected.

Data regarding the defect type such as wire break, short-circuit, and particle, and coordinate information, detected by the inspecting step 250, is transmitted to the inspection/repair management server 224 via the network 205 of the production line. Here, a fatal defect in manufacturing, that is, short-circuit in wiring, wire break defect, and a particle which may be problematic in operation, are extracted, and defects targeted for repair are narrowed down and a repairing method is decided.

Then, the above data is transmitted to the repair control PC 226 in the repairing step 251. If the defect count is over a certain value and it is assumed that there is a problem in the production process, such information is transmitted to the production management PC (not illustrated) via the network 205, alarming to take countermeasures in the process.

The repairing step 251 includes three repairing heads, a particle removing head (laser optical system) 230, material coating head (material coating mechanism) 206, and short-circuit defect repair-cum-pattern forming head (laser optical system) 232. In order to enhance processing efficiency in the continuous conveyance, each of the repairing heads independently carries out repairing. These repairing heads moves in orthogonal direction with respect to the substrate conveying direction and repairs the defective portion. Since the substrate is constantly conveyed and moved, these repairing heads also move in the conveying direction, but only a moving amount to follow the substrate conveying speed is required. There is also a mechanism to return the heads to the origin points after shift of certain amount in the conveying direction.

If a defective portion flows-in while the heads are returning to the original points, those head are again allowed to move in the conveying direction, following the position of defect. In order to repair all the defects completely, repairing procedures, such as coordinates indicating from which defect is to be repaired or which defect is targeted for repairing, are decided by the inspection/repair management server 224. The particle removing laser optical system 230 is basically a function to remove particle, but if necessary, it can be used for repairing short-circuit defect.

Processing time for the inspecting step 250 is constant, but the processing time for the repairing step 251 is determined by the defect count targeted for repairing. In other words, the processing time is varied depending on the defect count. Therefore, if a longer time is necessary for the repairing step 251, there is a possibility that conveyance of the substrate 210 may go stacked up. Therefore, the substrate 210 is conveyed with a space between substrates, corresponding to around half of the substrate to one substrate, and a difference in the processing time between the inspecting step 250 and the repairing step 251 is adjusted by this space in conveying the substrate.

In other words, a speed control function 233 is provided in order to achieve different conveying speeds in the inspecting step 250 and in the repairing step 251. With respect to each head, more than one may be provided, depending on the repair target count, so as to increase the processing speed. Here, the reference numeral 209 indicates a stage.

Figure 37:
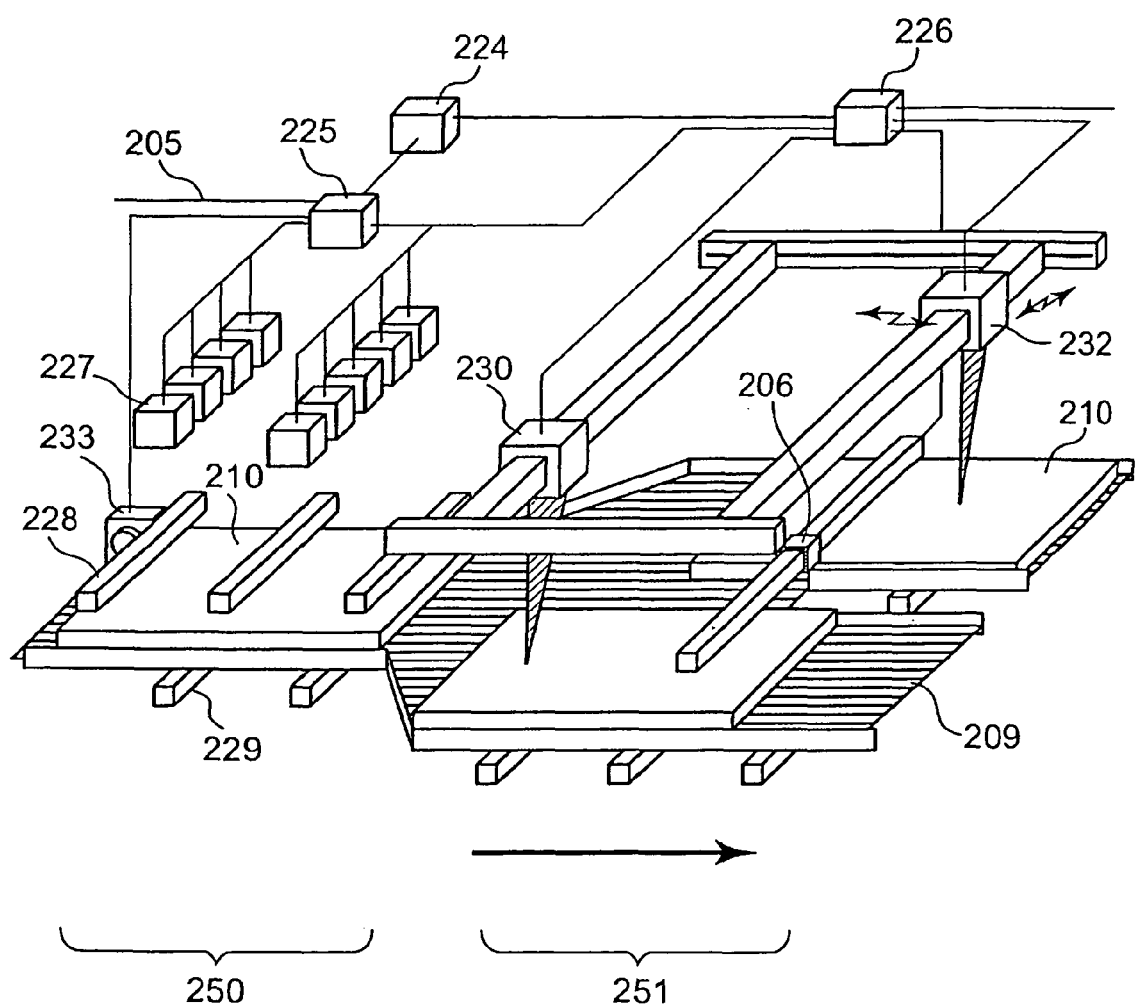
FIG. 37 is an illustration to explain another inspection/repair system employing the electronic circuit pattern repairing apparatus utilizing laser, provided with the mask change function.

FIG. 37 is an illustration to explain another inspection/repair system employing the electronic circuit pattern repairing apparatus utilizing laser, provided with the mask change function. The same reference numeral as shown in FIG. 36 represent the same functional parts. This configuration shows an example which allows the conveying system 209 of the repairing step 251 to branch to two ways. Similar to the case of FIG. 36, each repairing head moves in the conveying direction and in orthogonal direction with respect to the conveying direction, directed to the coordinates of the position of defect so as to perform repairing.

The conveying system branches to two ways, but the repairing head is configured as one unit, and it goes across the both two conveying systems and performs repairing. For example, in the time period while the short-circuit defect repair processing is performed against one defect, the particle removing head 230 and the material coating head 206 become idle. Therefore, with these idling heads, the other substrate is subjected to particle removing (repairing short-circuit defect is also possible) or material coating on the wire break.

The conveying system 209 branching to two ways, being able to control a speed independently, and since there are two conveying ways in the repairing step, conveying operation can be adjusted so as to keep the processing speed constant in the inspecting step 250. The speed control function 233 monitors the conveying speed all the time, controls the speed, and the inspection/repair management server 224 decides a repairing method and a conveying method in the repairing step 251.

As described above, a system for carrying out the inspecting/repairing steps through a continuous conveyance has been explained, but the inspection and repair may be performed by step feeding. In that case, the camera for inspection is not a line sensor, but an area sensor which takes an image while being stopped. If the line sensor is employed as in the case of continuous conveyance, a moving image is taken during the step conveyance. In the repairing step, repairing is performed while being stopped after the step feed. In also this case, the inspection line and the transfer line are moved at different steps and speeds. The above inspection/repairing are available, even when the inspecting step is through a continuous conveyance and the repairing step is through a step conveyance.

Figure 38:
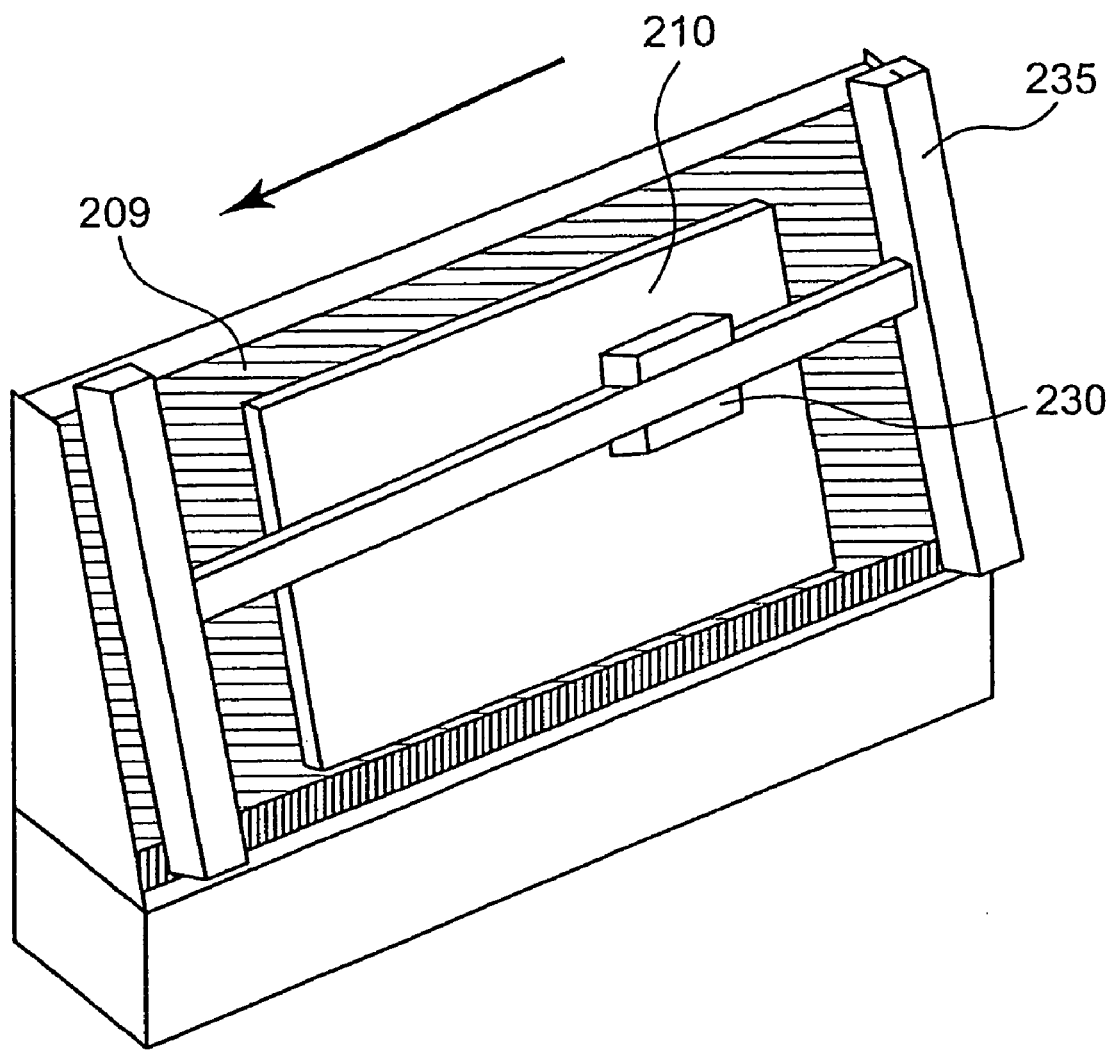
FIG. 38 is an illustration to explain another way for installing the electronic circuit substrate.

As described above, there has been explained a situation where the stage 209 on which the electronic circuit substrate 210 is mounted is provided horizontally with respect to the apparatus installation surface. However, if the electronic circuit substrate 210 becomes larger in size, the area for installing the apparatus is expanded. Considering the above situation, it is possible to configure as shown in FIG. 38. In other words, FIG. 38 is an illustration to explain another way for installing the electronic circuit substrate. The repairing unit 230 on which the particle removing head and the material coating head are mounted is installed on a mobile stage 235, and is capable of repairing an arbitrary point on the substrate 210.

As shown in FIG. 38, the conveyance manner of the inspection/repair system as explained so far may be configured in a direction perpendicular to or almost perpendicular to the installation plane surface, thereby making the apparatus installation area smaller. In this occasion, the optical systems if the inspecting and repairing steps are configured to be in the normal line direction of the substrate 210, enabling an inspection/repair operation similar to the horizontal conveyance.

EXAMPLE 8

A method for manufacturing a TFT (Thin Film Transistor) substrate is taken as Example 8 of the present invention.

A process for manufacturing TFT substrate includes steps of forming a gate electrode on a glass substrate (gate electrode forming step), forming a gate insulating film on the glass substrate on which the gate electrode is formed (gate insulating film forming step), forming a TFT active layer (island) such as amorphous silicon (island forming step), forming drain/source electrode (drain/source electrode forming step), and forming a protective film (protective film forming step).

Here, at least the gate electrode forming step, island forming step, and drain/source electrode forming step (those operations are referred to as "circuit pattern forming steps") utilize etching with a resist pattern to form circuit patterns (gate electrode, island, drain/source electrode).

In Example 8, in each of those circuit pattern forming steps, the resist pattern is inspected prior to etching, and according to the inspection result, the resist pattern is repaired, thereby repairing a failure that may occur in the circuit pattern before it is formed.

Figure 39:
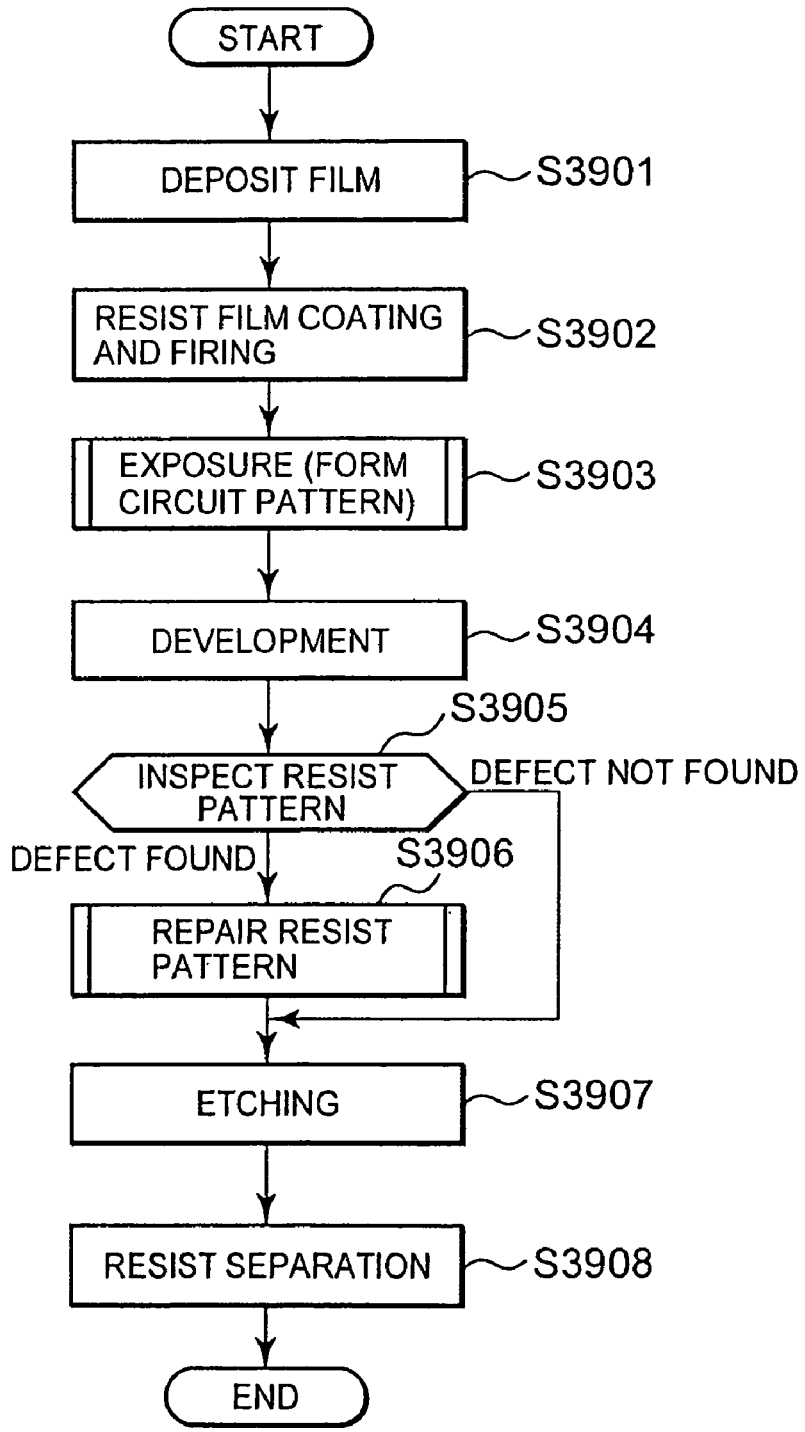
FIG. 39 is a process diagram to explain the circuit pattern forming operation to which Example 8 of the present invention is applied.

FIG. 39 is a process diagram to explain a circuit pattern forming step to which Example 8 of the present invention is applied. Here, explanations will be made taking the case where the circuit pattern is a drain/source electrode as a way of example.

Firstly, by a film forming step, a drain/source film is formed on the glass substrate (intermediates) on which a gate electrode, gate insulating film and an island are formed (S3901). Next, according to the resist film coating/firing step, resist fluid is coated and fired so as to form a resist film on the drain/source film (S3902). Next, an exposing step as described below is carried out, and repairing history of the resist pattern for the circuit pattern (gate electrode or island) belonging to a lower layer is reflected on a mask projection pattern (S3903), and developing is performed (S3904), thereby forming a resist pattern on the drain/source film.

Then, a visual inspection of the resist pattern is carried out, and a defect such as short-circuit defect, open-circuit defect and particle mixing is detected (S3905). Here, for the visual inspection of the resist pattern, an existing pattern matching technique can be applied, for example. In other words, after blowing off removable particle on the resist pattern by air spraying and the like, a taken-image of the resist pattern is compared to a normal image of the resist pattern prepared in advance, and a discrepancy therebetween may be detected.

Next, the discrepancy thus detected is compared to the defective image of the resist pattern prepared in advance with respect to each type of defect (short-circuit, open-circuit, and particle mixing). Then, a type of the defect occurring at the discrepancy is found, assuming that it corresponds to the defect type in the closely analogous defective image.

In S3905, if there is no abnormality in the visual inspection of the resist pattern, etching is carried out (S3907), and the resist pattern is separated (S3908), thereby forming the drain/source electrode.

On the other hand, in S3905, if there is abnormality in the visual inspection of the resist pattern, the resist pattern repairing step as described below is carried out and the resist pattern for the drain/source electrode is repaired. Simultaneously, a repair history of the resist pattern for the drain/source electrode is generated (S3906). Then, etching is carried out (S3907) and the resist pattern is separated (S3908), thereby forming the drain/source electrode.

Figure 40:
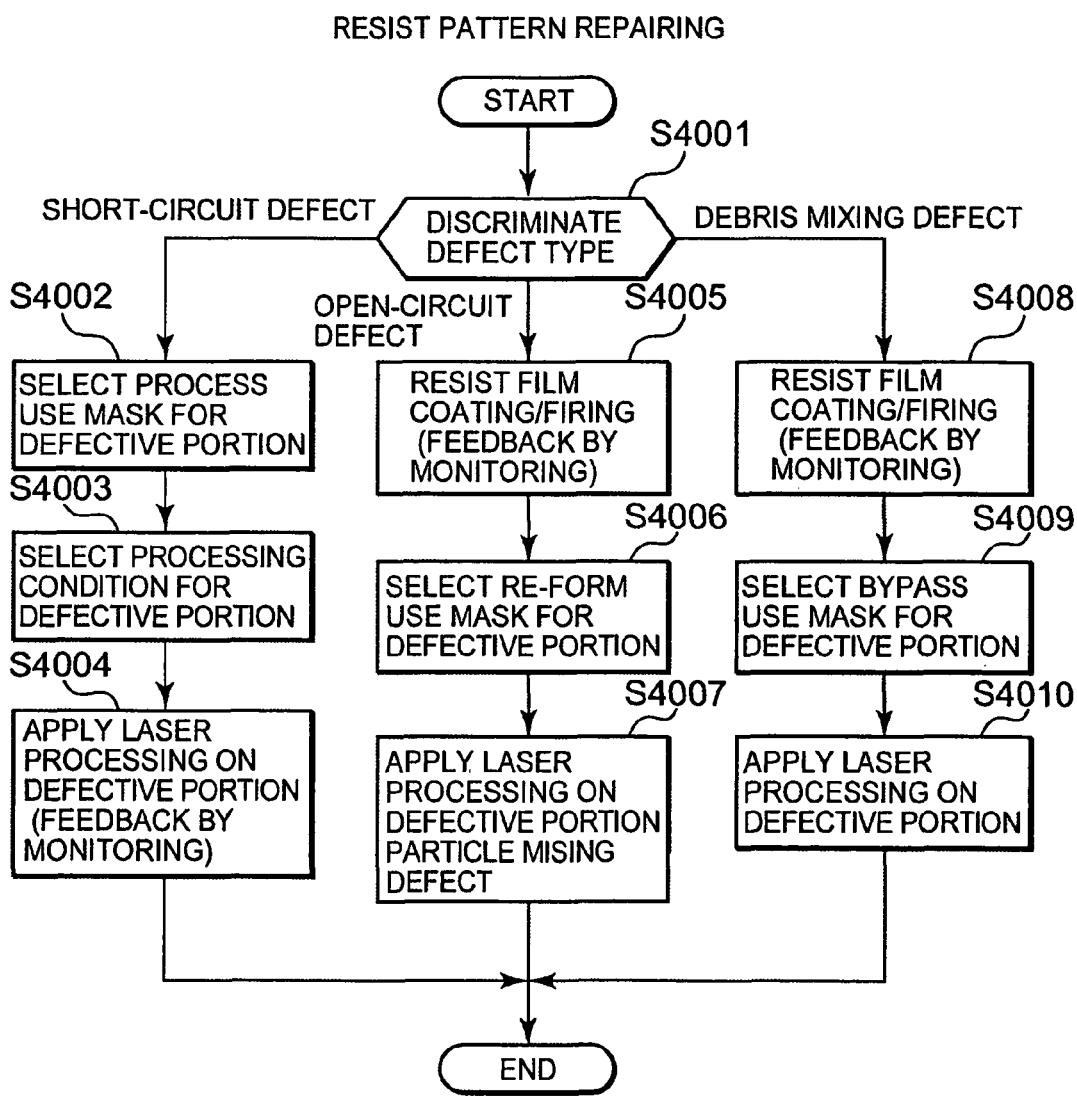
FIG. 40 is a process diagram to explain the resist pattern repairing step (S3906) as showing in FIG. 39.

FIG. 40 is a process diagram to explain resist pattern repairing step (S3906) as showing in FIG. 39.

Firstly, a type of the defect is confirmed, which is detected by the resist pattern inspecting step (S3905) as shown in FIG. 39 (S4001). If the defect type is short-circuit defect, the next steps are short-circuit repairing steps S4002 to S4004, if is open-circuit defect, the next steps are open-circuit defect repairing steps S4005 to S4007, and if it is a particle mixing defect, the next steps are particle mixing defect repairing steps S4008 to S4011.

(1) Short-circuit Defect Repairing Step

Figure 41A:
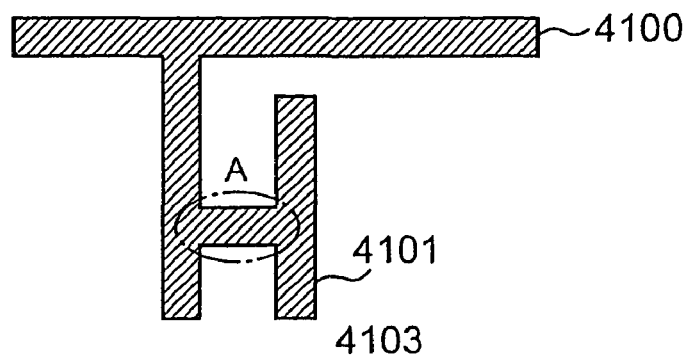
FIG. 41A, FIG. 41B, FIG. 41C and FIG. 41D are illustrations to explain the short-circuit defect repairing operation.
Figure 41B:
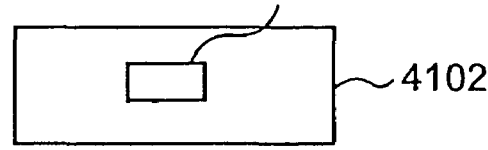
Figure 41C:
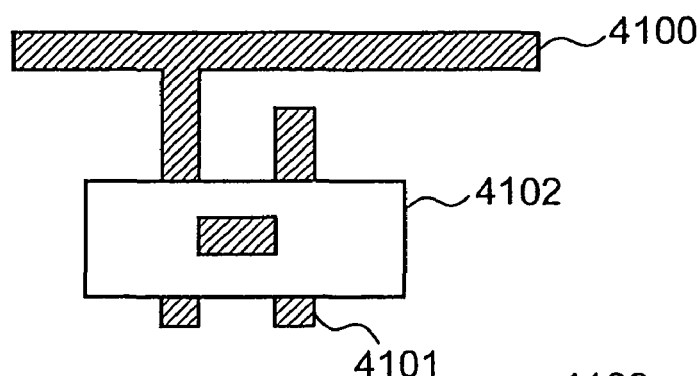

In the resist pattern inspecting step (S3905) as shown in FIG. 39, if a short-circuit defect linking the resist patterns 4100 and 4101 via part A, as shown in FIG. 41A is found, those patterns being supposed to be separated from each other, a process use mask 4102 is selected, on which an opening 4103 for irradiating a laser beam only to the part A is formed (S4002).

By irradiating the laser beam via the mask 5 which has a laser transmission pattern 22 with the same shape as the wiring pattern of the short-circuit 21 portion as shown in FIG. 3, the short-circuit 21 portion is removed and separated into the pixel electrode 34 with respect to each pixel. Then, based on the material, film thickness and the like of the resist film to be repaired, processing conditions such as a light intensity, wavelength, shot (pulse) count of the laser light are decided (S4003).

Next, as shown in FIG. 41 (C), the process use mask 4102 thus selected is aligned to the part A, and according to the processing conditions thus decided, the short-circuit defect position is irradiated with the laser beam via the process use mask 4102. At this timing, an image of the part A is taken by an image taking apparatus, and the image of the part A thus taken is subjected to spectral waveform (e.g. RGB intensity) analysis, and a spectral property of the part A is checked. With this spectral property, the thickness of the remaining film of the part A is measured, and feedback control may be performed so that the processing conditions (shot count and the like) are changed according to the measurement result.

Figure 41D:
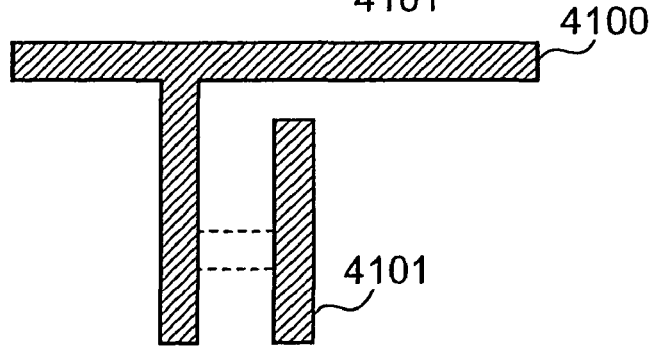

For example, a change in film thickness with respect to each shot is measured, and according to the measurement result, the processing conditions may be changed by calculating shot count required for removing the remaining film. Alternatively, a thickness distribution of the remaining film of the part A is measured, and the processing conditions may be changed so that at the part A, a portion being thicker than the other portion may be irradiated with more intensive light, or a portion being thinner than the other portion may be irradiated with less intensive light. Accordingly, as shown in FIG. 41D, the part A is removed, and the resist patterns 4100 and 4101 are separated (S4004).

(2) Open-Circuit Defect Repairing Step

Figure 42A:
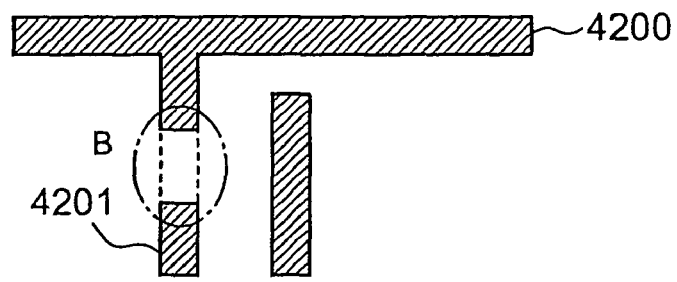
FIG. 42A, FIG. 42B, FIG. 42C, FIG. 42D, and FIG. 42E are illustrations to explain the open-circuit defect repairing operation.
Figure 42B:
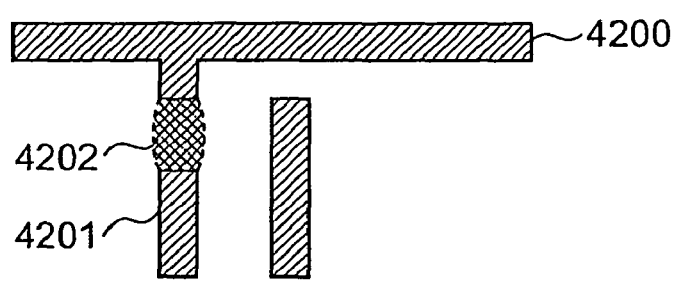

In the resist pattern inspecting step (S3905) as shown in FIG. 39, if an open-circuit defect which separates the resist patterns 4200 and 4201 from each other at part B, as shown in FIG. 42A, which are supposed to be continuous with each other, resist fluid 4202 is coated once again locally onto the part B and it is fired as shown in FIG. 42B (S4005).

At this timing, an image of the part B is taken by an image taking apparatus, and the image of the part B thus taken is subjected to spectral waveform analysis, and a spectral property of the part B is checked. With this spectral property, the thickness or hardness of the film of the resist fluid recoated on the part B is measured, and feedback control may be performed so that coating conditions such as shot count of the resist fluid or firing conditions such as heater temperature are changed according to the measurement result.

For example, a change in film thickness with respect to each shot is measured, and according to the measurement result, the coating conditions may be changed by calculating the shot count required for forming a predetermined resist film. Alternatively, a hardness distribution of the resist film formed on the part B is measured, and the firing conditions may be changed so that at the part B, a portion having smaller degree of hardening than the other portion may be heated at a higher temperature, or a portion having larger degree of hardening than the other portion may be heated at a lower temperature.

In addition, prior to S4005, the part B is irradiated with the laser beam to form a microscopic concave portion or a roughness. Being thus formed, it is possible to provide the resist fluid with a self alignment function at the coating position.

Figure 42C:
Figure 42D:
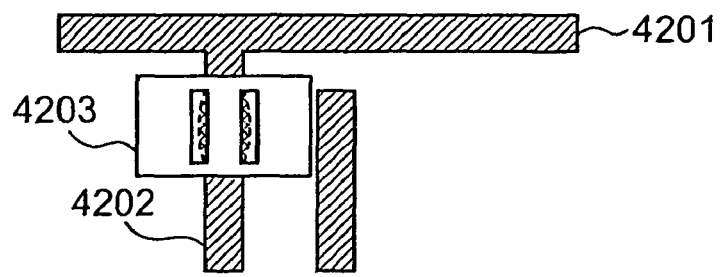
Figure 42E:
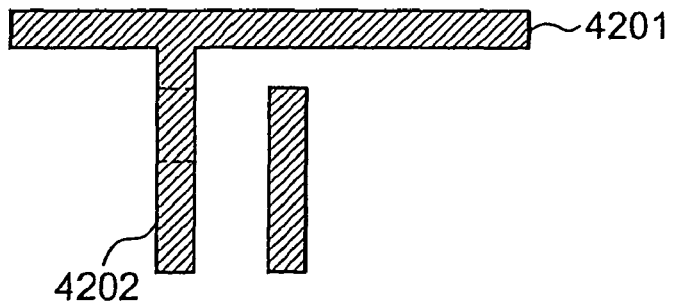

Next, as shown in FIG. 42C, a re-formation use is selected so as to re-form a resist pattern on the part B (S4006). Then, based on the material, film thickness and the like of the resist film being re-coated, processing conditions such as a light intensity, wavelength, shot count are decided. Then, as shown in FIG. 42D, the re-formation use mask 4203 thus selected is aligned to the part B, and according to the processing conditions thus decided, the part B is irradiated with the laser beam via the mask for local exposure 4202, and reshaping is performed (S4007)

Accordingly, as shown in FIG. 41E, a resist film is formed on the part B, thereby linking the resist patterns 4200 and 4201 (S4007).

It is further possible that the application of the resist fluid is performed roughly, and as mentioned above, laser irradiation is made through a mask pattern having the same shape as that of the circuit pattern, and then reshaping is performed. In other words, laser irradiation is made through the mask 5 with the laser transmission pattern 22 having the same shape of the wiring pattern of the short-circuit 21 as shown in FIG. 3, thereby removing the short-circuit 21 portion and separating the portion into the pixel electrode 34 with respect to each pixel.

(3) Particle Mixing Defect Repairing Step

In the resist pattern inspecting operation (S3905) as shown in FIG. 39, if there is detected a particle mixing defect such that particle 4301 not removable by air spraying is mixed into the part C, the resist fluid 4303 is locally recoated and fired on the area D, as shown in FIG. 43B (S4008). Here, the area D includes the part C and a portion on which a bypassing pattern is formed.

At this timing, an image of the area D is taken by an image taking apparatus, and the image of the area D thus taken is subjected to spectral waveform analysis, and a spectral property of the area D is checked. With this spectral property, the film thickness or hardness of the film of the resist fluid recoated on the area D is measured, and feedback control may be performed so that coating conditions such as the shot count of the resist fluid or firing conditions such as the heater temperature are changed according to the measurement result.

For example, a change in film thickness with respect to each shot is measured, and according to the measurement result, the coating conditions may be changed by calculating the shot count required for forming a predetermined resist film. Alternatively, a hardness distribution of the resist film formed on the part D is measured, and the firing conditions may be changed so that at the part D, a portion having smaller degree of hardening than the other portion may be heated at a higher temperature, or a portion having larger degree of hardening than the other portion may be heated at a lower temperature.

Next, as shown in FIG. 43C, a bypass use mask 4302 is selected to form a resist pattern bypassing the part C (S4009). Then, based on the material, film thickness and the like of the resist film being recoated, processing conditions such as a light intensity, wavelength, shot count are decided. Then, as shown in FIG. 43D, the bypass use mask 4302 thus selected is aligned to the area D, and according to the processing conditions thus decided, the area D is irradiated with the laser beam via the bypass use mask 4302, and reshaping is performed (S4010). Accordingly, as shown in FIG. 43E, the bypassing pattern 4304 is formed in the area D.

It is further possible that, prior to S4009, a part of the resist pattern in which particle is mixed may be removed by irradiating the part C with a laser beam. In the occasion above, if a film peeling or the like does not occur in the layer for etching (foundation layer), steps (S4005 to S4007) as the case of the open-circuit defect repairing step may be carried out to re-form a resist pattern on the part C.

FIG. 44 is a process diagram to explain the circuit pattern forming step (S3903) as shown in FIG. 39.

Firstly, it is checked whether or not steps S4008 to S4010 (particle mixing defect repairing step) as shown in FIG. 40 are executed for a lower level circuit pattern layer (S4401). For instance, if the circuit pattern as a forming target is a drain/source electrode, it is checked whether or not the steps S4008 to 4010 in FIG. 40 are executed to the island layer or to the gate electrode layer, which are lower level circuit pattern layers (S4401).

If it is determined in S4401 that the above steps have not been executed, a regular circuit pattern forming step will be followed (S4402). On the other hand, if it is determined in S4401 that the above steps have been executed, a bypassing circuit has to be formed. In the exposing step for forming the circuit pattern, a pattern formation of a normal circuit (a status without forming the bypassing circuit) is performed. Therefore, the repair performed in S4008 to S4010 in FIG. 40 is not applicable.

In view of this situation, a resist is coated on this coordinate (the normal circuit pattern portion is flattened by the resist and re-formed) (s4403), and a bypassing circuit suitable for the lower layer pattern is newly formed with laser processing (S4404) In addition, in a maskless exposing step in which the exposing step utilizes DMD (Digital Micromirror Device), LCD and the like, the following method will be also effective. In other words, if it is determined that the steps S4008 to S4010 have not been executed in S4401, exposure is performed by use of a standard mask for exposure which is prepared for the circuit pattern as a forming target. On the other hand, if it is determined that the steps have not been executed in S4401, the exposure mask is locally changed in conformity with the bypass use mask, which was used in the lower level circuit pattern device.

For instance, in the formation process of the island layer (TFT active layer), the steps from S4008 to S4010 are executed and thus as shown in FIG. 45A, the island 4501 is formed at a position F being offset by a distance H from the originally intended forming position E. In this case, the step S4403 as shown in FIG. 44 is executed in the process for forming the drain/source electrode layer, and the exposure mask for the drain electrode 4502 and for the source electrode 4503 is locally changed so that those electrodes are formed being extended by a distance H from the originally intended electrode end portion 4504, according to the offset as described above. Then, the exposure is performed by use of the exposure mask.

Next, a resist pattern inspection/repair system will be explained, which is used in the resist pattern inspecting step (S3905) and the resist pattern repairing step (S3906) as shown in FIG. 39.

Figure 46:
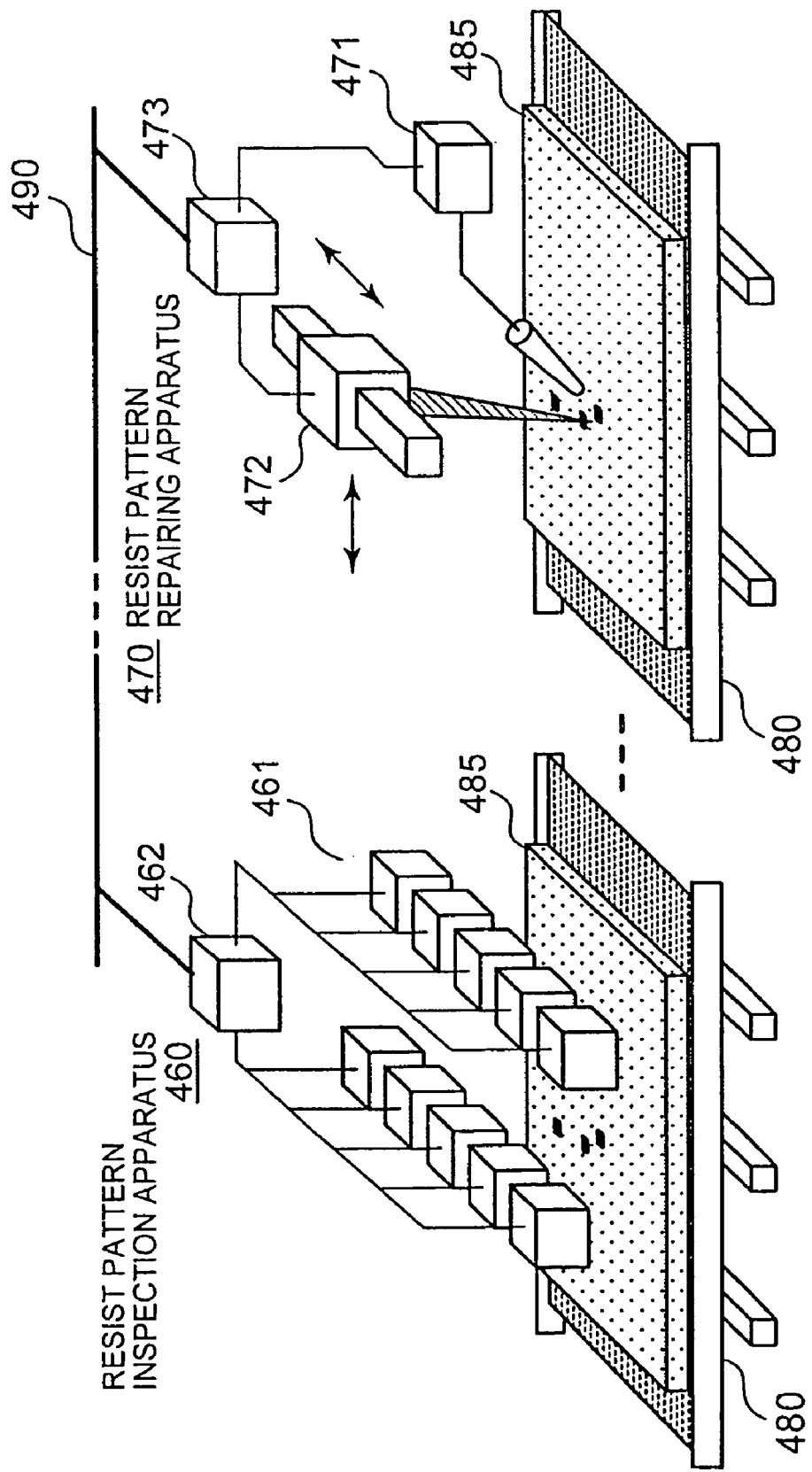
FIG. 46 is an illustration showing an example of the resist pattern inspection/repair system, which is used in the resist pattern inspecting operation and in the resist pattern repairing operation as shown in Example 8.

FIG. 46 is an illustration showing an example of the resist pattern inspection/repair system, which is used in the resist pattern inspecting step and in the resist pattern repairing step as described in Example 8.

As illustrated, the resist pattern inspection/repair system includes a resist pattern inspection apparatus 460 which inspects a resist pattern formed on the intermediate of a TFT substrate (TFT substrate in a state that a resist pattern is formed on the uppermost layer), which flows on the stage 480, a resist pattern repairing apparatus 470 which repairs a defect of the resist pattern formed on the intermediate 485 of the TFT substrate flowing on the stage 480 according to a result of the inspection by the resist pattern inspection apparatus 460, and a network 490 such as LAN, which connects the resist pattern inspection apparatus 460 and the resist pattern repairing apparatus 470.

The resist pattern inspection apparatus 460 includes a line sensor 461 and a defect detecting unit 462. The line sensor 461 is configured such that multiple image-taking devices (for example CCD cameras) are arranged so that images of the TFT element intermediates corresponding to at least one line provided on the TFT substrate intermediate 485 can be taken.

The defect detecting unit 462 is a computer which detects a defect of resist pattern formed on the TFT substrate intermediate 485. As to each TFT element built in the TFT substrate, there are previously registered in the defect detecting unit 462, normal images of a resist pattern for the gate electrode, a resist pattern for the gate insulating film, a resist pattern for the island and a resist pattern for the drain/source electrode.

In addition, as to each of the resist pattern for the gate electrode, the resist pattern for the gate insulating film, the resist pattern for the island and the resist pattern for the drain/source electrode, a defect image of the resist pattern is previously registered with respect to each defect type (short-circuit, open-circuit, particle mixing and the like).

The defect detecting unit 462 compares the resist pattern image of each TFT element intermediate taken by the line sensor 461 with the normal image of the resist pattern, and detects a discrepancy therebetween by a pattern matching technique. Then, the defect detecting unit 462 compares the discrepancy thus detected with the defect image of the resist pattern which is previously registered with respect to each defect type, and a type of the defect occurring at the discrepancy is found, assuming that it corresponds to the defect type in the closely analogous defective image. Thereafter, the defect detecting unit 462 creates defect information including the defect type, coordinate information of the defect occurring position, and the image of the defect occurring position, and transmits the information to the resist pattern repairing apparatus 470 via the network 490.

It is also possible to configure such that the defect detecting unit 462 compares each pixel of the resist pattern image of each TFT device intermediate, the image of which is taken by the line sensor 461, with the adjacent pixel (normal portion), and determines the existence of defect. Furthermore, it is also possible to determine the defect type by use of feature index (shape, color, film thickness, and the like) extracted from the resist pattern image. Alternatively, in combination with the registered image and the feature index, it is possible to determine whether or not there is a defect, and a type of the defect.

The resist pattern repairing apparatus 470 includes a coating/firing mechanism 471 which locally coats and fires the resist fluid, an image-taking/laser optical system 472 which performs alignment between a mask and the defective portion of TFT substrate intermediate 485 and repairs the defective portion in the resist pattern by laser processing, and a controller 473. The controller 473 is a computer to control the coating/firing mechanism 471 and the image-taking/laser optical system 472.

Figure 47:
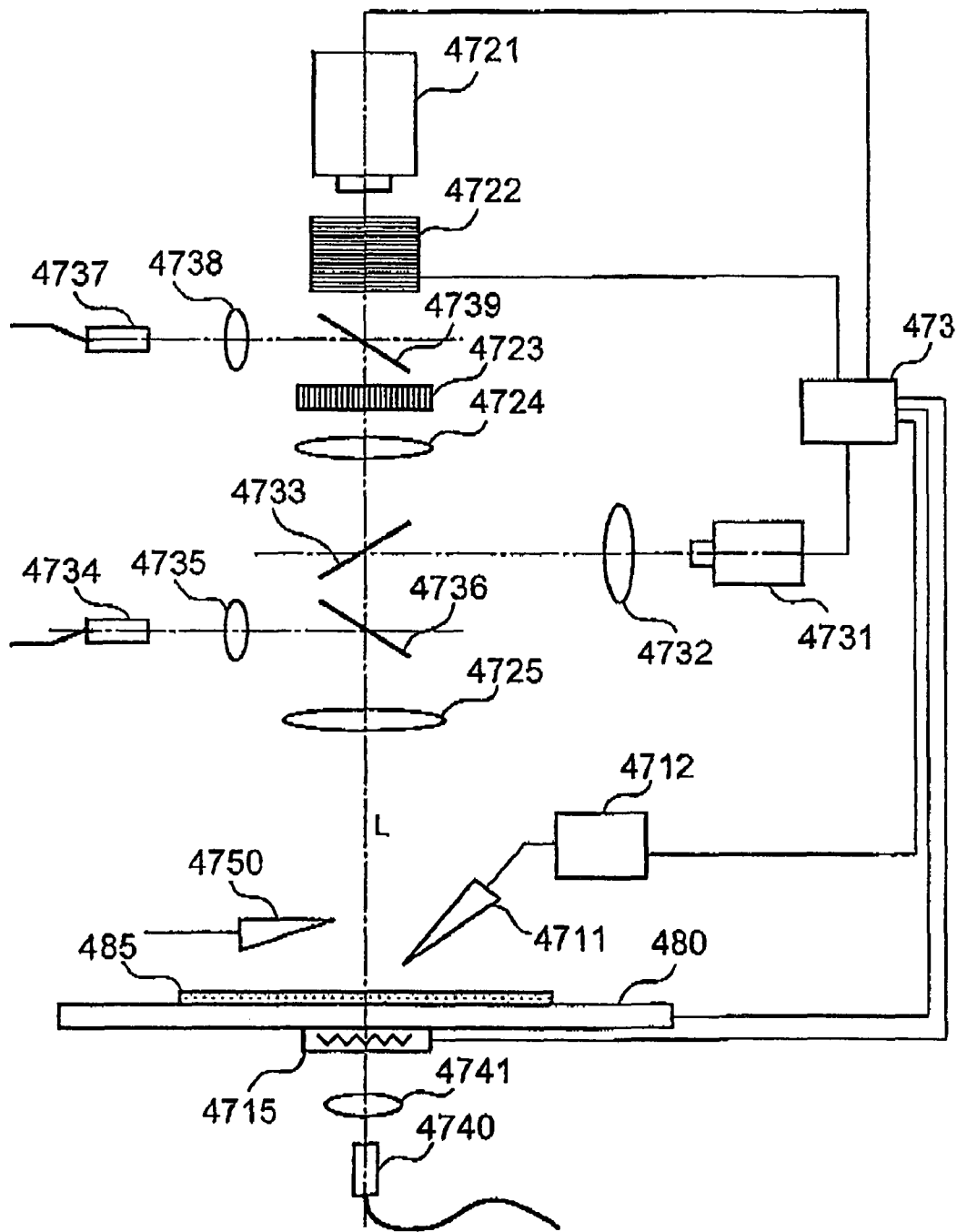
FIG. 47 is a schematic configuration diagram showing the resist pattern repairing apparatus as shown in FIG. 46.

FIG. 47 is a schematic configuration diagram showing the resist pattern repairing apparatus 470.

The coating/firing mechanism 471 (see FIG. 46) includes a coating mechanism and a firing mechanism. The firing mechanism has a heater 4715 provided with a heater surface on which the amount of heat can be changed locally. The coating mechanism includes a dispenser 4711 which holds resist fluid, and driving unit 4712 which drives the dispenser 4711 to discharge the resist fluid from the dispenser 4711. FIG. 48 is a schematic cross sectional view of the dispenser 4711.

As illustrated, the dispenser 4711 includes a holding part 47111 on which a discharge opening is formed, a piston part 47112, and an assist gas guidance 47113. The holding part 47111 holds the resist fluid 47114. The piston part 47112 is driven by the driving unit 4712, and allows the resist fluid held by the holding part 47111 to be pushed out from the discharge opening. It is preferable to charge inactive gas 47115 such as nitrogen, between the resist fluid 47114 held by the holding part 47111 and the piton part 47112, in order to stabilize the material of the resist fluid 47114.

The guidance 47113 is formed around the holding part 47111, and issues inactive gas such as nitrogen supplied from the driving unit 4712, from the periphery of the discharge opening of the holding part 47111 to the direction along which the resist fluid 47114 held by the holding part 47111 is pushed out. By providing the guidance 47113, it is possible to apply (spurt) the resist fluid 4714 onto the defective portion, even when the dispenser 4711 is disposed at a position distant from the defective portion of the TFT substrate intermediate 485.

In addition, as shown in FIG. 47, it is preferable to arrange the dispenser 471 on the position not overlapping the optical axis L of the image-taking optical system and laser optical system, in order that the image-taking optical system as described below can monitor in real time the status of coating and firing of the resist fluid applied on the defective portion, and also a status of reshaping by the laser processing.

The image-taking/laser optical system 472 (see FIG. 46) has a laser optical system and an image-taking optical system. Here, the laser optical system and the image-taking optical system have a common optical axis L.

The laser optical system includes a laser oscillator 4721, a beam reshaping mechanism 4722 including a beam expander, a homogenizer and the like, a mask mechanism 4723 having a mask stage and the like, an imaging lens 4724 and an objective lens 4725. The beam reshaping mechanism 4722 expands the beam diameter of the laser beam irradiated from the laser oscillator 4721 to a predetermined size and performs reshaping so that the laser intensity distribution in the laser irradiated area becomes a predetermined distribution.

Next, the laser beam being reshaped is formed to a shape of mask projection pattern corresponding to a mask installed on the mask mechanism 4741. Thereafter, through the imaging lens 4724 and the objective lens 3425, the defective portion of the TFT substrate intermediate 485 installed on the stage 480 is irradiated with thus reshaped laser beam.

The image-taking optical system includes an image-taking unit (for example, CCD camera) 4731 provided with AF (automatic focus) mechanism, a lens 4732, a half mirror 4733, a lighting unit for taking resist pattern image (for example light-source fiber) 4734, a condenser lens 4735, a half mirror 4736, a lighting unit for taking mask pattern image (for example light-source fiber) 4737, a condenser lens 4738, a half mirror 4739, a lighting unit for transparent lighting (for example, light-source fiber) 4740, and a condenser lens 4741.

The image taking unit 4731 takes an image of the mask installed on the mask mechanism 4723, via the half mirror 4733 and the lens 4732. At this stage, a light from the lighting unit for taking mask pattern image 4737 is irradiated on the mask installed on the mask mechanism 4723 via the condenser lens 4738 and the half mirror 4738, thereby adjusting brightness of the projected image of the mask. In addition, the image taking unit 4731 takes an image of the TFT substrate intermediate installed on the stage 480 via the half mirror 4733 and the lens 4732.

At this stage, a light from the lighting unit for taking resist pattern image 4734 is irradiated on the TFT substrate intermediate 485 installed on the stage 480 via the condenser lens 4735 and the half mirror 4736, thereby adjusting brightness of the projected image of the intermediate 485. In addition, a light from the lighting unit for transparent lighting 4740 is irradiated on the TFT substrate intermediate 485 installed on the stage 480 from the under side via the condenser lens 4741, thereby adjusting brightness of the projected image of the intermediate 485.

The controller 473 follows the defect information transmitted from the defect detecting unit 462 via the network to control each part of the resist pattern repairing apparatus 470, and performs a local coating/firing of resist fluid to repair of the resist pattern defect.

(1) Local Coating/Firing of Resist Fluid

When a defect type included in the defect information received from the defect detecting unit 462 is an open-circuit defect or particle mixing defect, the controller 471 controls each part of the resist pattern repairing apparatus 470 for local coating/firing of the resist fluid. Firstly, the controller 471 controls the stage 480 to move the TFT substrate intermediate 485 installed on the stage 480 so that the position indicated by the coordinate information of the defect occurring part included in the defect information conforms to the resist fluid coating position by the dispenser 4711.

Next, the controller 471 controls the driving unit 471 so as to discharge the resist fluid from the dispenser 4711, and applies the resist fluid so that the resist pattern defective portion of the intermediate is covered with the resist fluid. At this timing, an image of the resist pattern defective portion taken by the image taking unit 4731 is subjected to spectral waveform analysis, and a spectral property of the defective portion is checked. According to the relational information between the spectral property and the film thickness of the resist film previously registered in the controller 471, a thickness of the film of resist fluid recoated on the defective portion is measured, and feedback control may be performed so that the coating conditions such as the shot count of the resist fluid are changed according to the measurement result.

For instance, the controller 471 measures a change in film thickness with respect to each shot, and by use of the measurement result, it controls the drive unit 4712 so that resist fluid corresponding to the shot count required for forming a predetermined resist film is discharged from the dispenser 4711. It is also possible to measure the film thickness of resist film utilizing a change in focus point of the AF mechanism provided in the image-taking unit 4731. In addition, a pressing mechanism (spatula and the like) to press the resist fluid being recoated is provided, and it is possible to configure such that the thickness of film of the recoated resist fluid can be adjusted by this pressing mechanism.

Next, the heater 4715 is controlled to fire the resist fluid being recoated on the resist pattern defective portion of the TFT substrate intermediate 485. At this timing, an image of the resist fluid recoated portion taken by the image taking unit 4731 is subjected to spectral waveform analysis, and a spectral property of the recoated portion is checked. According to the relational information between the spectral property and the degree of hardening of the resist fluid previously registered in the controller 471, a degree of hardening of the resist fluid at the recoated portion is measured, and feedback control is performed so that the firing conditions are changed according to the measurement result.

For instance, a hardness distribution of the resist film of the recoated portion is measured, and the heater 4715 is controlled so that in recoating, a portion having smaller degree of hardening than the other portion may be heated at a higher temperature, and a portion having larger degree of hardening than the other portion may be heated at a lower temperature.

(2) Repair Defect in Resist Pattern

The controller 471 controls each part of the resist pattern repairing apparatus 470 so as to repair the defective portion of the resist pattern according to the defect information received from the defect detecting unit 462. Firstly, the controller 471 allows an image of the resist pattern defective portion included in the defect information received from the defect detecting unit 462 to be displayed on the display unit (not illustrated), and allows an operator to install on the mask mechanism 4723, a mask (process use mask, re-forming use mask, or bypass use mask) which is used for repairing the defective portion.

Next, the controller allows the image taking unit 4731 to take images of the mask installed on the mask mechanism 4723 and the TFT substrate intermediate 485 installed on the stage 480, and controls the stage 480 to move the TFT substrate intermediate 485 installed on the stage 480, so that a standard mark provided on the mask is placed on a predetermined position of the intermediate 485.

Next, the controller controls the laser oscillator 4721 so that the resist pattern of the TFT substrate intermediate 485 is reshaped. At this timing, an image of the resist pattern defective portion taken by the image taking unit 4731 is subjected to spectral waveform analysis, and a spectral property of the defective portion is checked. According to the relational information between the spectral property and the film thickness of the resist film previously registered in the controller 471, a thickness of the film of the resist fluid recoated on the defective portion is measured, and feedback control is performed so that the coating conditions for laser processing are changed according to the measurement result.

For instance, a change in film thickness with respect to each shot is measured, and by use of the measurement result, the laser oscillator 4721 is controlled so that it outputs laser pulses corresponding to the shot count required for removing the remaining film. Alternatively, a thickness distribution of the remaining film of the defective portion is measured, and the beam reshaping mechanism 4722 is adjusted so that in the defective portion, a portion thicker than the other portion may be irradiated with more intensive laser and a portion thinner than the other portion may be irradiated with less intensive laser.

As shown in FIG. 47, the resist pattern repairing apparatus 470 may be provided with a particle removing mechanism 4750 for removing particle mixing into the resist pattern by air spraying, photolysis, breakdown by heat/chemical treatment, and the like.

As described above, Example 8 of the present invention has been explained. In the method of Example 8, the repair is performed on the resist pattern. Therefore, it is possible to reduce an affect onto a pattern layer caused by repairing the pattern defect. In addition, since the inspection and repair of the resist pattern are performed in the process of forming each pattern layer of TFT substrate, a pattern defect on each pattern layer can be repaired. Therefore, it is possible to prevent an occurrence of failure in circuit pattern which is built in the TFT substrate, without deteriorating the quality and precision of the circuit pattern.

In addition, in Example 8, the resist fluid is recoated on the defective portion of the resist pattern, but resist material is not necessarily liquid type. For instance, it is possible to use a resist material 4901 being a film type as shown in FIG. 49A. Alternatively, it is possible to use a resist material 4902 being a particle form as shown in FIG. 19B. It is to be noted here that in FIG. 49A and FIG. 49B, the reference numeral 4903 indicates a resist film and 4904 indicates an etching layer (foundation layer).

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

What is claimed is:

1. A pattern repairing apparatus which repairs and normalizes a defect in an electronic circuit pattern formed on a substrate, based on inspection data from an inspection apparatus, comprising:

an inspection data receiving unit which receives from said inspection apparatus an image in proximity to a repair portion and a coordinate of the repair portion;

a repair portion/pattern detecting unit which detects the repair portion and a pattern separately, from said image in proximity to the repair portion;

a laser irradiation unit which irradiates a laser beam;

a mask which changes a shape of said laser beam by allowing said laser beam to pass through a laser transparent region;

a mask moving unit which moves a mask to a position where the pattern separated by said repair portion/pattern detecting unit has a shape identical to a shape of a laser beam to be irradiated; and an irradiating region setting unit which divides the repair portion separated by said repair portion/pattern detecting unit into a plurality of regions;

wherein said laser transparent region is larger than the irradiating region of said laser beam, and said laser transparent region has a shape other than a rectangular shape; and wherein said laser irradiation unit scans said laser beam in a status where a position on said mask is fixed, changes the rectangular shape to a shape other than the rectangular shape, and irradiates the plurality of regions of said repair portion with said laser beam.

2. The pattern repairing apparatus according to claim 1, wherein:

said laser irradiating unit utilizes said mask on which a pattern having a size identical to or several-fold larger than said standard pattern is formed, and irradiates with said laser beam passing to said substrate, via said mask;

said mask comprises the laser transparent region having the shape corresponding to the shape projecting a plurality of wirings in said electronic circuit pattern; and according to a shape of a pattern as a repair target formed on said substrate, said mask can be changed among several types of masks available.

3. The pattern repairing apparatus according to claim 1, wherein said laser irradiation unit allows a shape of the laser beam to be irradiated to said substrate to change by using a plurality of shielding elements or mirrors in the form of a lattice, and means which is capable of controlling each of said shielding elements or mirrors independently.

4. The pattern repairing apparatus according to claim 1, further comprising an irradiating region setting unit which divides a laser irradiating region of said laser irradiation unit into a plurality of regions so that a normal pattern portion or an already-repaired pattern portion is included in each of said regions thus divided, and decides an irradiation order.

5. The pattern repairing apparatus according to claim 1, further comprising an irradiating region setting unit which divides a laser irradiating region of said laser irradiation unit into a plurality of regions, and which performs a pattern matching at least at one reference point so as to superimpose the pattern formed on said substrate and said laser irradiating region on one another, and said reference point used is the reference point which has a pattern matching region not overlapping with the repair portion separated by said repair portion/pattern detecting unit, and also the reference point which is closest to the repair portion and the pattern, which are detected by said repair portion/pattern detecting unit.

6. The pattern repairing apparatus according to claim 1, further comprising a pattern displacement detecting unit which projects a mask image to a predetermined position on a stage, detects said mask image by said pattern on-the-substrate, stores said mask image, then extracts an outline of a mask pattern stored to display the outline of said mask pattern in such a manner as superposing on an image of said pattern on-the-substrate, and moves an outline image of said mask pattern extracted in sync with said mask.

7. The pattern repairing apparatus according to claim 1, further comprising a pattern displacement detecting unit which projects a mask image to a predetermined position on a stage, detects said mask image by said pattern on-the-substrate, stores said mask image, then, displays said mask image stored and an image of said pattern on-the-substrate vertically or horizontally on the same screen, and moves said mask image stored in sync with movement of said mask.

8. The pattern repairing apparatus according to claim 1, further comprising a pattern displacement detecting unit which takes a mask image and an image of said pattern on-the-substrate, and displays said mask image and said image of said pattern on-the-substrate either vertically or horizontally on the same screen.

9. The pattern repairing apparatus according to claim 1, further comprising a pattern displacement detecting unit which stores a relative position between said substrate and said mask, when an image of said pattern on-the-substrate and said mask image conform to each other.

10. The pattern repairing apparatus according to claim 4, wherein only a region including the repair portion detected by said repair portion/pattern detecting unit is irradiated with the laser beam, out of said plurality of regions previously divided by said irradiating region setting unit.

11. The pattern repairing apparatus according to claim 1, wherein said irradiating region setting unit divides said laser transparent region into a plurality of regions, which corresponds to said repair portion, to be irradiated with a laser beam, and a region not to be irradiated with a laser beam.

* * * * *